(12) United States Patent
Toda

(10) Patent No.: US 9,190,146 B2
(45) Date of Patent: Nov. 17, 2015

(54) VARIABLE RESISTANCE MEMORY SYSTEM WITH REDUNDANCY LINES AND SHIELDED BIT LINES

(71) Applicant: KABUSHIKI KAISHA TOSHIBA, Minato-ku (JP)

(72) Inventor: Haruki Toda, Yokohama (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 160 days.

(21) Appl. No.: 13/962,471

(22) Filed: Aug. 8, 2013

(65) Prior Publication Data
US 2014/0241036 A1    Aug. 28, 2014

Related U.S. Application Data

(60) Provisional application No. 61/770,590, filed on Feb. 28, 2013.

(51) Int. Cl.
G11C 13/00 (2006.01)
G11C 29/00 (2006.01)

(52) U.S. Cl.
CPC ........ *G11C 13/0069* (2013.01); *G11C 13/0023* (2013.01); *G11C 29/80* (2013.01); *G11C 2013/0073* (2013.01); *G11C 2213/71* (2013.01); *G11C 2213/77* (2013.01)

(58) Field of Classification Search
CPC .............. G11C 13/0069; G11C 29/80; G11C 13/0023; G11C 2013/0073; G11C 2213/77; G11C 2213/71
USPC .................. 365/148, 145, 130, 157, 158, 163
See application file for complete search history.

(56) References Cited

U.S. PATENT DOCUMENTS 7,082,052 B2   7/2006 Rinerson et al.
8,004,873 B2 *  8/2011 Toda .............................. 365/148
(Continued)

FOREIGN PATENT DOCUMENTS

JP  2005-522045  7/2005
JP  2008-512857  4/2008
(Continued)

OTHER PUBLICATIONS

U.S. Appl. No. 13/597,740, filed Aug. 29, 2012, Haruki Toda.
(Continued)

*Primary Examiner* — Son Dinh
*Assistant Examiner* — Jerome LeBoeuf
(74) *Attorney, Agent, or Firm* — Oblon, McClelland, Maier & Neustadt, L.L.P.

(57) ABSTRACT

A memory system according to the embodiment comprises a cell array of unit cell arrays each including memory cells; and an access circuit, wherein the memory cell changes from a first resistance state to a second resistance state on application of a first polarity voltage, and changes from the second resistance state to the first resistance state on application of a second polarity voltage, the access circuit provides the first and second lines connected to an access-targeted memory cell with access potentials, and brings at least one of the first and second lines connected to an access-untargeted memory cell into a floating state to make access to the access-targeted memory cell, the unit cell array includes first spare lines to provide redundancy for the first lines, and an alignment of the first lines includes a certain number of the first spare lines arranged in a certain cycle.

20 Claims, 40 Drawing Sheets

(56) References Cited

U.S. PATENT DOCUMENTS

| | | |
|---|---|---|
| 8,023,313 B2 | 9/2011 | Toda |
| 8,094,477 B2 | 1/2012 | Maejima |
| 2004/0240259 A1 | 12/2004 | Kajigaya et al. |
| 2006/0167646 A1 | 7/2006 | Yeung |
| 2008/0258129 A1 | 10/2008 | Toda |
| 2009/0213639 A1* | 8/2009 | Toda .......................... 365/148 |
| 2010/0008126 A1 | 1/2010 | Toda |
| 2010/0046273 A1* | 2/2010 | Azuma et al. ............... 365/148 |
| 2010/0054019 A1 | 3/2010 | Toda |
| 2011/0066878 A1 | 3/2011 | Hosono et al. |
| 2012/0224413 A1 | 9/2012 | Zhang et al. |
| 2013/0021859 A1 | 1/2013 | Shvydun et al. |
| 2013/0070516 A1* | 3/2013 | Tomotani et al. ........... 365/148 |
| 2014/0050003 A1* | 2/2014 | Tomotani et al. ............ 365/51 |
| 2014/0050010 A1* | 2/2014 | Toda ............................ 365/148 |

FOREIGN PATENT DOCUMENTS

| | | |
|---|---|---|
| JP | 2009-199695 | 9/2009 |
| JP | 2010-20863 | 1/2010 |
| JP | 2010-33675 | 2/2010 |
| JP | 2010-55719 | 3/2010 |
| JP | 2011-86365 | 4/2011 |
| JP | 2011-138581 | 7/2011 |
| JP | 5016151 | 6/2012 |
| JP | 2012-203936 | 10/2012 |
| JP | 2013-200930 A | 10/2013 |
| WO | WO 2012/070236 A1 | 5/2012 |
| WO | WO 2012/128134 A1 | 9/2012 |

OTHER PUBLICATIONS

Office Action issued on May 22, 2015 in Taiwanese Patent Application No. 102107687 with English translation.

\* cited by examiner

VARIABLE RESISTANCE MEMORY SYSTEM WITH REDUNDANCY LINES AND SHIELDED BIT LINES

CROSS-REFERENCE TO RELATED APPLICATIONS

This application is based upon and claims the benefit of priority from the prior U.S. Provisional Application 61/770, 590, filed on Feb. 28, 2013, the entire contents of which are incorporated herein by reference.

BACKGROUND

1. Field

The embodiment of the present invention relates to a memory system.

2. Description of the Related Art

As the technologies for realizing mass-storable memory systems, memory cells of the variable resistance type, such as ReRAMs and ion memories, have received attention. These memory cells can be formed of the cross point type between selection lines and accordingly it is possible to easily construct a cell array having a three-dimensional structure.

These memory cells of the variable resistance type include ones that have asymmetrical characteristics of which voltage-current characteristic greatly changes in accordance with the direction of bias applied to the memory cell. For the cell array having the three-dimensional structure that includes the memory cells having such the asymmetrical voltage-current characteristic, an access operation of the so-called floating access method is effective. The access operation of the floating access method is referred to as an access method of providing an access-targeted selection line with a potential required to make access to a memory cell while bringing non-access selection lines into the floating state.

The cost of a memory system chip is considered here. From the viewpoint of the cost of the chip, the larger the area occupied by a cell array in the chip area, the lower the cost required to realize a mass-storable memory system. Such the three-dimensionally structured memory cell including memory cells of the cross point type, however, generally requires peripheral circuits such as large-sized decoders and drivers. Therefore, an increase in the area occupied by the cell array in the chip area requires the cell array to be made on a larger scale.

If the cell array is made larger, however, occurrences of faults in memory cells increase naturally. Therefore, it is important in such the memory system to handle fault memory cells.

DETAILED DESCRIPTION

A memory system according to the embodiment comprises a cell array of plural unit cell arrays having three orthogonal directions defined as a first direction, a second direction and a third direction, each unit cell array including plural first lines extending in the first direction, plural second lines extending in the second direction, and plural memory cells provided at the intersections of the plural first lines and the plural second lines and operative to store data in accordance with different resistance states; and an access circuit operative to make access to the memory cell via the first line and the second line, wherein the memory cell changes the resistance state from a first resistance state to a second resistance state on application of a certain voltage of a first polarity, and changes the resistance state from the second resistance state to the first resistance state on application of a certain voltage of a second polarity opposite in polarity to the first polarity, the access circuit provides the first line and the second line connected to an access-targeted memory cell with access potentials required to make access to the access-targeted memory cell, and brings at least one of the first line and the second line connected to an access-untargeted memory cell into a floating state to make access to the access-targeted memory cell, the unit cell array includes plural first spare lines extending in the first direction to provide redundancy for the plural first lines, and an alignment of the plural first lines includes a certain number of the first spare lines arranged in a certain cycle.

Memory systems according to the embodiments are described below with reference to the drawings.

[First Embodiment]

First, a description is given to the entire configuration of a memory block used in a memory system according the first embodiment of the present invention.

Figure 1:
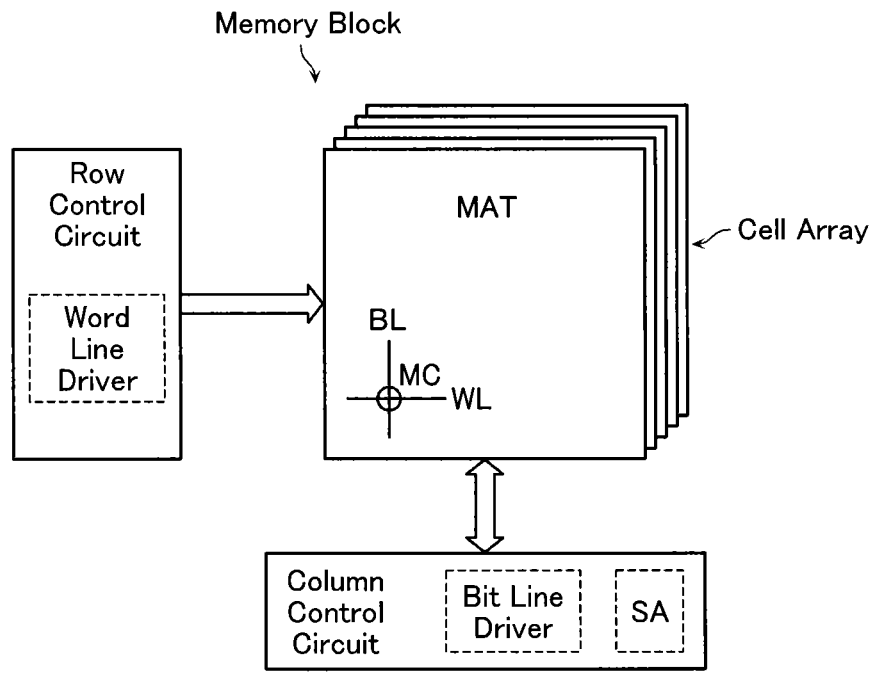
FIG. 1 is a diagram showing the entire configuration of a memory block in a memory system according the first embodiment of the present invention.

FIG. 1 is a diagram showing a configuration of the memory block according the first embodiment. This memory block includes a cell array. The cell array includes plural unit cell arrays (hereinafter referred to as "MATs"). Each MAT has plural bit lines BL and word lines WL, and memory cells MC that can be selected by these bit lines BL and word lines WL. In the following description, the bit lines BL and word lines WL may also be called by their generic term, "selection lines". In the following description, the bit lines BL are described as first lines and the word lines WL as second lines. Note that, naturally, the word lines WL can also be described as first lines and the bit lines BL as second lines.

The bit lines BL in the cell array are electrically connected to a column control circuit, which controls the bit line BL to erase data in a memory cell MC, write data in the memory cell MC and read data out of the memory cell MC. (Hereinafter, erasing data in the memory cell MC and writing data in the memory cell MC are collectively referred to as "write operation", and reading data out of the memory cell MC is referred to as "read operation". In addition, write and read operations are collectively referred to as "access operation"). The column control circuit includes a bit line driver operative to provide the bit line BL with a potential required for access operation, and a sense amp SA operative to sense and amplify the current flowing in the memory cell MC at the time of read operation to decide the data stored in the memory cell MC.

On the other hand, the word lines WL in the cell array are electrically connected to a row control circuit, which selects the word line WL at the time of access operation. The row control circuit includes a word line driver operative to provide the word line WL with a potential required for access operation. The row control circuit is contained in an access circuit together with the column control circuit.

The following description is given to a configuration of the MAT and associated peripheral circuits.

Hereinafter, one side in the column direction (first direction) may also be referred to as "front" (first side), the other as "rear" (second side), one side in the row direction (second direction) as "right", the other as "left", one side in a direction (third direction) orthogonal to the column direction and the row direction as "upper", and the other as "lower".

Figure 2:
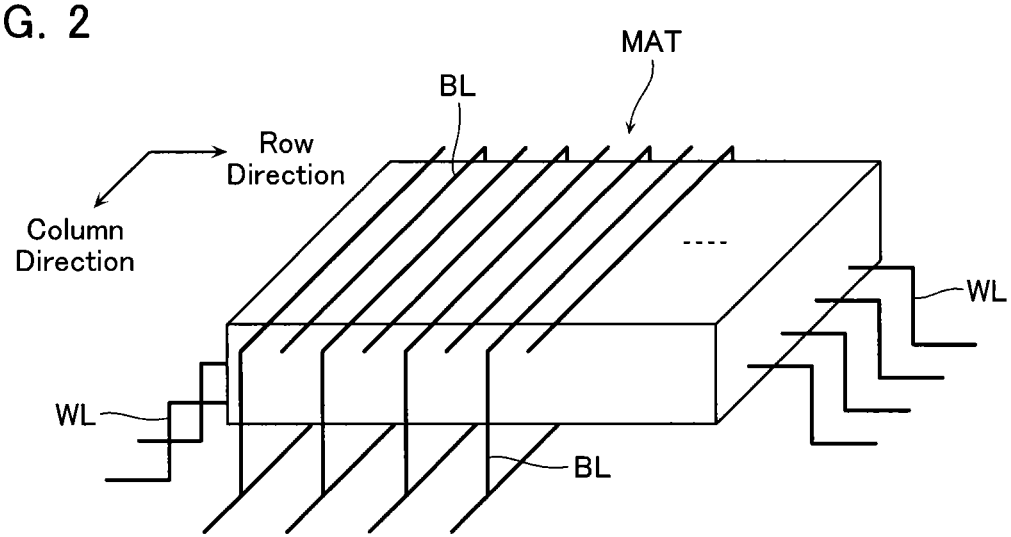
FIG. 2 is a diagram showing a configuration of a MAT in the same memory block.

FIG. 2 is a diagram showing a configuration of the MAT in the memory block according to the present embodiment.

The MAT includes plural bit lines BL extending in the column direction, plural word lines WL extending in the row direction, and memory cells MC of the cross point type (not shown) formed at the intersections of the plural bit lines BL and word lines WL. In the following description, the cell array or MAT including such the memory cells MC of the cross point type may also be referred to as a "cell array of the cross point type" or "MAT of the cross point type".

The following description is given on the precondition that the bit lines BL, the word lines WL and the memory cells MC are laid out almost at the minimum pitch. Therefore, odd-aligned bit lines BL of plural bit lines BL are led out from the front side of the MAT, and even-aligned bit lines BL from the rear side of the MAT. The same goes for the word lines WL. Hereinafter, odd-aligned bit lines may also be referred to as "odd bit lines", even-aligned bit lines as "even bit lines", odd-aligned word lines as "odd word lines", and even-aligned word lines as "even word lines".

The following description is given to an arrangement of the MAT and associated peripheral circuits.

Figure 3:
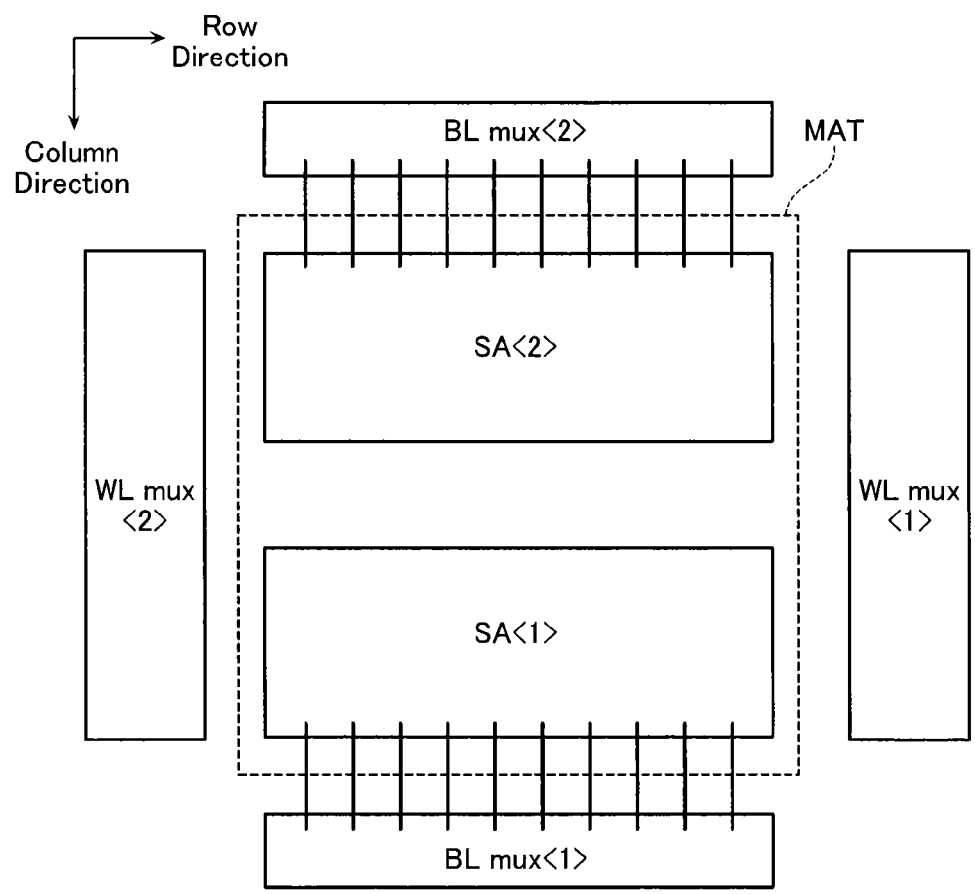
FIG. 3 is a diagram showing an arrangement of the MAT and associated peripheral circuits in the same memory block.

FIG. 3 is a diagram showing an arrangement of the MAT and associated peripheral circuits in the memory block according to the present embodiment. The figure shows, as the peripheral circuits, a bit line multiplexer, BL mux, operative to select a bit line BL, a sense amp SA operative to sense and amplify data, via the bit line BL selected by the bit line multiplexer, BL mux, from the memory cell MC connected to the bit line BL, and a word line multiplexer, WL mux, operative to select only a single word line WL.

The bit line multiplexer BL mux includes a bit line multiplexer BL mux<1> arranged on the front side of the MAT and operative to select an odd bit line BL, and a bit line multiplexer BL mux<2> arranged on the rear side of the MAT and operative to select an even bit line BL. The bit line multiplexers BL mux<1:2> are contained in a column control circuit 2.

The sense amp SA includes a sense amp SA<1> operative to sense and amplify data from the memory cell MC via the odd bit line BL, and a sense amp SA<2> operative to sense and amplify data from the memory cell MC via the even bit line BL. The sense amps SA<1:2> are formed on a semiconductor substrate located below the MAT. This makes it possible to suppress the increase in the chip area associated with the arrangement of the sense amps SA<1:2>. The sense amp SA<1> is arranged in the front half of the MAT arrangement area, and the sense amp SA<2> in the rear half of the MAT arrangement area, both along the row direction.

The word line multiplexer WL mux includes a word line multiplexer WL mux<1> arranged on the left side of the MAT and operative to select an odd word line WL, and a word line multiplexer WL mux<2> arranged on the right side of the MAT and operative to select an even word line WL.

The odd bit line BL exits from the front side of the MAT, then extends toward the lower side, and connects to the bit line multiplexer BL mux<1>. The output of the bit line multiplexer BL mux<1> is connected to the sense amp SA<1> using the area between the MAT and the bit line multiplexer BL mux<1>. This connecting relation is similar to that among the odd bit line BL, the bit line multiplexer BL mux<2> and the sense amp SA<2>.

The odd word line WL exits from the right side of the MAT, then extends toward the lower side, and connects to the word line multiplexer WL mux<1>. This connecting relation is similar to that between the even word line WL and the word line multiplexer WL mux<2>. The number of word lines WL and so forth connected to the word line multiplexers WL mux<1:2> is less than the number of selection lines connected to the bit line multiplexers BL mux<1:2>. Therefore, the area between the MAT and the word line multiplexers WL mux<1:2> can be used to arrange a mass data bus and so forth therein relatively free.

Next, the memory cell MC is described.

Figure 4A:
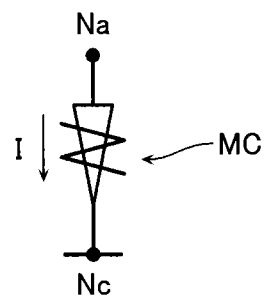
FIG. 4A is a diagram showing a circuit symbol of a memory cell in the same memory block.
Figure 4B:
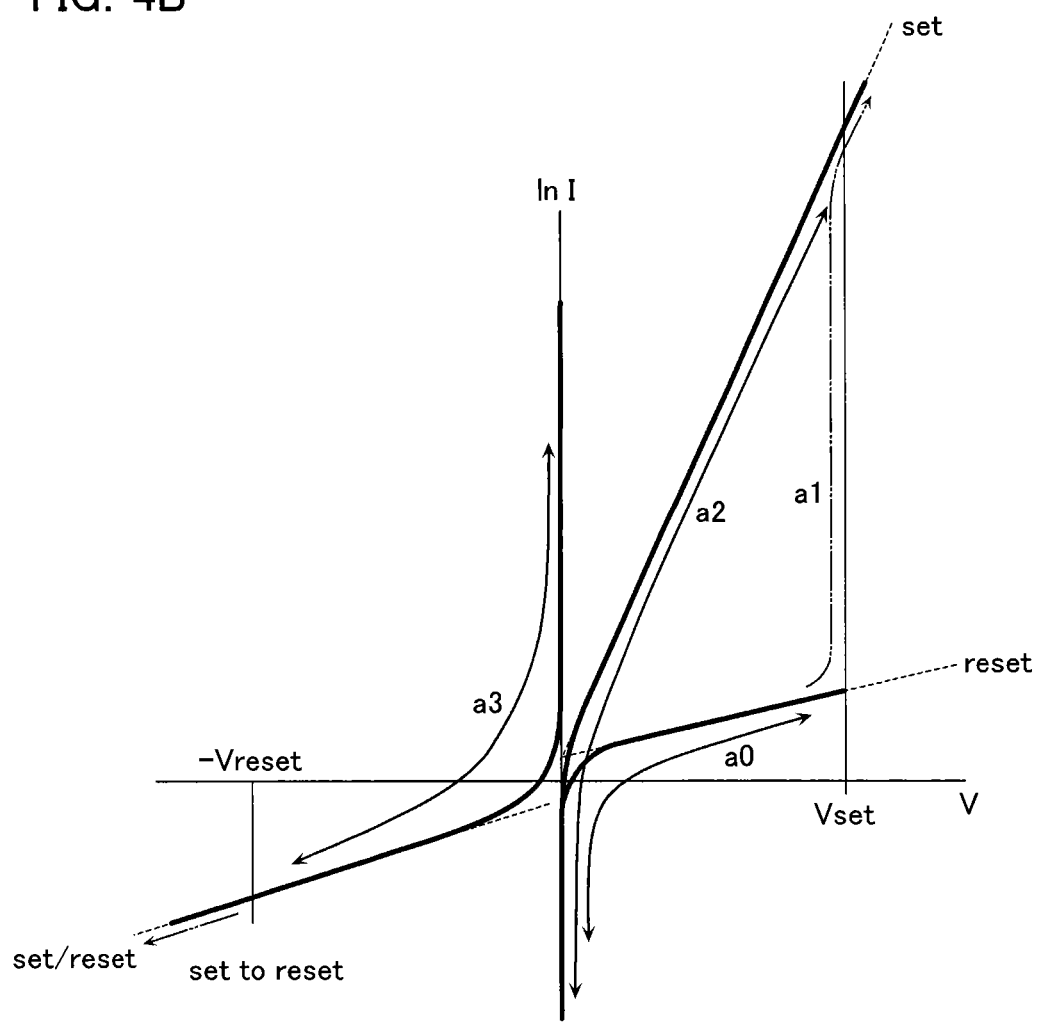
FIG. 4B is a diagram showing a voltage-current characteristic of the memory cell in the same memory block.

FIG. 4A is a diagram showing a circuit symbol of the memory cell MC in the memory block according the present embodiment. FIG. 4B is a diagram showing a voltage-current characteristic of the memory cell MC in the memory block according the present embodiment. Hereinafter, a node Na shown in FIG. 4A is referred to as an "anode" and a node Nc as a "cathode". The direction shown with the arrow in FIG. 4A directing from the anode Na toward the cathode Nc is referred to as a "forward direction" and the opposite direction as a "reverse direction". Therefore, a bias is the forward bias if the potential on the cathode Nc is lower than that on the anode Na while a bias is the reverse bias if the potential on the cathode Nc is higher than that on the anode Na.

The memory cell MC comprises a variable resistance element and stores data in accordance with different resistances of the variable resistance element. Hereinafter, a state of the memory cell MC is referred to as a "reset state" if the variable resistance element is in a high resistance state while a state of the memory cell MC as a "set state" if the variable resistance element is in a low resistance state. In addition, an operation is referred to as "set operation" when changing the memory cell in the reset state to the set state while an operation as "reset operation" when changing the memory cell in the set state to the reset state. Therefore, write operation contains "set operation" and "reset operation".

The memory cell MC has the nature of a solid electrolyte. This is such the nature that causes the voltage-current characteristic to become asymmetrical in accordance with the direction of bias (the polarity of an applied voltage) as shown in FIG. 4B. As can be found from FIG. 4B, in the voltage-current characteristic of the memory cell MC, except the vicinity of the applied voltage V=0, the cell current can be approximated by I~A exp($\alpha$V) (A, $\alpha$ are constants). When the memory cell MC in the reset state is forward-biased, when the memory cell MC in the reset state is reverse-biased, and when the memory cell MC in the set state is reverse-biased, the coefficients $\alpha$ have almost the same magnitude. In contrast, when the memory cell MC in the set state is forward-biased, the coefficient $\alpha$ becomes remarkably larger. In the vicinity of the applied voltage V=0, ln I becomes ±∞.

When the memory cell MC in the reset state is forward-biased, the memory cell still remains in the reset state within a range of the applied voltage V from near 0V to a set voltage Vset. In this case, the cell current I flowing in the memory cell MC varies reversibly in accordance with variations in the applied voltage V (the arrow a0). When the applied voltage V becomes equal to or higher than the set voltage Vset, the state of the memory cell MC changes from the reset state to the set state irreversibly (set operation) (the arrow a1).

When the memory cell MC in the set state is forward-biased, on the other hand, the cell current I flowing in the memory cell MC varies reversibly in accordance with variations in the applied voltage V (the arrow a2). The memory cell MC in the set state, however, can make no transition to the reset state as far as it is forward-biased even if the applied voltage V is elevated.

When the memory cell MC in the reset state is reverse-biased, the cell current I flowing in the memory cell MC varies reversibly in accordance with the applied voltage V (the arrow a3). The memory cell MC in the reset state, however, can make no transition to the set state as far as it is reverse-biased even if the applied voltage V is elevated.

When the memory cell MC in the set state is reverse-biased, on the other hand, the memory cell MC still remains in the set state within a range of the applied voltage from 0V, the reverse bias from 0V, to a voltage, −Vreset (hereinafter, Vreset is referred to as a "reset voltage"). In this case, the cell current I flowing in the memory cell MC varies reversibly in accordance with variations in the applied voltage V (the arrow a3). When the applied voltage V becomes equal to or lower than the voltage, −Vreset, the state of the memory cell MC changes from the set state to the reset state irreversibly (reset operation).

In addition to the reset state in which the variable resistance element is in the high resistance state, and the set state in which the variable resistance element is in the low resistance state, the memory cell MC has an intermediate state between the reset state and the set state, that is, a weak reset state. The weak reset state is an unstable state that easily changes to the set state or the reset state.

The following description is given to access operation to the memory cell MC.

FIG. 3 is a diagram showing an arrangement of the MAT and associated peripheral circuits in the memory block according to the present embodiment.

For the purpose of increasing the share of the entire chip held by the memory cells MC when the MAT and associated peripheral circuits are constructed as shown in FIG. 3, it is sufficient to form one MAT larger, thereby down-sizing relative sizes of the peripheral circuits. A larger MAT, however, elevates the rate of the occurrence of fault memory cells MC in the MAT. A fault memory cell MC normally establishes a short circuit between the bit line BL and the word line WL, and accordingly even a single fault memory cell MC exerts an influence on the entire of the MAT.

Therefore, the present embodiment describes a method of replacing the fault memory cell MC in the memory block particularly using the so-called floating access method (hereinafter referred to as "FLA").

In the following description, an access-targeted memory cell may also be referred to as an "access memory cell", other memory cells as "non-access memory cells", a bit line connected to the access memory cell as an "access bit line", other bit lines as "non-access bit lines", a word line connected to the access memory cell as an "access word line", other word lines as "non-access word lines", the generic term of the access bit line and access word line as "access selection lines", and the generic term of non-access bit lines and non-access word lines as "non-access selection lines".

The FLA is an access method of, basically, providing an access selection line with a certain access potential required to make access to a memory cell MC while bringing non-access selection lines into the floating state. The following description is given to a memory block, which uses a memory cell MC having the anode Na connected to a bit line BL and the cathode Nc connected to a word line, and executes read operation on the forward bias by way of example.

FIGS. 5-8 are diagrams showing bias states of a cell array (MAT) in FLA in the memory block according to the same embodiment. In these figures, a black-colored memory cell MCa is an access memory cell, and a x-marked memory cell MCd is a fault memory cell.

The FLA is realized at four steps, including a hold step, an initial step, a standby step, and an active step.

Figure 5:
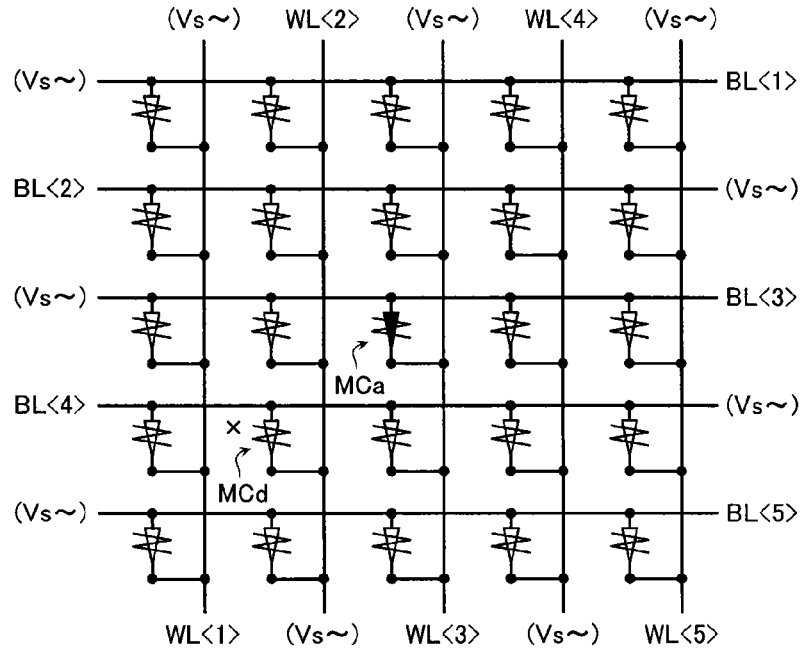
FIG. 5 is a diagram illustrative of a bias state of a cell array at the hold step in FLA in the same memory block.

Initially, at the hold step shown in FIG. 5, a potential Vs near the ground potential Vss is applied to bring all bit lines BL and all word lines WL into the floating state (Vs~ in the figure). The suffix "~" added to the potential means that it is brought into the floating state in the state of that potential. Among those, at the hold step, a certain bias state is formed independent of the presence/absence of a fault memory cell MCd.

Figure 6:
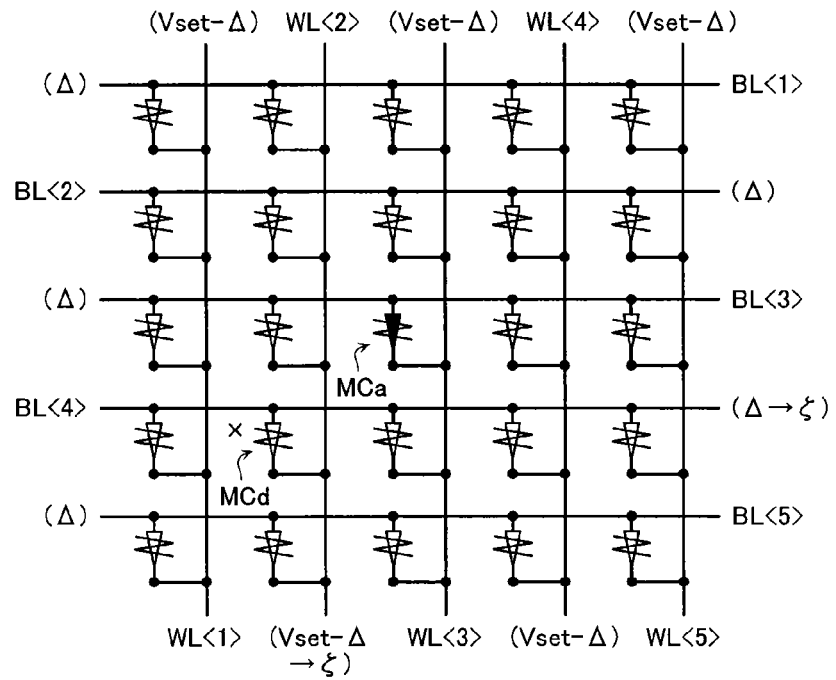
FIG. 6 is a diagram illustrative of a bias state of the cell array at the initial step in FLA in the same memory block.

Subsequently, at the initial step shown in FIG. 6, all bit lines BL are provided with a potential $\Delta$ and all word lines WL with a potential Vset-$\Delta$ so that all memory cells MC are reverse-biased with Vset-$2\Delta$. The "$\Delta$" indicates the forward bias (dead-zone voltage) under which a memory cell MC can be regarded as in the high resistance state independent of the state of the memory cell MC. This changes the memory cell MC in the set state to the weak reset state. At the same time, the abnormality of the current flowing from the word line WL to the bit line BL is utilized to specify short fault caused selection lines, and the specified selection lines are immediately provided with a fault line potential $\zeta$. In the case of FIG. 6, the memory cell MCd causes a short fault between a bit line BL<4> and a word line WL<2>.

Figure 7:
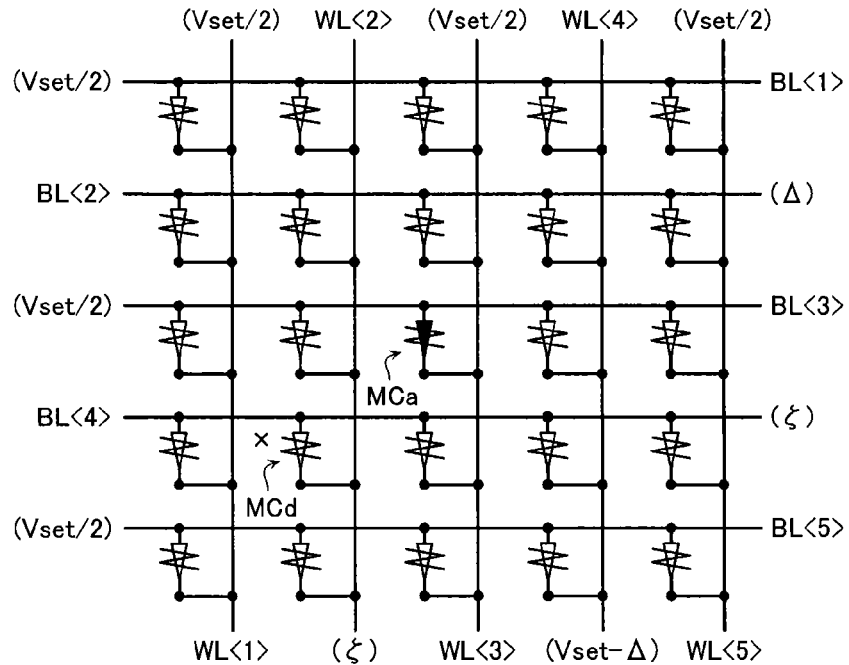
FIG. 7 is a diagram illustrative of a bias state of the cell array at the standby step in FLA in the same memory block.

Subsequently, at the standby step shown in FIG. 7, the fault-caused, short-circuited bit line BL<4> and word line WL<2> are kept at the fault line potential $\zeta$ while odd bit lines BL containing an access bit line BL<3> are provided with a potential Vset/2 and even bit lines BL with the potential $\Delta$. In addition, odd word lines WL containing an access word line WL<3> are provided with the potential Vset/2 and even word lines WL with the potential Vset-$\Delta$.

Figure 8:
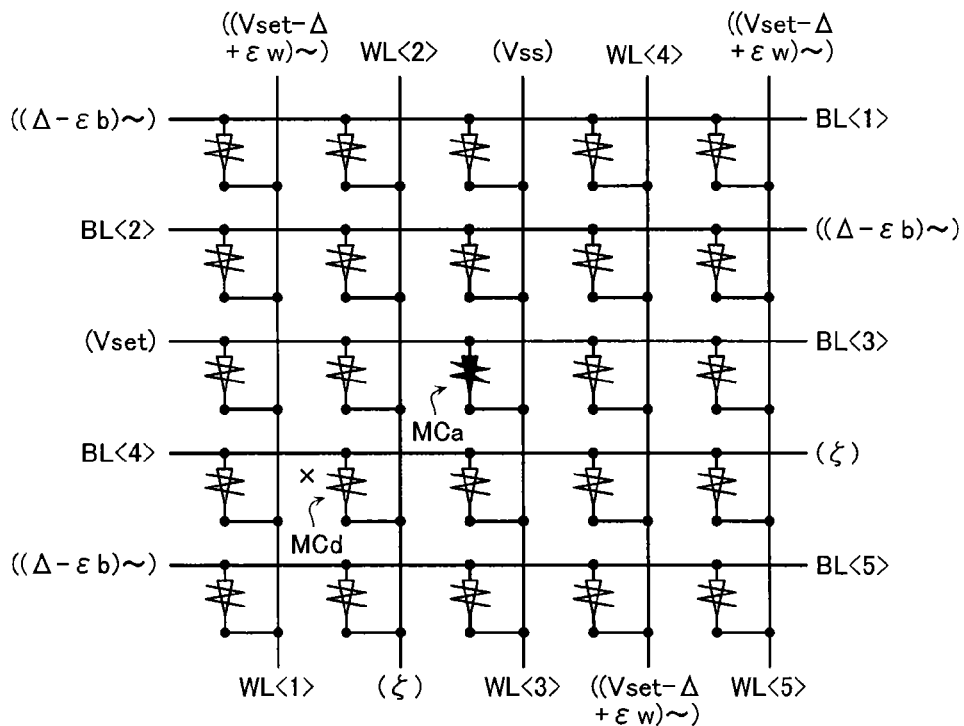
FIG. 8 is a diagram illustrative of a bias state of the cell array at the active step in FLA in the same memory block.

Finally, at the active step shown in FIG. 8, the access bit line BL<3> is provided with the set potential Vset and the access word line WL<3> with the ground potential Vss. The fault-caused, short-circuited bit line BL<4> and word line WL<2> are provided with the fault line potential $\zeta$. In addition, other non-access bit lines BL and other non-access word lines WL are brought into the floating states ($\Delta-\epsilon b$)~ and (Vset-$\Delta+\epsilon w$)~, respectively. In this case, $\epsilon b$ denotes the average value of voltage drops at the bit lines BL caused by the sum total of fine leakage current in the memory cells MC on the dead-zone voltage, and $\epsilon w$ denotes the average value of voltage drops at the word lines WL caused by the sum total of fine leakage current in the memory cells MC on the dead-zone voltage.

At the active step, non-access selection lines are brought into the floating state. At that time, the influence of coupling with adjacent selection lines may greatly change the potential on non-access selection lines. In this case, the occurrence of disturbance can be considered. In the present embodiment, however, adjacent selection lines are driven by drivers located on the opposite sides surely sandwiching the MAT therebetween. Further, the settings of potentials on these drivers at the standby step differ from each other. Therefore, it is possible to suppress the occurrence of disturbance.

Next, the sense amp SA is described. First, the circuitry of the sense amp SA is described.

The presence of the fault memory cell MCd causes a fluctuation in the current superimposed on the cell current flowing in the access bit line BLa. Therefore, the present embodiment uses, as the sense amp SA, a sense amp of the current comparing type insusceptible to the influence of the fluctuation. Namely, a reference bit line BLr sharing the access word line WLa is provided within the same MAT. In this case, a reference cell current Ir flowing in the reference bit line BLr becomes equal to a fluctuation current superimposed on an access cell current Ia flowing in the access bit line BLa. As a result, when the reference cell current Ir is compared with the access cell current Ia, the state of the memory cell MC can be read out.

The following description is given, as an example of the sense amp SA, to a sense amp SA of the current comparing type capable of executing a comparison of fine current at a high speed.

Figure 9:
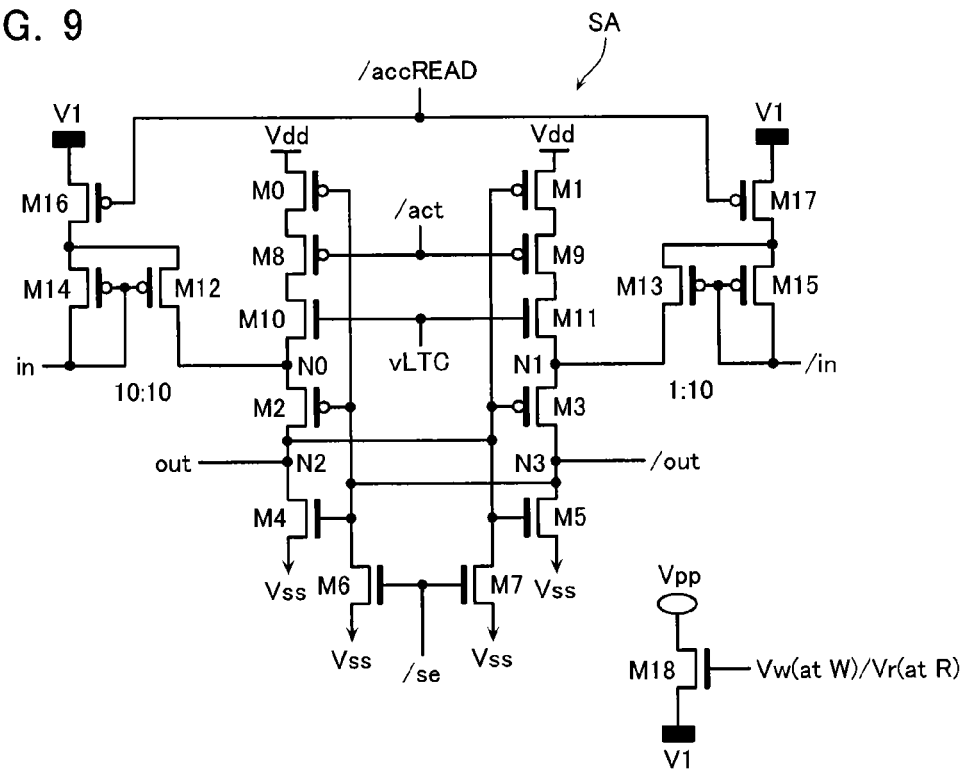
FIG. 9 is a circuit diagram of a sense amp in the same memory block.

FIG. 9 is a circuit diagram of the sense amp SA in the memory block according to the present embodiment.

The sense amp SA includes PMOS transistors M0-M3, M8, M9, M12-M17, and NMOS transistors M4-M7, M10, M11, M18.

The transistors M0, M8, M10, M2 and M4 are serially connected between a certain supply potential Vdd and the ground potential Vss. The transistor M6 has a source connected to the gates of the transistors M0, M2 and M4, and a drain connected to the ground potential Vss.

The transistors M1, M9, M11, M3 and M5 are serially connected between the supply potential Vdd and the ground potential Vss. The transistor M7 has a source connected to the gates of the transistors M1, M3 and M5, and a drain connected to the ground potential Vss.

The transistors M8 and M9 have respective gates, which receive a control signal/act. The transistors M10 and M11 have respective gates, which receive a control signal vLTC. The transistors M6 and M7 have respective gates, which receive a control signal /se that controls the start of sensing at the sense amp SA. The output node N2 between the transistors M2 and M4 is connected to the gates of the transistors M1, M3 and M5 and the source of the transistor M7. The output node N2 provides an output signal 'out'. The output node N3 between the transistors M3 and M5 is connected to the gates of the transistors M0, M2 and M4 and the source of the transistor M6. The output node N3 provides an output signal '/out'.

The transistor M12 has a source connected to the drain of the transistor M16, a drain connected to the input node N0 between the transistors M10 and M2, and a gate connected to the drain and gate of the transistor M14. The transistor M16 has a source connected to a certain potential V1, and a drain connected to the sources of the transistors M12 and M14. The gate of the transistor M12 and the drain and gate of the transistor M14 provide an input signal 'in'.

The transistor M13 has a source connected to the drain of the transistor M17, a drain connected to the input node N1 between the transistors M11 and M3, and a gate connected to the drain and gate of the transistor M15. The transistor M13 differs in size from the transistor M12. The transistor M17 has a source connected to the potential V1, and a drain connected to the sources of the transistors M13 and M15. The gate of the transistor M13 and the drain and gate of the transistor M15 provide an input signal '/in'. The transistors M16 and M17 have respective gates, which receive a control signal /accREAD.

The transistor M18 has a source connected to the potential Vpp, and a drain connected to the potential V1. The gate of the transistor M18 is provided with a potential Vw at the time of write operation, and a potential Vr at the time of read operation.

The sense amp SA is operative to compare the access cell current Is with the reference cell current Ir to decide the resistance state stored as information in the access memory cell MCs, and is possible to surely execute a high-speed sensing even in a comparison of current less than several 10 nA.

In the input stage the sense amp SA is provided with a current mirror circuit composed of the transistors M12, M14 and M16, and a current mirror circuit composed of the transistors M13, M15 and M17. The current of the input signal '/in' is determined to become 1/10 the current of the input signal 'in'. Accordingly, even if the reference memory cell MCr is in the set state, only the current equal to 1/10 the reference cell current Ir, smaller than the maximum and larger than the minimum of the selection cell current Is, is allowed to flow into the sense amp SA at the time of read operation. This current is used as a reference current Ir' of the sense amp SA.

The above two current mirror circuits operate on the potential V1. The potential V1 is obtained through the transistor M18 by restricting the potential Vpp and the current. The transistor M18 is provided with the potential Vw at the time of write operation and the potential Vr at the time of read operation. This makes it possible to switch the potential on the bit line BL at the time of access operation.

Next, the basic operation of the sense amp SA is described.

Figure 10:
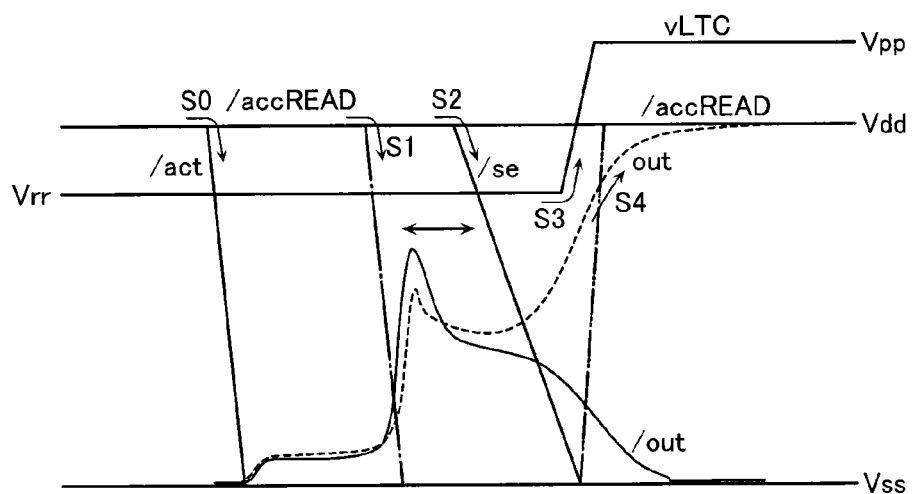
FIG. 10 is an operation waveform diagram associated with the sense amp shown in FIG. 9.

FIG. 10 is an operation waveform diagram associated with the sense amp SA shown in FIG. 9.

Initially, when the control signal /act is lowered from "H" to "L" in the state of the control signal /se="H" (step S0 in FIG. 10), the pair of transistors M8 and M9 turns on. As a result, current flows in the sense amp SA.

Subsequently, the control signal /accREAD is lowered from "H" to "L" (step S1 in FIG. 10) to supply the flow of current into the access bit line BLa and the reference bit line BLr through the inputs of the input signals 'in' and '/in'. The difference between the access cell current Ia flowing at this moment and the reference current Ir' equal to about 1/10 the reference cell current Ir is amplified and latched as the drain voltage difference by the pair of transistors M6 and M7 that are cut off after passing through the saturation region from the linear region.

For the purpose of amplifying the current difference between the access cell current Ia and the reference current Ir', the control signal /se is lowered from "H" to "L" (step S2 in FIG. 10). As a result, the pair of transistors M6 and M7 turns off after both passing through the saturation region from the linear region. At that time, the difference in timing of the shift to the saturation region, caused by a slight difference between the access cell current Ia and the reference current Ir', is converted into a drain voltage. When the source potential on the transistor M6 is higher, the gate potential on the transistors M0 and M2 becomes higher so that the transistors M0 and M2 turn off. When the source potential on the transistor M7 is higher, on the other hand, the gate potential on the transistors M1 and M3 becomes higher so that the transistors M1 and M3 turn off. Thus, the drain voltage difference between the pair of transistors M6 and M7 is amplified.

The pair of transistors M10 and M11 is given a lowered gate potential in the initial stage of sensing to suppress the conductance, thereby reducing the sense amp current from the supply potential Vdd to reflect the difference in cell current supplied via the pair of transistors M12 and M13 more strongly in accordance with the state of the sense amp SA.

In the initial stage of sensing, once the balance of the sense amp SA is collapsed by the current difference between the access cell current Ia and the reference cell current Ir and then stabilized, the control signal vLTC is elevated from the supply potential Vdd to a higher potential Vpp (step S3 in FIG. 10). As a result, the sense amp SA is supplied with the supply voltage so that the output signal 'out' is full swung to the supply potential Vdd (S4 in FIG. 10). At this moment, the control signal /accREAD is raised to block the supply of the cell currents Ia, Ir to the sense amp SA.

The pairs of fine patterned transistors contained in the sense amp SA have variations in accordance with fluctuations during process steps. Therefore, the current paths can cancel the variations if they include as many serially connected elements as possible. Therefore, the sense amp SA includes three pairs of transistors, including the pair of transistors M0 and M1, the pair of transistors M8 and M9 and the pair of transistors M10 and M11, for the configuration between the supply potential Vdd and the input nodes N0, N1. In particular, the pair of NMOS transistors M10 and M11 suppresses the influence of variations in the pair of PMOS transistors M0 and M1 and the pair of transistors M8 and M9 contained in the feedback loop of the sense amp SA operation. Namely, this is achieved by suppressing the conductance of the NMOS transistors M10 and M11 to elevate the potentials on the drains and sources of the PMOS transistors M0, M1, M8 and M9 located closer to the supply voltage Vdd than the transistors M10 and M11, thereby increasing the conductance of the PMOS transistors M0, M1, M8 and M9. In a word, the conductance of PMOS transistors and the conductance of NMOS transistors take action so as to suppress the influence of variations in respective characteristics. The gates of the pair of the NMOS transistors M10 and M11 are supplied with the control signal vLTC and, only when the control signal vLTC is amplified, this action becomes larger. Therefore, in the initial stage of sensing, the control signal vLTC is kept lower, and in the latter half of sensing during which data is determined, the control signal vLTC is elevated to raise the conductance of the transistors so as to latch the data at a high speed. In the case of FIG. 10, the control signal vLTC is set to a potential Vrr different from the supply voltage Vdd until the time immediately before latching after sensing, and set to a much higher potential Vpp at the time of latching.

The time difference between the fall of the control signal/accREAD (step S1 in FIG. 10) and the fall of the control signal/SE (step S2 in FIG. 10) is adjusted so that the sense amp SA starts sense operation after the fall of the control signal/accREAD and when the cell currents Ia, Ir injected into the sense amp SA are fully reflected on the input currents of the sense amp SA.

The following description is given to an example of a sense amp system ready for multi-bit simultaneous read.

Figure 11:
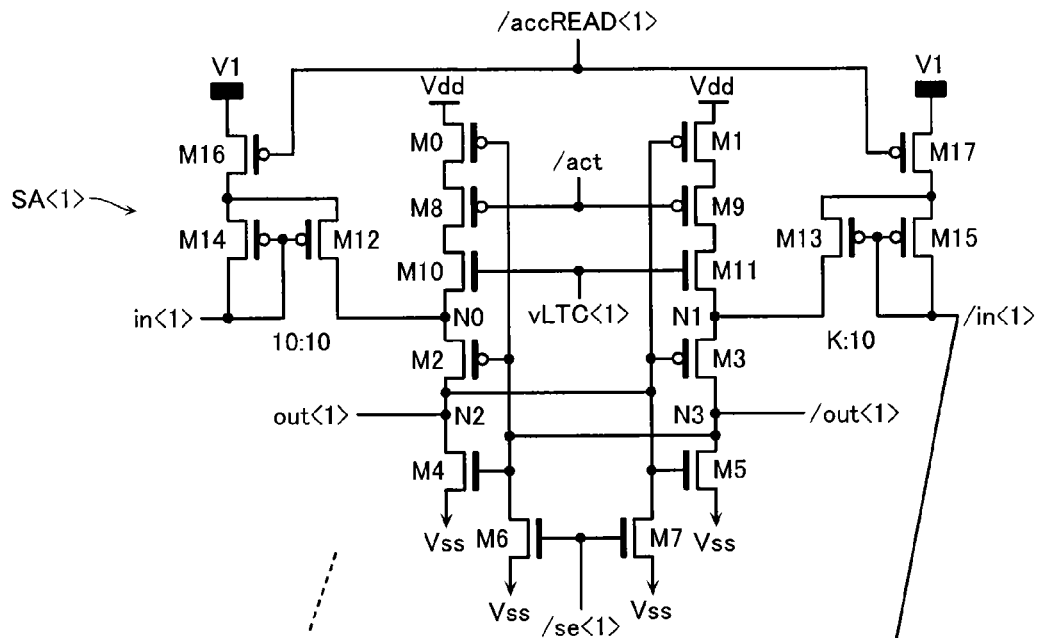
FIG. 11 is a diagram showing a configuration of a sense amp system in the same memory block.
Figure 11:
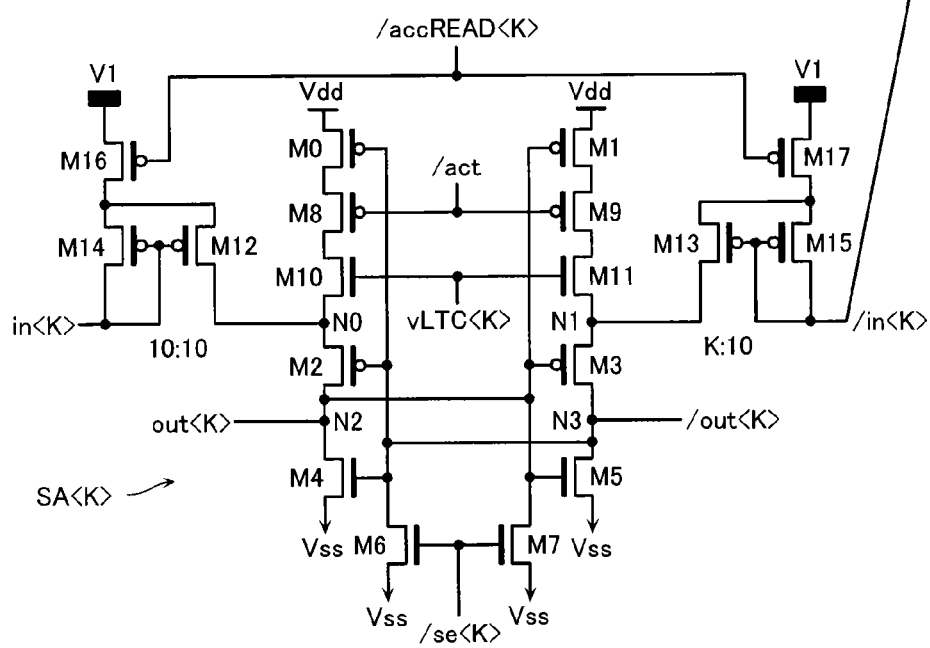

FIG. 11 is a diagram showing a configuration of the sense amp system in the memory block according to the present embodiment.

This sense amp system is a sense amp system ready for a K-bit local bus (data bus), and includes K sense amps SA<1:K>. Each sense amp SA<k> (k=1-K) receives a common control signal/act and independent control signals vLTC<k> and/se<k>. The sense amps SA<1:k> share a reference memory cell MCr, and each sense amp SA<k> has an input '/in<k>' connected to the shared reference memory cell MCr in common. The ratio of the current mirror circuit at the input of each sense amp SA arranged closer to the reference memory cell MCr is K times. This is because K sense amps SA<1:k> share the reference memory cell MCr. In this case, the amount of the reference current Ir' per sense amp SA is 1/K times in comparison with that when one sense amp SA uses the reference memory cell MCr. In a word, when K sense amps SA share the reference memory cell MCr, it is sufficient if, in comparison with the case in which one sense amp SA uses the reference memory cell MCr, a k-fold current can be introduced into each sense amp SA from the reference current Ir'.

According to the above-described sense amp system, each sense amp SA<k> corresponds to each bit of data on the local bus, and accordingly it is possible to sense and amplify K bits of data simultaneously.

Next, a current sense-related system in the memory bock is described. The current sense-related system herein described is ready for multi-bit simultaneous read.

Figure 12:
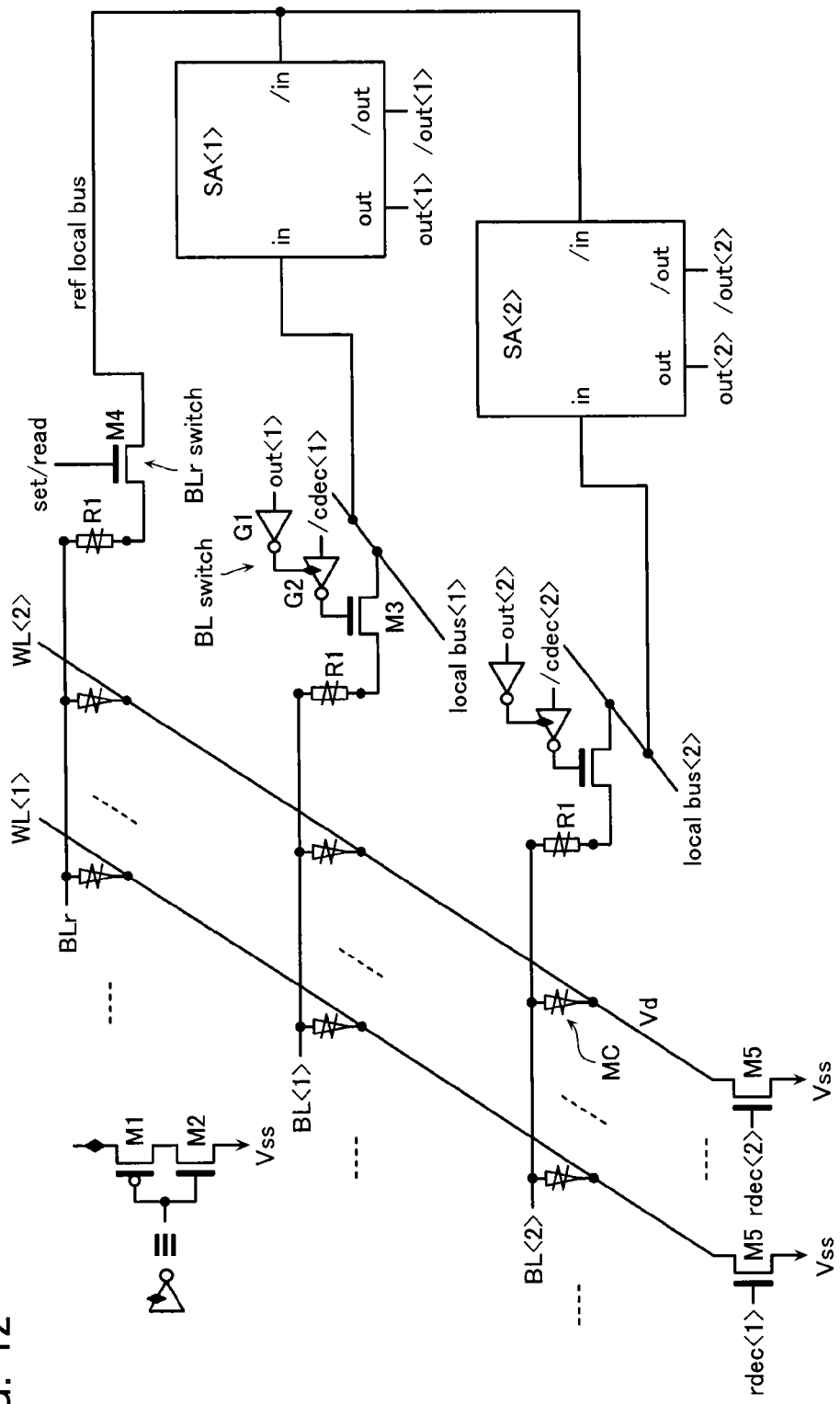
FIG. 12 is a diagram showing a configuration of a current sense-related system in the same memory block.

FIG. 12 is a diagram showing a configuration of the current sense-related system in the memory bock according to the present embodiment. FIG. 12 shows a cell array, sense amps SA, local buses and so forth.

The current sense-related system includes a sense amp SA<k> corresponding to each bit line BL<k>. A bit line BL<k> is connected to a local bus <k> via a resistance element R1 and a bit line switch (BL switch). Further, the local bus <k> is connected to the input 'in' of the sense amp SA<k>.

The resistance element R1 has a structure corresponding to the structure of the memory cell MC except the metal layer. Therefore, for convenience, the resistance element R1 is represented by a circuit symbol obtained by replacing the triangle in the circuit symbol of the memory cell MC with a square as shown in FIG. 12. The bit line switch includes a NOT circuit G1 connected to the output 'out<k>' of the sense amp SA<k>, a NOT circuit G2 including a PMOS transistor M1 and an NMOS transistor M2 serially connected between the output of the NOT circuit G1 and the ground potential Vss, and an NMOS transistor M3 provided between the resistance element R1 and the local bus <k> and having a gate connected to the output of the NOT circuit G2. The NOT circuit G2 receives a control signal, /cdec<k>, for column selection.

On the other hand, the reference bit line BLr is connected via the resistance element R1 and a reference bit line switch (BLr switch) to a reference local bus (ref local bus). Further, the reference local bus is connected to the inputs/in of the sense amps SA<1:k> in common. The reference bit line switch includes an NMOS transistor M4 provided between the resistance element R1 and the reference local bus. The transistor M4 is controlled by a control signal, set/read, that is activated at the time of set operation/read operation.

An NMOS transistor M5 is provided between each word line WL and the ground potential Vss. The transistor M5 has a gate, which receives a control signal, rdec, for row selection.

Due to the asymmetric voltage-current characteristic of the memory cell MC, current flows most in the memory cell MC after the variable resistance element of the memory cell MC changes to the low resistance state by set operation. Therefore, in the case of the current sense-related system shown in FIG. 12, for the purpose of restricting the cell current independent of the circuit response, each bit line BL is connected to a relatively high resistance resistor, that is, the resistance element R1. In this case, the voltage drop caused across the resistance element R1 makes it possible to prevent the flow of over current in the memory cell MC. As each bit line BL is connected to the resistance element R1, the propagation of the disturb potential caused on each bit line BL can be relieved. Therefore, it is convenient for FLA.

In the case of the current sense-related system of FIG. 12, the resistance element R1 is connected to the layer of the bit line BL. Therefore, the line connected to the bit line switch is arranged in the same layer as that of the word line WL.

In addition, only one memory cell MC is accessed by each bit line BL. Accordingly, the resistance element R1 connected to one end of the bit line BL is equal to the serial connection of the resistance element R1 to each memory cell MC. Thus, in the case of the current sense-related system of FIG. 12, the resistance element R1 is arranged outside the cell array 1. Therefore, the value of the resistance element R1 can be adjusted easily, thereby realizing an effective current restriction.

Next, a description is given, as an example of the memory block according to the present embodiment, to a memory block including plural MATs of the cross point type in which FLA is executed to each MAT.

In the case of this memory block, an increase in the cell share to produce a low-cost memory chip requires each MAT to be made larger, thereby increasing the number of memory cells MC contained in each MAT. The increase in the number of memory cells MC contained in each MAT, however, leads naturally to the occurrence of fault memory cells MCd in each MAT at a high probability. Therefore, in the memory block according to the present embodiment, it becomes important to handle fault memory cells MCd.

Therefore, the following description is given to a redundancy replacing method capable of reducing the influence of the fault memory cell MCd exerted on the MAT to effectively utilize normal memory cells MC.

In a MAT of the cross point type, when the fault in a memory cell MC is an open fault, the data stored in the memory cell MC is only fixed to data corresponding to the reset state. Accordingly, other normal memory cells MC in the MAT are accessible without any problems. When the fault in the memory cell MC is a short fault, on the other hand, a short circuit is established between selection lines connected to the memory cell MC. Therefore, depending on the handling method, accessible normal memory cells MC are greatly restricted as a problem.

For a solution of this problem, there is an effective handling method, in which the same fault line potential ζ is provided at the time of access operation to fix the bit line BL and word line WL short-circuited through a fault memory cell MCd. Thus, it is sufficient to restrict only access to memory cells MC connected to at least one of the fault-caused, short-circuited bit line BL and word line.

In the case of this handling method, however, when the size of a MAT becomes larger, the number of access-restricted memory cells MC naturally becomes larger correspondingly such that the utilization efficiency of the memory cells MC is greatly reduced as a problem.

Therefore, as a method of handling this problem, a method of redundancy replacing fault memory cells MCd by other memory cells MC is proposed. Hereinafter, a memory cell, a bit line and a word line to be replaced for redundancy on the occurrence of a fault may also be referred to as a "spare memory cell", a "spare bit line" and a "spare word line", respectively. In addition, the spare bit line and spare word line may also be referred to as spare selection lines collectively. The use of this handling method prevents the number of usable memory cells MC from fluctuating greatly even if a short fault occurs.

Figure 13:
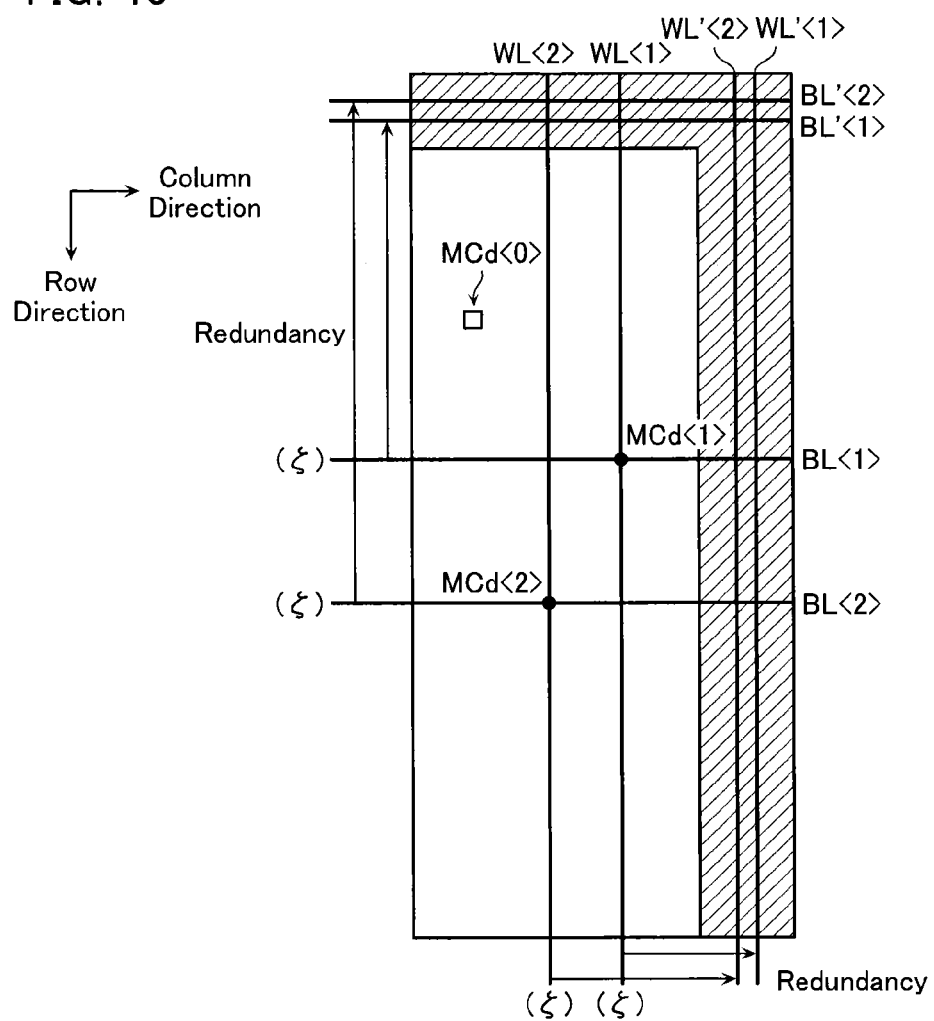
FIG. 13 is a diagram illustrative of redundancy replacement in the same memory block.

FIG. 13 is a diagram showing a configuration example of a MAT when this handling method is used. A memory cell MCd<0> shown with an outlined square in the figure is an open fault memory cell, and memory cells MCd<1:2> shown with black circles are short fault memory cells. The hatched area in the figure is a spare memory cell area in which the spare memory cell, the spare bit line and the spare word line are arranged. In FIG. 13, for facilitating the understanding of the overview of the handling method herein described, the spare memory cell area is arranged collectively on the end of the MAT. In practice, though, it is automatically replaceable and may also be arranged dispersedly within the MAT so as to reduce the circuit scale.

Initially, when a short fault is detected in accordance with the current flowing between the bit line BL and the word line WL, these bit line BL and word line WL are provided with the fault line potential ζ. At the same time, the access bit line BL and the access word line WL are replaced by a spare bit line BL' and a spare word line WL', respectively. In the case of FIG. 13, the bit line BL<1> and the word line WL<1> short-circuited through a fault memory cell MCd1 are replaced by a spare bit line BL'<1> and a spare word line WL'<1>, respectively. In addition, the bit line BL<2> and the word line WL<2> short-circuited through a fault memory cell MCd<2> are replaced by a spare bit line BL'<2> and a spare word line WL'<2>, respectively. Replacements of these bit lines BL and word lines WL are executed automatically so that estimations of faults at the time of replacements and special operations associated with replacements are not required. Therefore, the presence/absence of faults does not show up from external at the time of access operation.

It is desirable to arrange spare bit lines BL' and spare word lines WL' numerically equal within an area added as the spare memory cell area to the MAT. This is because, in the case of the MAT of the cross point type, numerically equal bit lines BL and word lines WL are made inaccessible by short faults. In addition, spare memory cells are provided by the number consistent with the number of memory cells MC to be made inaccessible by assumed short faults so that the number of effectively usable memory cells MC in the MAT is prevented from fluctuating greatly.

A fault in the spare memory cell itself and other faults may interfere with replacements. In this case, the memory cell MC connected to the selection lines made inaccessible by a short fault is handled as a fixed-data stored memory cell MC, similar to an open fault memory cell MC, and handled substantially inaccessible.

The characteristics of the above-described method of handling fault memory cells can be summarized as follows.

As the first characteristic, the open fault memory cell (MCd<0> in FIG. 13) can be regarded as a memory cell in the reset state, of which variable resistance element is in the high resistance state, and accordingly it exerts no influence on the potential setting at the time of access operation. The open fault memory cell is inaccessible and handled as one that stores fixed data.

As the second characteristic, the short fault memory cell (MCd<1:2> in FIG. 13) requires an appropriate handling method because of the variable resistance element in the low resistance state. As the handling method, the bit lines (BL1 and BL2 in FIG. 13) and word lines (WL1 and WL2 in FIG. 13) short-circuited through a short fault memory cell are provided with the same fault line potential ζ to prevent the short fault memory cell from being biased. Under just this condition, however, the number of usable memory cells MC fluctuates greatly if the size of the MAT is large. Therefore, in order to avoid it, a spare memory cell area is provided previously to execute the replacement of fault memory cells and so forth automatically.

The following description is given to a configuration of the memory block in the case of a large size MAT and an arrangement example of the spare memory cell area.

The terms to be used below are described here. The specific numerals are herein shown by way of example and thus can be set arbitrarily in accordance with the specification of the memory block.

An "SL group" refers to a set of 128 adjoining selection lines and peripheral circuits operative to control the set. The selection lines are driven alternately from both opposite sides of the MAT. Therefore, in consideration of one SL group, the number of selection lines driven from one side of the MAT is equal to 64. The SL group is the minimum unit at the time of selection line control and only one selection line is selected from the SL group. The spare memory cell area is also configured in SL groups. The SL group in the spare memory cell area may also be referred to as an "SSL group".

A "spare unit" refers to a set of SL groups having one SSL group as redundancy and peripheral circuits operative to control the set. If the number of bit lines BL differs from the number of word lines WL contained in a MAT, the size of spare units aligned in the column direction naturally differs from the size of spare units aligned in the row direction. Even in this case, however, it is required to equate the number of spare units aligned in the column direction with the number of spare units aligned in the row direction. This comes from the above-described method of handling fault memory cells. The spare unit of bit lines BL may also be referred to as a "bit line spare unit" and the spare unit of word lines WL as a "word line spare unit".

A "SET" refers to a set of 8 spare units and peripheral circuits operative to control this set. In the following description, in order to distinguish it from the general 'set', it is expressed by all capitals 'SET'. SETs of bit lines BL and SETs of word lines WL are arranged numerically equal to configure one MAT. The SET of bit lines BL may also be referred to as a "bit line SET" and the SET of word lines WL as a "word line SET".

A "MATRIX" refers to eight MATs stacked. In the following description, in order to distinguish it from the general 'matrix', it is expressed by all capitals 'MATRIX'.

A "TILE" is a name for the MATRIX when it is regarded as a layout component within a memory block. In the following description, in order to distinguish it from the general 'tile', it is expressed by all capitals 'TILE'.

The above provides the meanings of the terms to be used in the following description.

Subsequently, a configuration example of the memory block is described.

Figure 14:
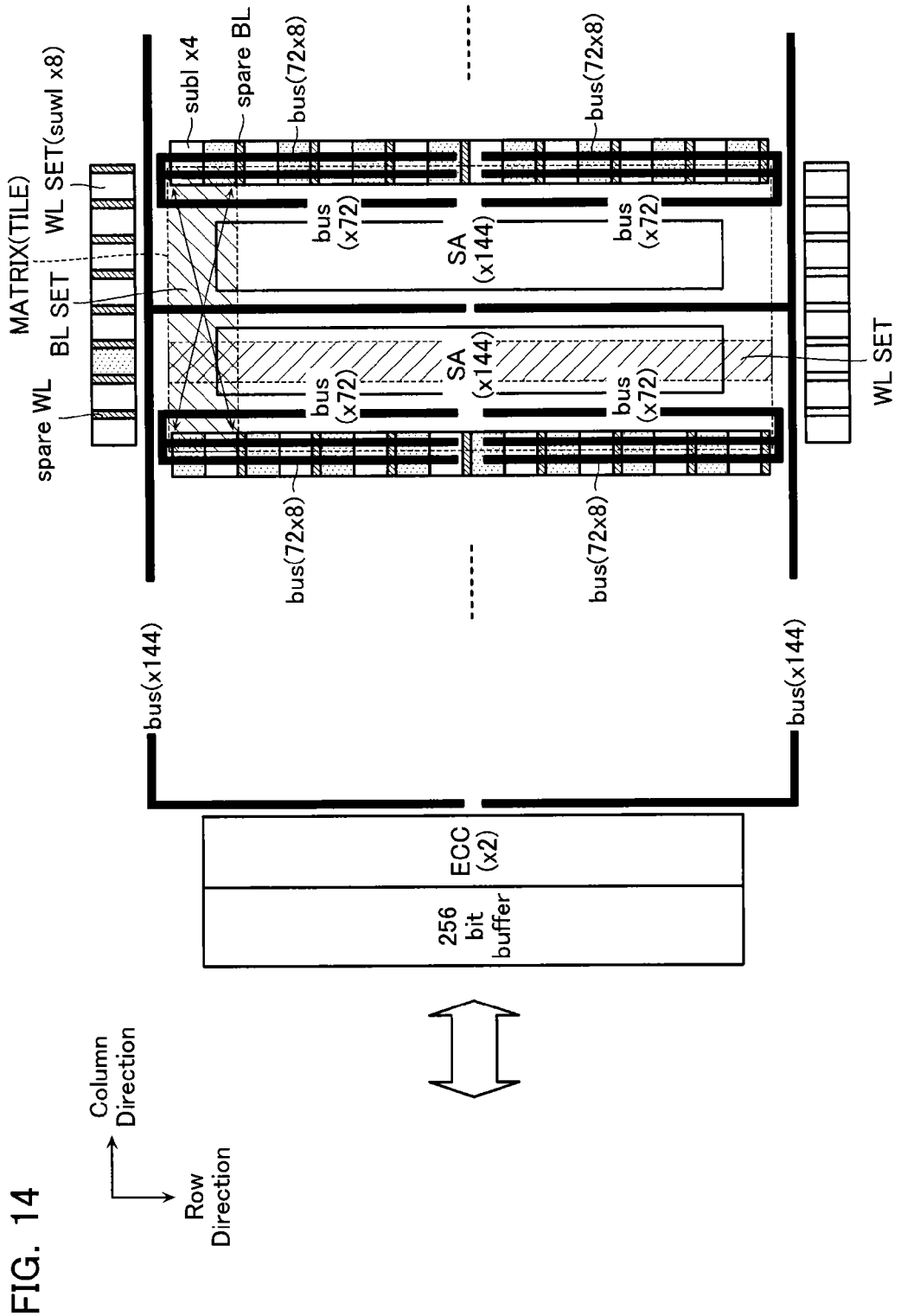
FIG. 14 is a diagram showing a configuration of a MATRIX and associated peripheral circuits in the same memory block.

FIG. 14 is a diagram showing a configuration of the MATRIX and associated peripheral circuits in the memory block according to the present embodiment. This memory block includes plural MATRIXs. A portion surrounded by the dashed line in the figure indicates the MATRIX (TILE), a hatched area extending in the column direction within the MATRIX indicates an area of one bit line SET, and a hatched area extending in the row direction within the MATRIX indicates an area of one word line SET. In addition, dot-patterned spare units, subl and suwl, in the figure show activated spare units, subl and suwl.

If the use of a 2-bit correctable BCH ECC (144 bits) is assumed, the bit line spare unit, subl, includes 36 SL groups and one SSL group, 37 (=36+1) in total. In FIG. 14, four bit line spare units, subl, are shown with one square. On the other hand, the word line spare unit, suwl, includes 16 SL groups and one SSL group, 17 (=16+1) in total.

One MAT includes eight bit line SETs aligned in the row direction and eight word line SETs aligned in the column direction. Namely, (36+1)×8×8 selection line groups, and 296K bit lines BL (containing 8K lines in the spare memory cell area) are contained in the row direction. In addition, (16+1)×8×8 SL groups, and 136K word lines WL (containing 8K lines in the spare memory cell area) are contained in the column direction. In a word, a single MAT can store 32 G bits of data. In this case, a MATRIX of 8-layered MATS can store 0.25 T bits of data.

In the example shown in FIG. 14, eight bit line SETs of bit lines BL are divided into upper and lower fours and, from above and below both sides of each MAT, 72 bits of data are transferred via the bus. Therefore, 288 (=144×2) bits of data in total are transferred from a single MAT. This data is processed at two ECC systems and turned into 256 bits=32 bytes of data. In each bit line SET, of which components are bit line spare units, subl, each containing SL groups, SL groups including bit lines BL to be accessed from the opposite sides of a MAT as shown with the arrow in the figure are prevented from becoming identical. Namely, decoding is so executed that a bit line BL adjacent to the access bit line BL is surely a non-access bit line BL, and the non-access bit line BL adjacent to the access bit line BL is surely brought into the floating state.

With regard to the word lines WL, as shown in FIG. 14, only one SL group is selected from one of the upper and lower sides of the MAT in each word line SET, and only one word line WL in the selected SL group is accessed.

A 72-bit bus linked to each MAT is arranged as superimposed on the buses of other MATs outside the MATRIX. As described above, the MATRIX is structured to include eight MATs stacked and accordingly the buses are arranged eight-fold. These eight folded buses are collected into a 72-bit bus on a corner of the MATRIX and led into a sense amp SA located below a TILE. From the sense amp SA, 144-bit buses are led out through the upper and lower sides of the MAT to the outside of the TILE as a 144×2-bit bus.

In FIG. 14, the locations of the spare selection lines (the fine-hatched square in the figure) are shown collectively at every SET. In practice, though, they are arranged dispersedly in eight SL groups. The activated portions are collectively divided into the upper and lower hatched parts at every SET. The combination of the activated portions, though, depends on decoding and accordingly it is not limited to the pattern of FIG. 14.

If MATRIXs thus configured are arranged as plural TILEs to construct a memory block, it is possible to form a T-bit class memory block. For instance, as the example shown in FIG. 14, it is possible to construct a memory block capable of communicating 256 bits of data at each TILE and executing error correction of 2 bits of (128+16) bits.

In the following description, a set of plural SETs aligned on each of the right, left, upper and lower sides of the MAT may also be referred to as a "driver block".

Next, a selection line block inner driver is described. The selection line block inner driver is a circuit of the minimum unit for control of the selection lines in the memory block.

Figure 15:
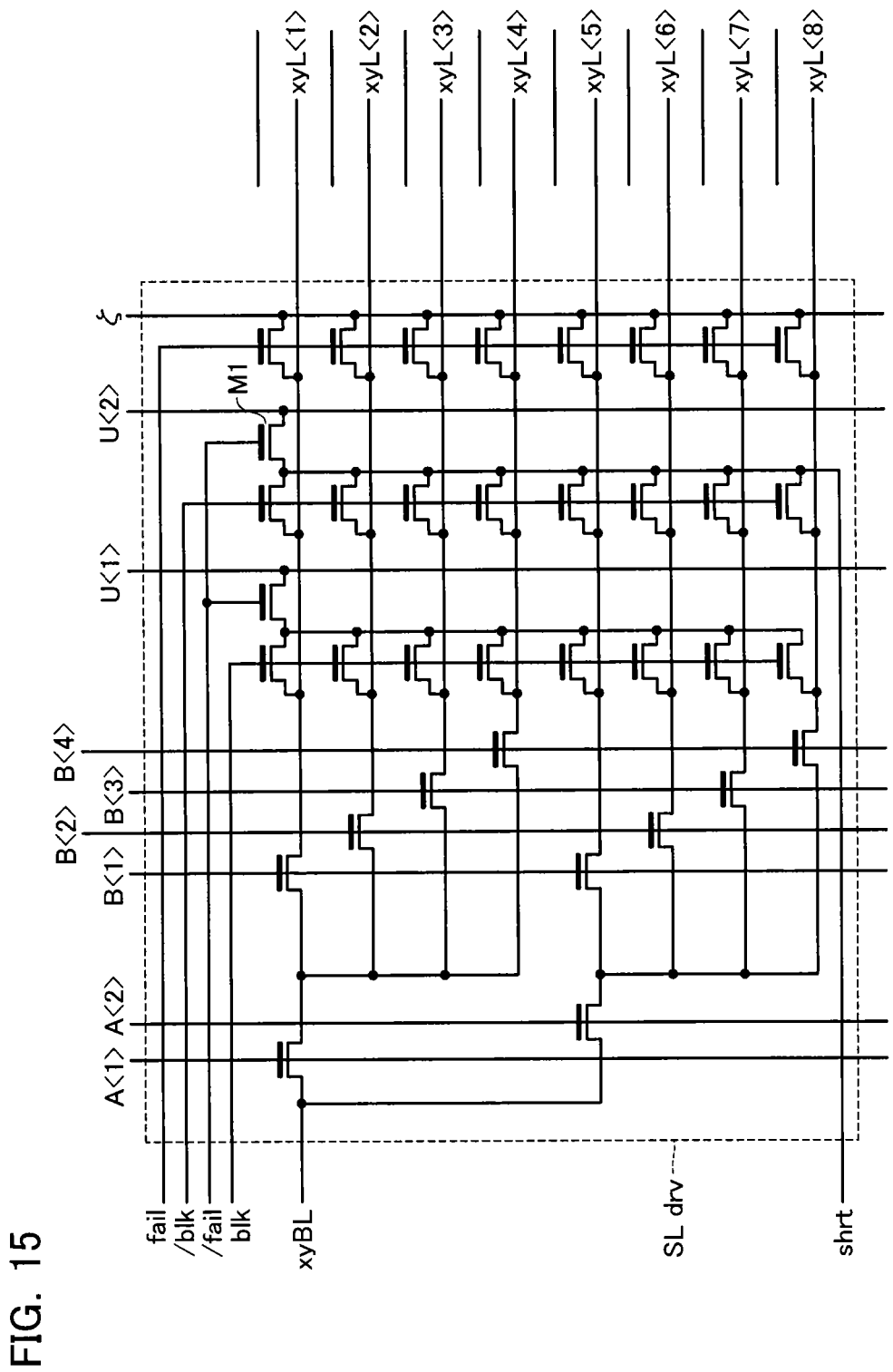
FIG. 15 is a circuit diagram of an SL drv circuit block in the same memory block.

FIG. 15 is a circuit diagram of an SL drv circuit block contained in the selection line block inner driver in the memory block according to the present embodiment.

The selection lines are alternately driven from the opposite sides of the MAT and accordingly the potentials on adjacent selection lines are set from the opposite drivers. In addition, these drivers can be used to set the selection lines in unison. Namely, in the case of FLA, the selection lines brought into the floating state can be driven at every SL drv circuit block existing on each side of the MAT. The selection line block inner driver includes pairs of SL drv circuit blocks opposing to each other on both sides of the MAT and drives the selection lines eight by eight from one side of the MAT, 16 selection lines from both sides in total.

The potentials to be set include an access line potential U<1> to be set on the SL drv circuit block that drives the selection lines containing the access selection line, a non-access line potential U<2> to be set on other SL drv circuit blocks, and a fault line potential $\zeta$ ready for short faults caused in memory cells MC and selection lines. These potentials are simultaneously set on terminals xyL<1:8> connected to eight selection lines in the SL drv circuit block. The setting of the access line potential U<1> or non-access line potential U<2> is complementary to the setting of the fault line potential $\zeta$. The setting is controlled by signals, fail and/fail, that are generated at every SL dry circuit block. At the time of the control signal, fail='H', and the control signal, /fail='L', eight terminals xyL<1:8> of the SL drv circuit block are all fixed to the fault line potential $\zeta$. This is independent of the presence/absence of access to the SL drv circuit block.

A control signal for use in selection of the SL dry circuit block is blk and a complementary control signal thereof is/blk. When the SL drv circuit block is accessed and the selection signal, blk='H', is given, the terminals xyL<1:8> are all provided with the access line potential U<1>. As the selection signal, /blk='H', is given to non-selected SL drv circuit blocks, the terminals xyL<1:8> are all provided with the non-access line potential U<2>.

For selection of one to be connected to a terminal xyBL from eight terminals xyL<1:8>, address signals A<1:2> and B<1:4> are used. These address signals A<1:2> and B<1:4> are common signals among all SL drv circuit blocks aligned on one side of the MAT.

The eight terminals xyL<1:8> are divided into sets of fours. When any one of the address signals B<1:4> becomes 'H', two terminals xyL<n1> (n1=1-4) and xyL<n2> (n2=5-8) in total, one from each set, are selected. The selected two terminals xyL<n1> and xyL<n2> are further reduced to one by the address signals A<1:2>. When either of the address signals A<1:2> becomes 'H', either of two terminals xyL<n1:

n2> is selected. Thus, 1:8 decoding is executed such that the terminal xyBL is connected to any one of eight terminals xyL<1:8>.

A decision signal, shrt, is used to decide if a short fault is present or not in eight selection lines handled by the SL drv circuit block in charge. At the initial step in FLA, all SL drv circuit blocks are non-selected so that eight terminals xyL<1:8> are all provided with the non-access line potential U<2>. At that time, the decision signal, shrt, is used to decide the presence/absence of a short fault. The decision signal, shrt, is a signal for monitoring the potential on a supply node common to eight terminals xyL<1:8>. If a short fault occurs in a selection line or a memory cell connected to that selection line, an excess current flows in a terminal xyL<1:8> connected thereto. In this case, the resistance of a switch transistor M1 connected to each terminal xyL<1:8> contained in the SL drv circuit block causes a large voltage drop, which is utilized to create the decision signal, shrt.

A circuit for monitoring to decide the presence/absence of a short fault is described later.

Next, a layout example of the SL drv circuit block is described.

Figure 16:
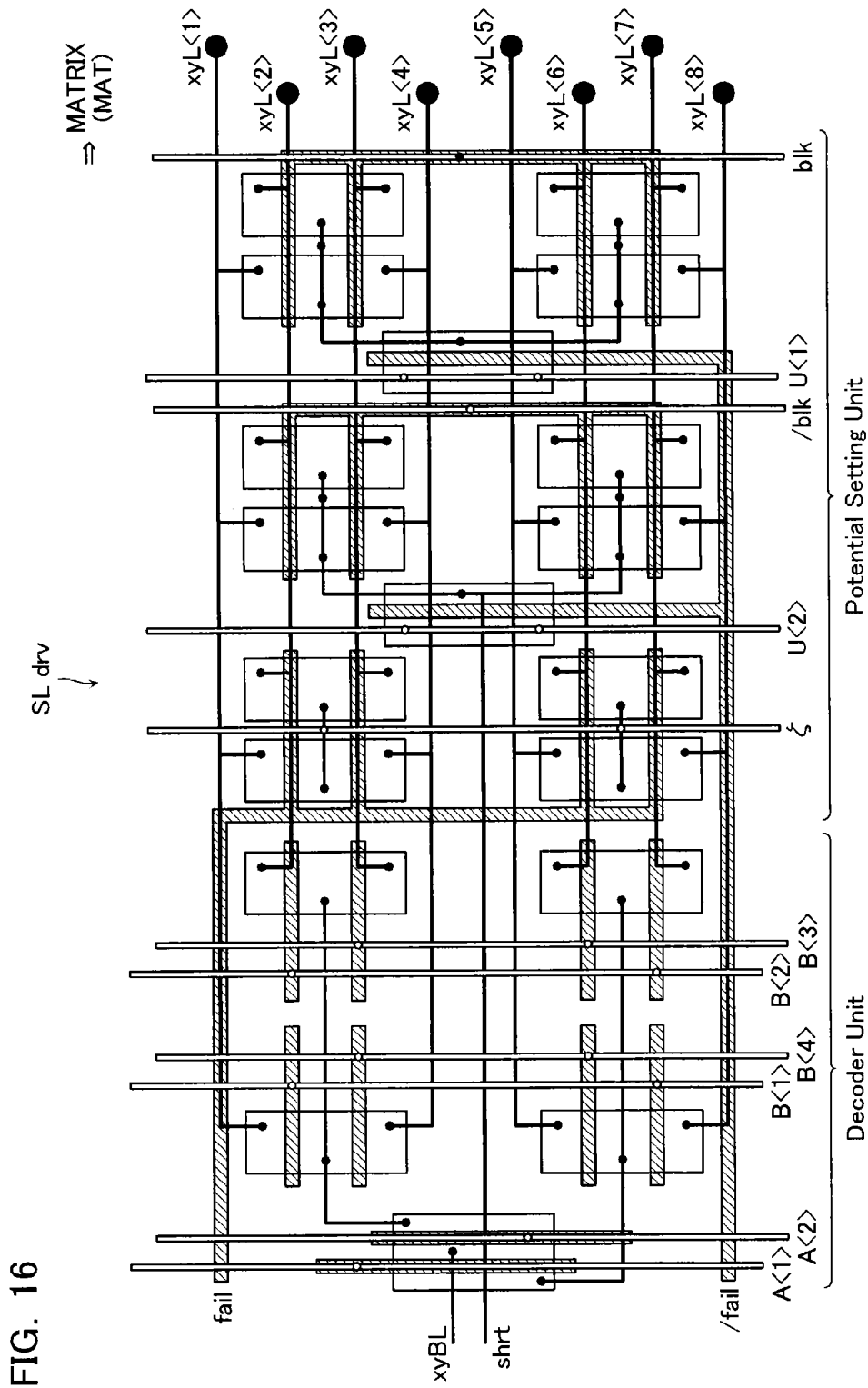
FIG. 16 is a diagram showing a layout of the SL dry circuit block in the same memory block.

FIG. 16 is a diagram showing a layout of the SL dry circuit block according to the present embodiment. This figure shows a topological connecting configuration.

When the SL drv circuit block is laid out, a problem occurs about how to reduce the width of a transistor circuit relative to the arrangement of connection nodes (large black circles in the figure) between eight selection lines vertically extending down from the MATRIX on the right side in the figure and eight terminals xyL<1:8> in the SL drv circuit block.

The SL drv circuit block is roughly divided into a potential setting unit and a decoder unit in layout. The potential setting unit contains a portion operative to set the access line potential U<1>, the non-access line potential U<2> and the fault line potential $\zeta$ exclusively on selection lines. The decoder unit contains a portion operative to select one of eight terminals xyL<1:8> based on the address signals A<1:2> and B<1:4> and connect the selected terminal xyL<n> (n=1-8) to the terminal xyBL.

The meshed configuration in FIG. 16 indicates a polysilicon part, which serves as transistor gates and lines. In addition, black lines mainly extending laterally in the figure indicate a wiring metal layer in the lowermost layer, and small black circles show contacts with a diffused layer. Outlined thick lines extending vertically in the figure indicate supply lines and address signal lines, and outlined circles show contacts.

Next, the SL blk circuit block is described.

The above-described SL drv circuit block is a circuit of the minimum unit for control of selection lines. The SL blk circuit block includes, in addition to the SL drv circuit block, a fault detector unit operative to automatically detect a fault to control redundancy. It is a circuit of the minimum unit for control of redundancy.

Figure 17:
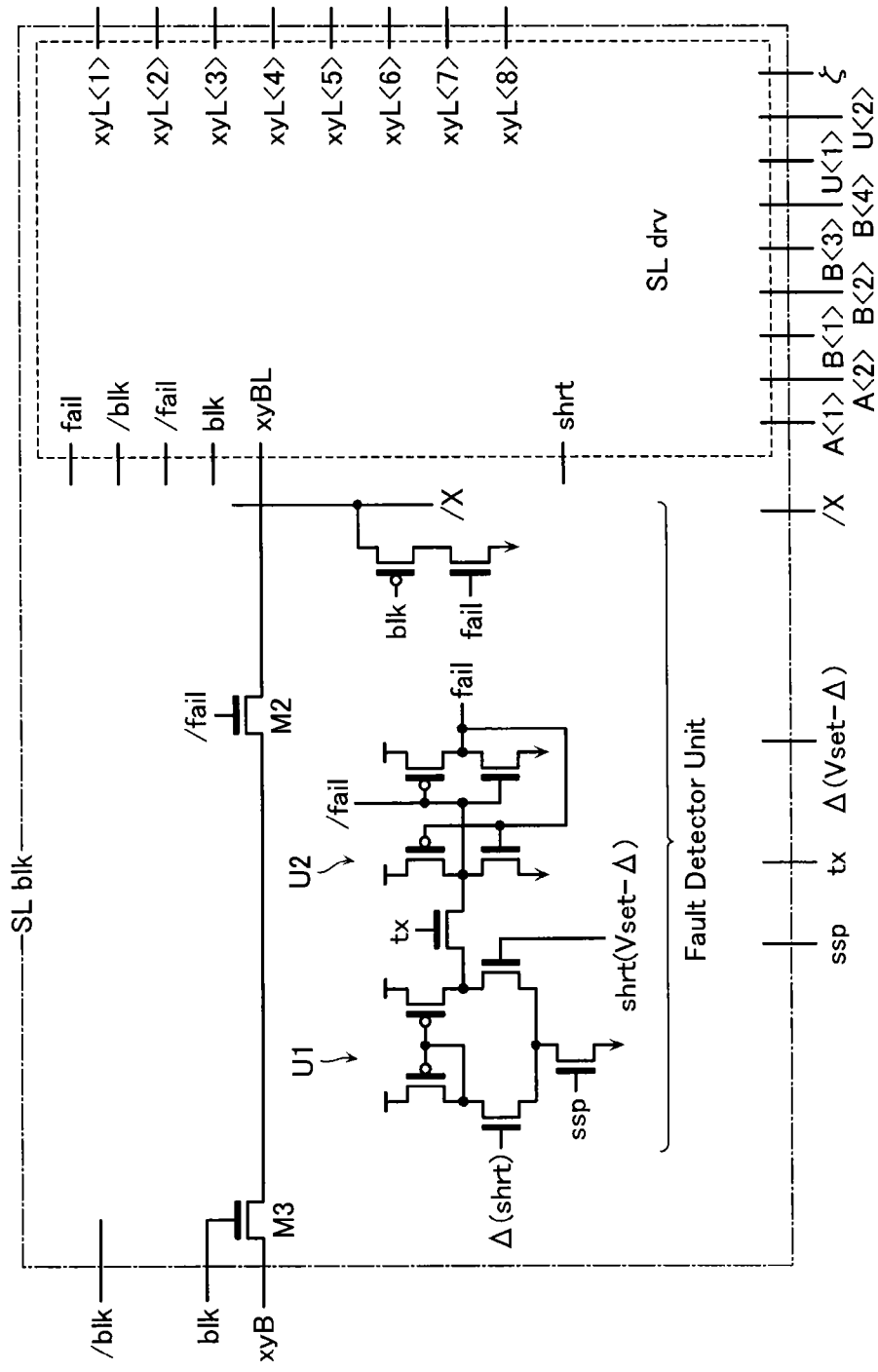
FIG. 17 is a circuit diagram of an SL blk circuit block in the same memory block.

FIG. 17 is a circuit diagram of the SL blk circuit block in the memory block according to the present embodiment. The values used in the SL blk circuit block of word lines WL are indicated in ( ).

The fault detector unit is a circuit operative to sense the level of the decision signal, shrt, to raise the control signal, fail, when it receives the decision signal, shrt, from the SL drv circuit block. The fault detector unit includes a fault detector circuit composed of a differential amplifier circuit U1 of the current mirror type and a latch circuit U2.

The reference potential in the differential amplifier circuit U1 is required when the initial step in FLA is executed. At the initial step, the bit line BL is provided with a non-access line potential U<2>=$\Delta$ and the word line WL with a non-access line potential U<2>=Vset-$\Delta$. In addition, the potential on the word line WL is set higher than the potential on the bit line BL. Therefore, the reference potential in the differential amplifier circuit U1 is set to the potential $\Delta$ in the SL blk circuit block of bit lines BL and to the potential Vset-$\Delta$ in the SL blk circuit block of word lines WL. When a short fault occurs in a selection line or a memory cell MC, the decision signal, shrt, becomes higher than the potential $\Delta$ in the SL blk circuit block of bit lines BL and lower than the potential Vset-$\Delta$ in the SL blk circuit block of word lines WL. The SL blk circuit block of bit lines BL and the SL blk circuit block of word lines WL use a similar circuit to create the control signal, fail, from the decision signal, shrt, detected at the fault detector unit. Therefore, the input of the differential amplifier circuit U1 is switched between the SL blk circuit block of bit lines BL and the SL blk circuit block of word lines WL. In the example of FIG. 17, the SL blk circuit block of word lines WL is designed so that the output from the differential amplifier circuit U1 becomes 'L' when a short fault occurs in a selection line or a memory cell MC. In addition, the control signal, fail, becomes the potential $\zeta$~Vset-$\Delta$. Therefore, initially, the SL blk circuit block of word lines WL detects the decision signal, shrt. If a short fault is present, then the potential on the word line WL is switched from the non-access line potential U<2> to the fault line potential $\zeta$. Subsequently, the potential switching in the SL blk circuit block of word lines WL is made invisible from the SL blk circuit block of bit lines BL. Further, the SL blk circuit block of bit lines BL detects the decision signal, shrt, to switch the potential on the bit line BL related to the short fault to the fault line potential $\zeta$. If the sequence of detecting the decision signal, shrt, by the SL blk circuit block of word lines WL and the SL blk circuit block of bit lines BL is reversed, the potential on the short fault bit line BL is viewed almost the same as the non-access line potential U<2> on the word line WL when the potential on the bit line BL is switched. Accordingly, it is made difficult to detect a short fault.

Figure 18:
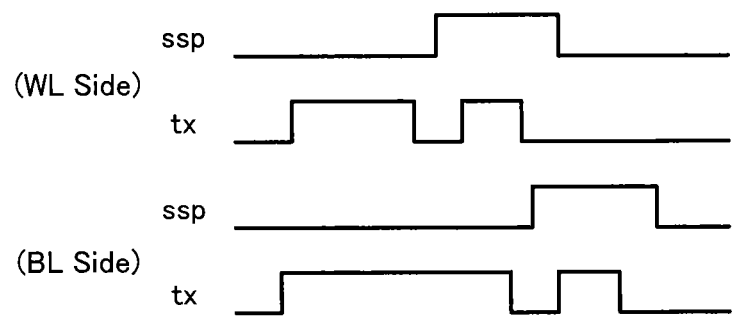
FIG. 18 is a timing chart associated with a fault detector unit in the SL blk circuit block in the same memory block.

FIG. 18 is a timing chart associated with the fault detector unit in the SL blk circuit block in the memory block according to the present embodiment.

The differential amplifier circuit U1 in the fault detector unit is activated by a control signal, ssp, and the differential amplifier circuit U1 provides a high voltage corresponding to 'H' during the control signal, ssp='L'. This voltage plays a role in initial setting of a latch circuit U2 in the next stage. Therefore, while the control signal, ssp, is at 'L', a control signal, tx, given to the transfer transistor M1 provided between the differential amplifier circuit U1 and the latch circuit U2 is turned to 'H' to initialize the latch circuit U2, and then the control signal, tx, is turned again to 'L'. Once the control signal, ssp, turns to 'H' to determine the application of the differential amplifier circuit U1 indicative of the state of the fault, an 'H' pulse is given as the control signal, tx, to open the transfer transistor M1 to hold the state of the fault in the latch circuit U2. This provides the control signals, fail and/fail. As shown in FIG. 18, initially, the state of the fault is latched at the latch circuit U2 in the SL blk circuit block of word lines WL. Thereafter, the state of the fault is latched at the latch circuit U2 in the SL blk circuit block of bit lines BL.

When the SL blk circuit block is selected, the SL blk circuit block generates an error signal/X indicative of the presence/absence of a fault and sends it to an SSL blk circuit block ready for spare selection lines and having the same configuration as that of the SL blk circuit block. The signal line of the error signal/X is precharged to 'H' and it discharges based on the value of AND of the selection signal, blk, for the SL blk circuit block and the control signal, fail, indicative of the presence/absence of a fault, thereby turning the error signal/X to 'L' to indicate the presence of a fault.

The terminal xyBL of the SL blk circuit block is connected to a data line xyB via a transfer transistor M2 controlled by the control signal/fail and a transfer transistor M3 controlled by the selection signal, blk.

Next, the SL group circuit block is described. The SL group circuit block is a circuit composed of eight SL blk circuit blocks.

Figure 19:
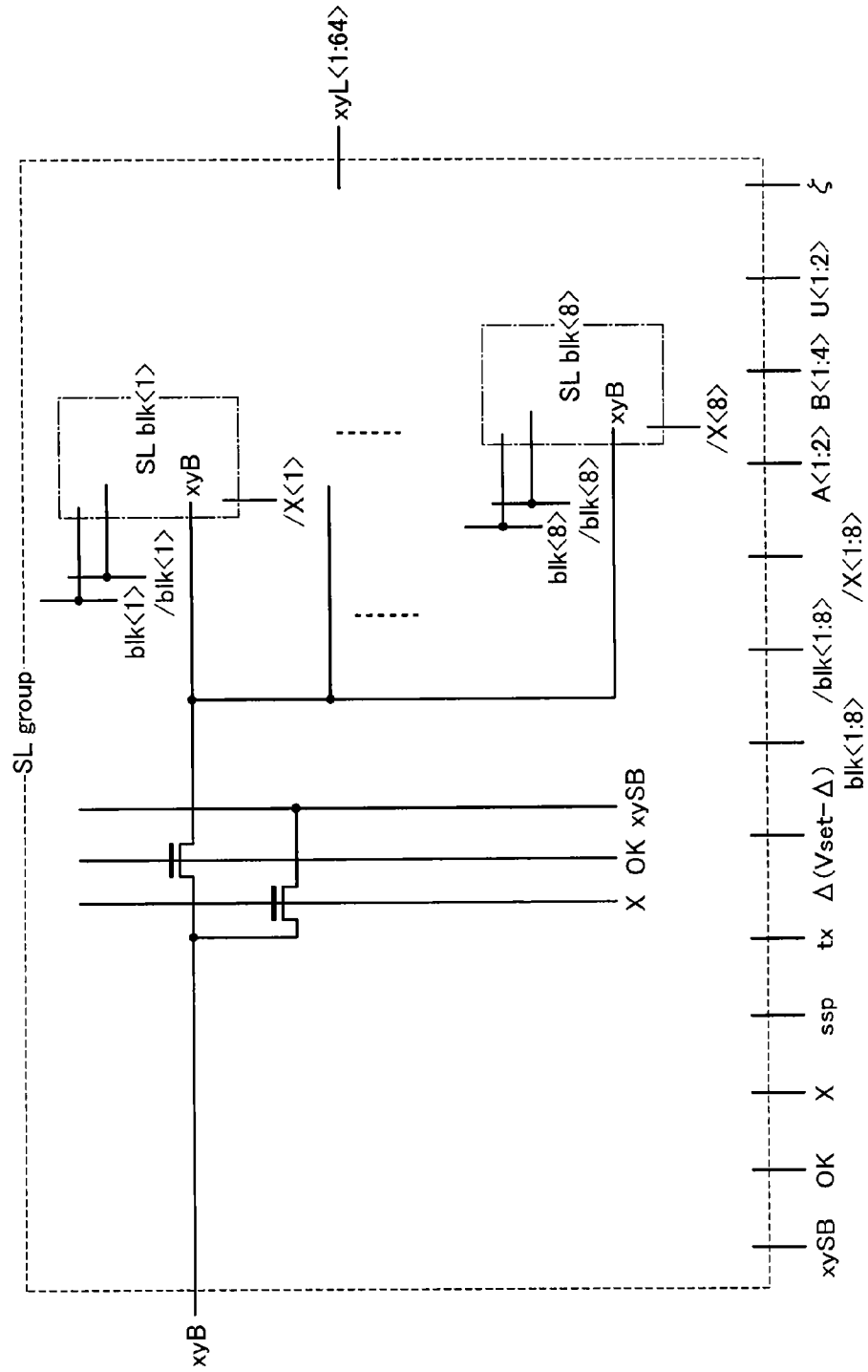
FIG. 19 is a diagram showing a configuration of an SL group circuit block in the same memory block.

FIG. 19 is a circuit diagram of the SL group circuit block in the memory block according to the present embodiment.

The data lines xyB led out of eight SL blk circuit blocks are all connected in common. If a selected SL blk circuit block has no fault, the data line xyB is led out to the external as it is. If a selected SL blk circuit block has a fault, on the other hand, any one of error signals/X<1:8> for the corresponding SL blk circuit block turns to 'L'. It is connected to a spare selection line corresponding to this SL group circuit block. An error signal X from the SSL group circuit block having the same configuration as that of the SL group circuit block is used to link the data line xyB of the SL group circuit block to a data line xySB of the SSL group circuit block.

Next, the SSL blk circuit block mentioned in the above description is described.

Figure 20:
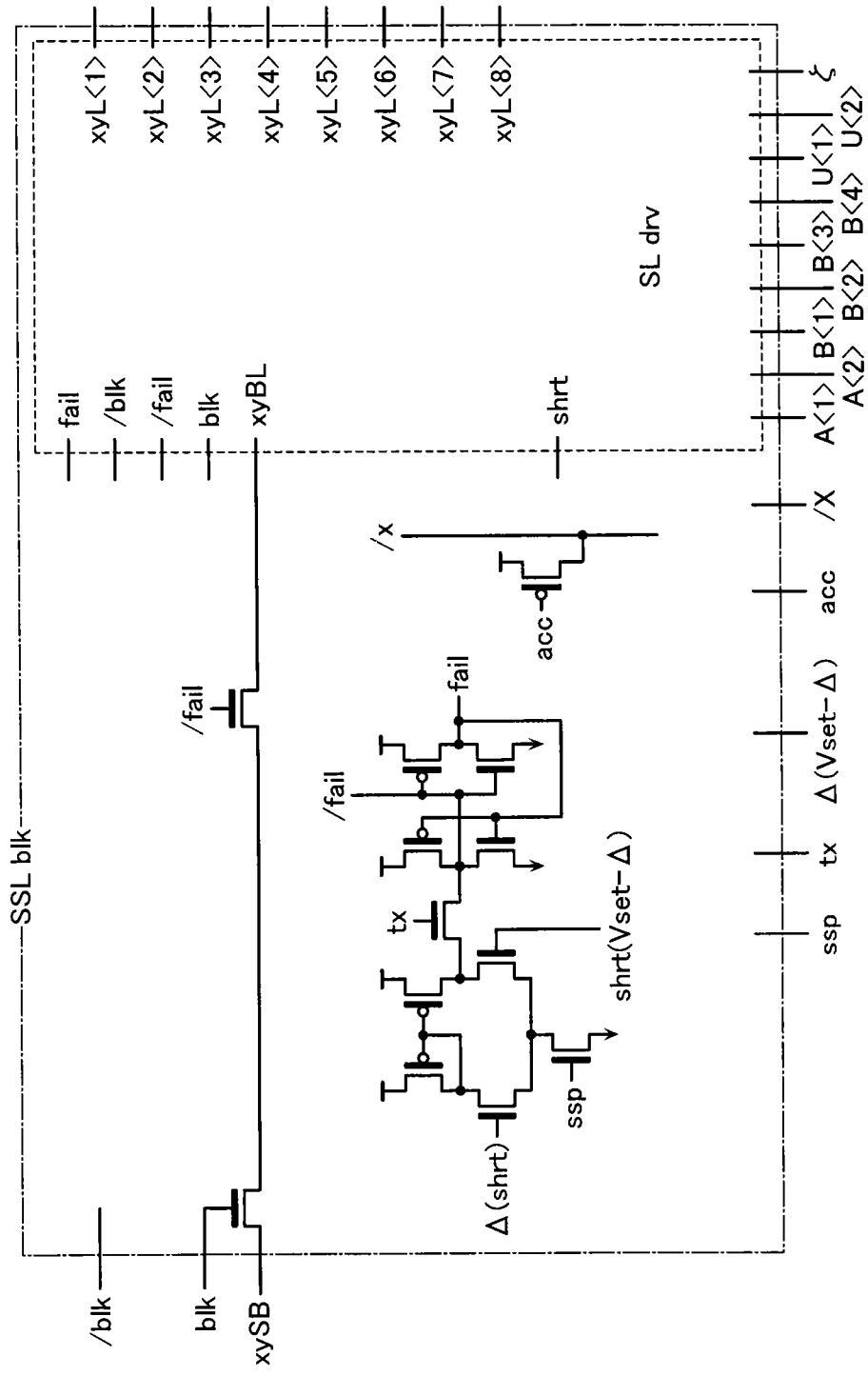
FIG. 20 is a circuit diagram of an SSL blk circuit block in the same memory block.

FIG. 20 is a circuit diagram of the SSL blk circuit block in the memory block according to the present embodiment.

The SSL blk circuit block is similar in configuration to the SL blk circuit block except the part of the error signal/X. Namely, the SSL blk circuit block also executes the short fault detection and the inactivation of the SL blk circuit block to eliminate the influence of a short fault in FLA. If the spare memory cell area corresponding to the SSL blk circuit block has a fault, it cannot be used as redundancy.

If no fault exists, the SSL blk circuit block sends data to the common data line xySB always when the selection signal, blk, for the SL blk circuit block rises. If a fault exists, on the other hand, it is not linked to the external data line xySB. The initial setting of the error signal/X indicative of a fault is executed in this SSL blk circuit block. When the control signal, acc, for determining the start of an access cycle rises, precharging the signal line of the error signal/X stops. If a fault exists in another SL blk circuit block, discharging the signal line of the error signal/X is prepared.

The control signal, acc, indicates the decoding period for data transfer from the standby step to the active step in FLA.

Next, the SSL group circuit block is described.

Figure 21:
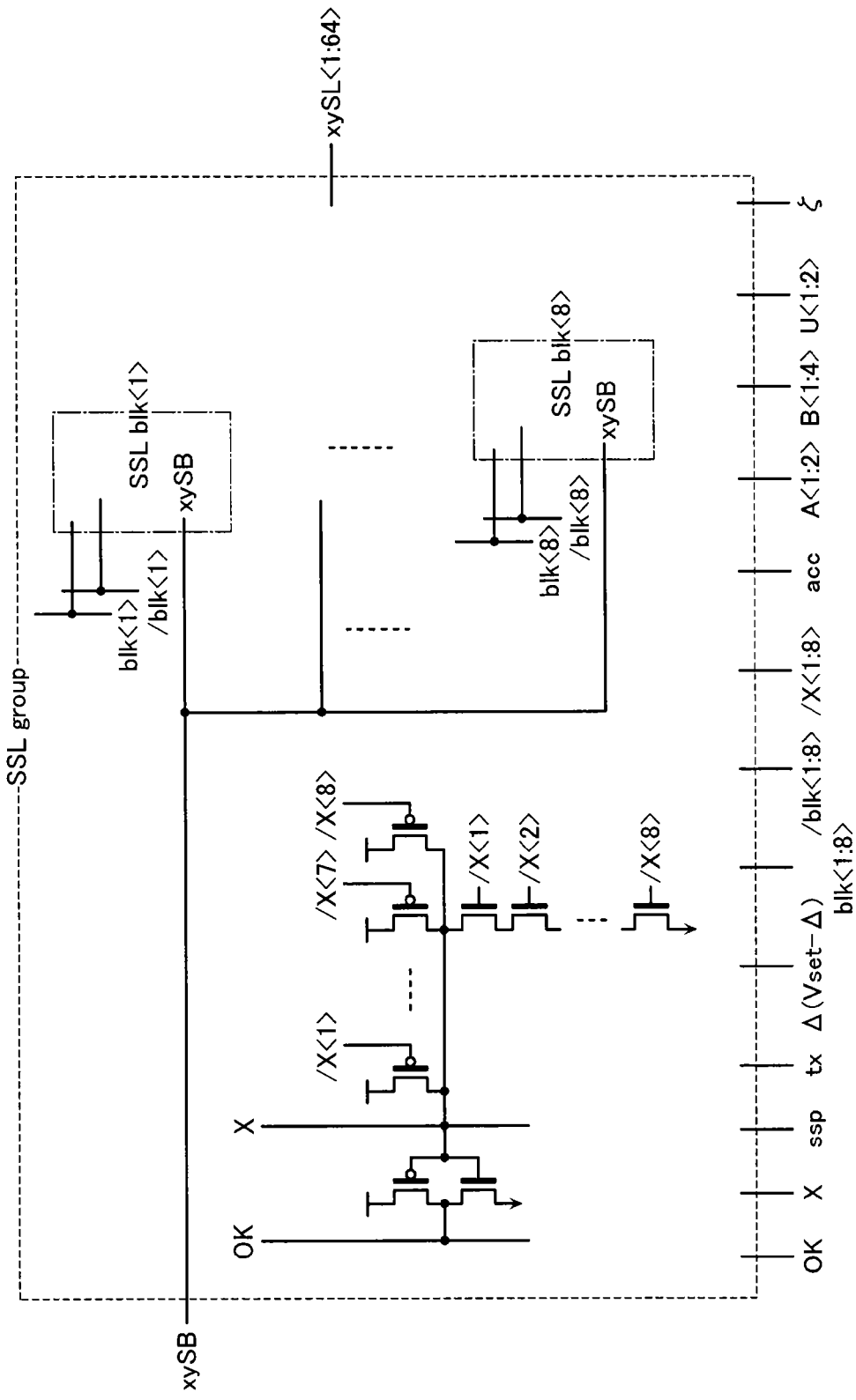
FIG. 21 is a diagram showing a configuration of the SSL group circuit block in the same memory block.

FIG. 21 is a circuit diagram of the SSL group circuit block in the memory block according to the present embodiment.

Similar to the SL group circuit block, the SSL group circuit block includes eight SSL blk circuit blocks. Data lines xySB<n> (n=1-8) from eight SSL blk circuit blocks are turned into a common data line xySB.

This SSL group circuit block creates an error signal X indicative of the use or disuse of redundancy, and a normal signal OK opposite in logic to the error signal X. The selection lines of eight common error signals/X<1:8> in the SL blk circuit block contained in each SL group circuit block are led to NAND to create the error signal X and the normal signal OK.

Next, the spare unit is described. As described above, the spare unit is a set of SL groups having one SSL group as redundancy. The bit line spare unit, subl, differs in configuration from the word line spare unit, suwl. The configurations of these bit line spare unit, subl, and word line spare unit, suwl, are herein described in detail.

Figure 22:
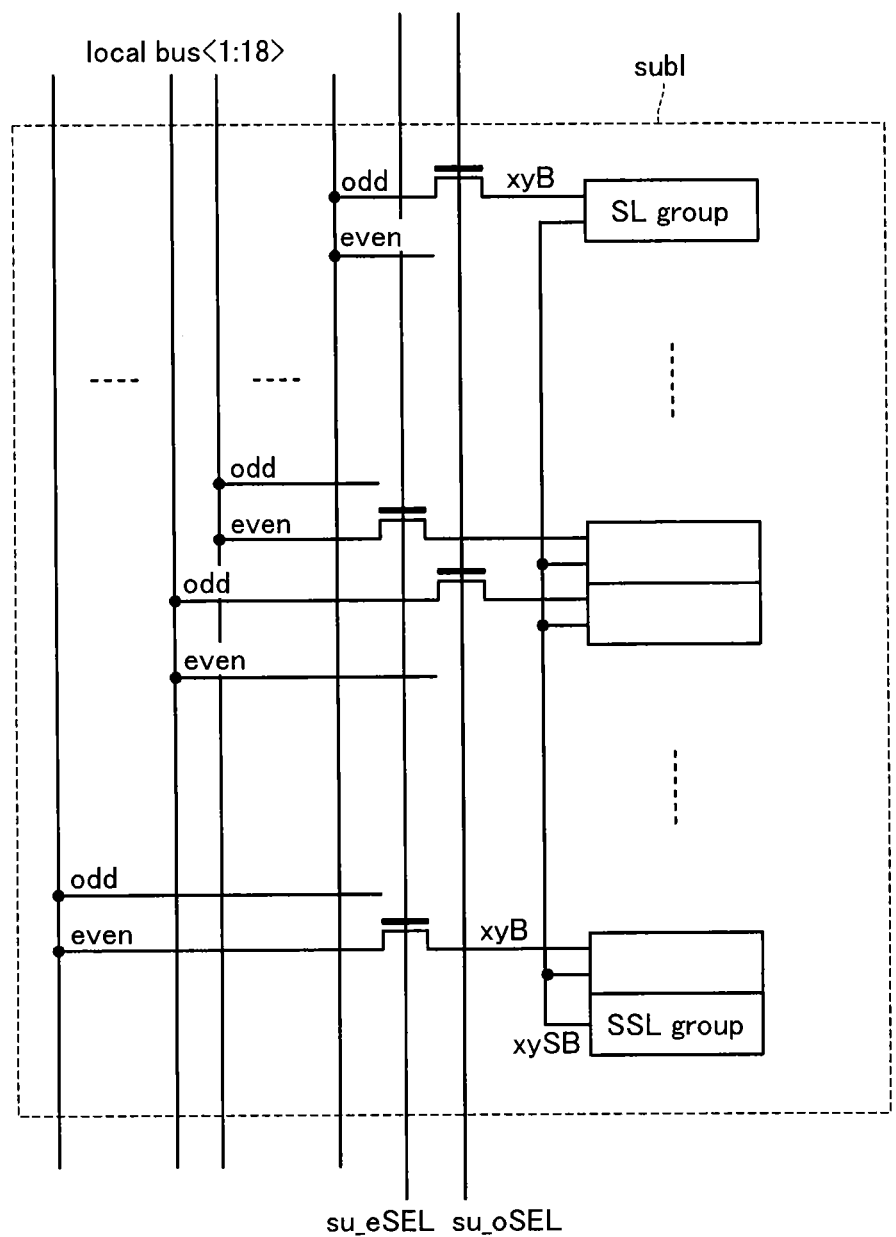
FIG. 22 is a diagram showing a configuration of a bit line spare unit in the same memory block.

FIG. 22 is a circuit diagram of the bit line spare unit, subl, in the memory block according to the present embodiment.

The bit line spare unit, subl, includes 36 SL group circuit blocks, and one SSL group circuit block prepared for 36 SL group circuit blocks, 37 in total. 36 SL group circuit blocks are divided into 18 odd-aligned SL group circuit blocks (hereinafter referred to as "odd SL group circuit blocks") and 18 even-aligned SL group circuit blocks (hereinafter referred to as "even SL group circuit blocks"). 18 local buses <1:18> are connected in common to odd SL group circuit blocks and even SL group circuit blocks. The selection of odd SL group circuit blocks or the selection of even SL group circuit blocks is determined by selection signals, su_oSEL and su_eSEL. The data line xySB led out of the SSL group circuit block is connected to all of 36 SL group circuit blocks.

The memory block includes the above-configured bit line spare units, subl, arranged on the left and right sides of the MAT. A single MAT stores 36 bits of data. In addition, 64×2 bit lines BL including the bit lines BL extending from the left and right sides of the MAT are collected at the SL group circuit block. In a word, the bit line spare unit, subl, includes 64×2×36=4608 bit lines BL and 128 spare bit lines BL. A single bit line spare unit, subl, is possible to make a 36-bit parallel simultaneous access via a total of 36 local buses arranged on the left and right sides of the MAT. In the present embodiment, a bit line BL adjacent to the access bit line BL is surely determined as a non-access bit line BL. In addition, to eliminate the coupling-caused influence exerted on FLA, the selections of the bit line spare units, subl, on the opposing left and right sides of the MAT are made different from each other.

Figure 23:
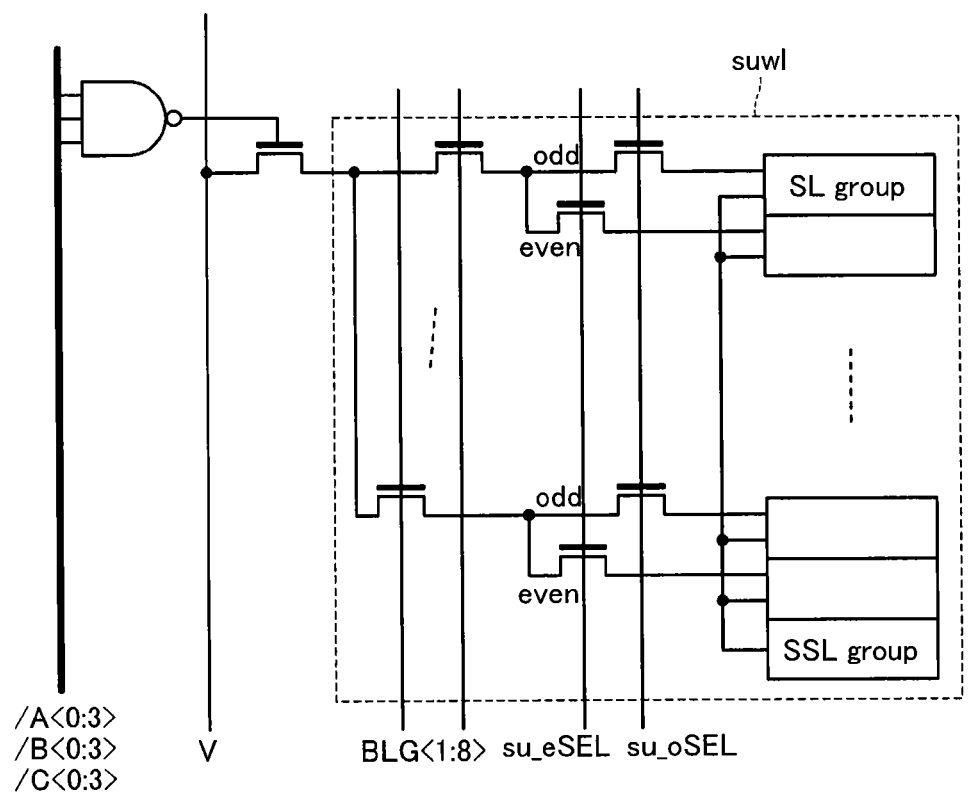
FIG. 23 is a diagram showing a configuration of a word line spare unit in the same memory block.

FIG. 23 is a circuit diagram of the word line spare unit, suwl, in the memory block according to the present embodiment.

The word line spare unit, suwl, includes 16 SL group circuit blocks, and one SSL group circuit block prepared for 16 SL group circuit blocks, 17 in total. 16 SL group circuit blocks are divided into eight odd SL group circuit blocks and eight even SL group circuit blocks. Selection lines of eight selection signals BLG<1:8> are connected to odd SL group circuit blocks and even SL group circuit blocks in common. The selection signal BLG is used to select any one of 8 sets of SL group circuit blocks commonly connected to the signal line of one selection signal BLG. The selection of odd SL group circuit blocks and the selection of even SL group circuit blocks are determined by selection signals, su_oSEL and su_eSEL.

The memory block includes the above-configured word line spare units, suwl, arranged on the upper and lower sides of the MAT. The word line spare unit, suwl, includes 2048 (=64×2×16) word lines WL and 128 spare word lines BL in which one word line WL is selected from the MAT. The selection of one word line spare unit, suwl, requires, for example, decoding by NAND of address signals/A<0:3>, /B<0:3> and/C<0:3> each composed of four signals, and selecting one of 64 word line spare units, suwl, arranged on the upper or lower side of the MAT. Further, either of the upper and lower sides of the MAT is selected and, to make access to one word line WL from the MAT, this word line WL is connected to the supply potential V.

The following description is given to a connecting configuration of the bit line spare unit, subl, to the MAT.

Figure 24:
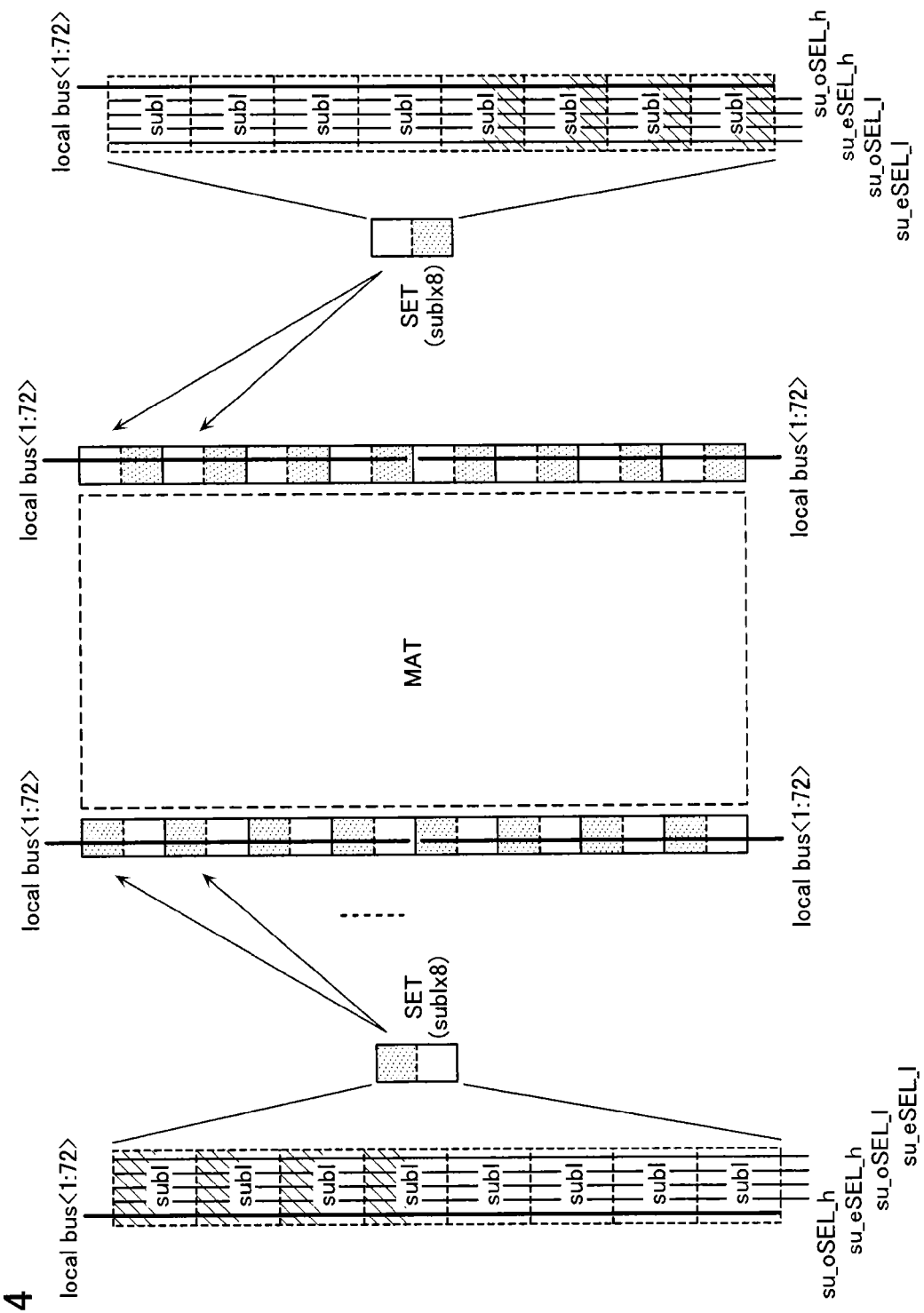
FIG. 24 is a diagram showing a connecting configuration of the bit line spare unit to the MAT in the same memory block.

FIG. 24 is a diagram showing a connecting configuration of the bit line spare unit, subl, to the MAT in the memory block according to the present embodiment.

Sets of eight bit line spare units, subl, that is, bit line SETs are aligned eight by eight on the left and right sides of the MAT. The bit line spare units, subl, aligned on one side transfer 72 bits of data via 72 local buses <1:72>. 72 local buses <1:72> are used by four bit line spare units, subl, on the upper side and those on the lower side of the MAT in common. 18 data lines xyB are led out of the bit line SET and accordingly four bit line spare units, subl, are selected in each bit line SET. In the example shown in FIG. 24, four bit line spare units, subl, on the upper side and four bit line spare units, subl, on the lower side are grouped within the bit line SET. They are distinguished from each other by providing the selection signal su_eSEL with '_h' as for the upper side and '_l' as for the lower side. In addition, as for the selection of either of the upper and lower sides in the bit line SET, the selected one is shown dot-patterned. Further, the bit line spare unit, subl, is divided into a set of odd SL groups and a set of even SL groups. When either set is selected, 18 SL groups belonging to that set are selected. In FIG. 24, the upper half of the bit line spare unit, subl, is hatched when the set of odd SL groups is selected, and the lower half of the bit line spare unit, subl, is hatched when the set of even SL groups is selected. In the example shown in FIG. 24, the set of odd SL groups is selected. FIG. 24 shows an example in which the selection signal su_oSEL_h is selected for the left side of the MAT and the selection signal su_oSEL_l is selected for the right side of the MAT. In the case of the use of FLA, bit lines BL in each MAT are accessed as uniform as possible. For the purpose of smoothening fluctuations in potentials in the MAT, selections of the odd SL group and even SL group are made identical on the left and right sides of the MAT. Then, it is determined if either four on the upper side or four on the lower side are selected from the bit line spare units, subl, in the bit line SET.

The data lines xyB are led out 72 by 72 from the upper and lower left sides and the upper and lower right sides of the MAT, thereby transferring a total of 288 (=72×4=144×2) bits in parallel. In a word, in the example shown in FIG. 24, 144 bits of data configure a 2-bit error correctable BCH code. Therefore, it is possible to realize parallel data transfer of 288 bits capable of correcting 2 bits randomly at every 144 bits.

Not limited to the above configuration, in order to achieve much faster access and increase the number of error-correctable bits, the same consideration as the configuration shown in FIG. 24 can be applied to change the method of selecting memory cells and the size of parallel transferable data as well.

The following description is given to a connecting configuration of the word line spare unit, suwl, to the MAT.

Figure 25:
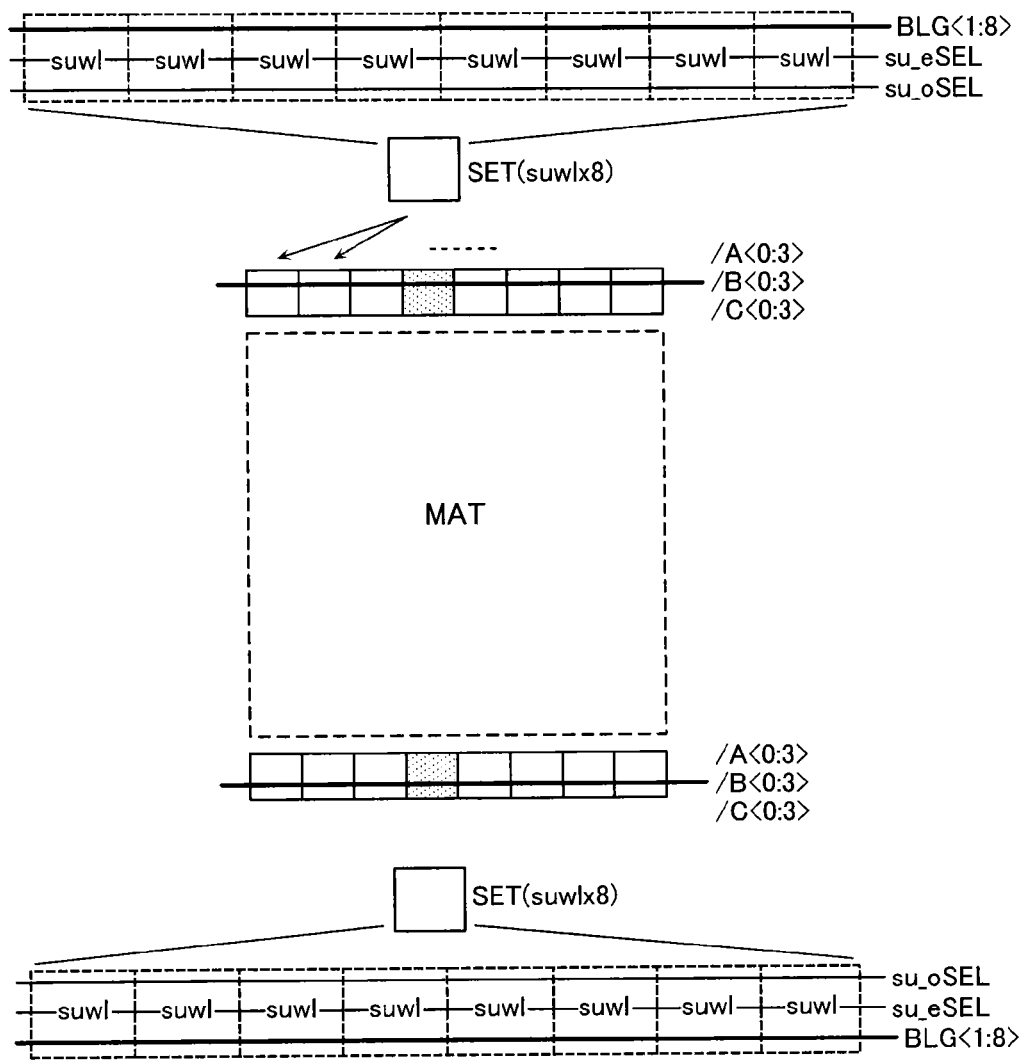
FIG. 25 is a diagram showing a connecting configuration of the word line spare unit to the MAT in the same memory block.

FIG. 25 is a diagram showing a connecting configuration of the word line spare unit, suwl, to the MAT in the memory block according to the present embodiment.

The word line spare unit, suwl, includes 16 SL group circuit blocks. These 16 SL group circuit blocks are divided into a set of eight odd SL group circuit blocks and a set of eight even SL group circuit blocks. The selection of either set of SL group circuit blocks is determined by selection signals, su_oSEL and su_eSEL. These selection signals su_oSEL and su_eSEL are supplied to 16 SL group circuit blocks in common. Further, eight selection signals BLG<1:8> are used to determine which pair of SL group circuit blocks should be selected. The selection signals BLG<1:8> are supplied to the word line spare units, suwl, in common.

Eight word line SETs are arranged on each of the upper and lower sides of the MAT. One word line spare unit, suwl, is selected from the word line SETs on the upper and lower sides of the MAT. In a word, one of 64 (=8×8) word line spare unit, suwl, is selected. The word line SET is selected only from one side. In the case of FIG. 25, one of the word line spare units, suwl, located on the upper side is selected and it is dot-patterned. The selection of 64 word line spare units, suwl, is determined by three address signals /A<0:3>, /B<0:3> and/ C<0:3> each composed of four signals. The address signals/ A-/C are used to select one word line WL from the MAT.

The configuration of the MAT and associates peripheral circuits is described above. A MATRIX including MATs stacked is referred to as a TILE. The following description is given to a specific example of a chip configured with TILEs.

The memory block herein described can realize a band width of data transfer equivalent to or higher than that of the NAND flash memory in 2010s. Namely, it realizes access operation at a data transfer rate of 16 M bytes/s equivalent to that of the NAND flash memory. In addition, this memory block includes a three-dimensionally structured cell array having a storage capacity of 1 T bits. Further, the MAT has an access cycle of 8 μs, which provides sufficient time for program and ECC computing.

Figure 26:
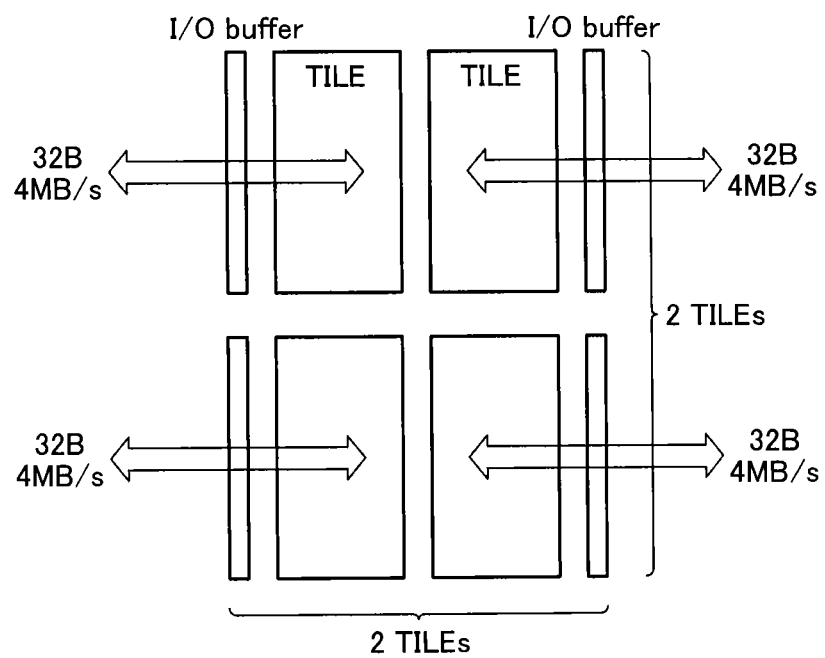
FIG. 26 is a diagram illustrative of an arrangement of TILEs in the same memory block.

FIG. 26 is a diagram illustrative of an arrangement of TILEs in the memory block according to the present embodiment. The TILE has a storage capacity of 0.25 T bytes each.

A single TILE transfers 256 bits, that is, 32 bytes of data in parallel. This can be executed at every 8 μs. Accordingly, the transfer rate of data reaches 4 M bytes/s. In consideration of the transfer rate per TILE, four TILEs are aligned as shown in FIG. 26 to achieve a desired performance, and these four TILEs can be accessed almost in parallel to realize a transfer rate of 16 M bytes/s four times the transfer rate per TILE. As access at every TILE is almost independent, data accesses at every 32 bytes can be made to four TILEs in parallel simultaneously by memory interleaving. Therefore, when new data is given, the first access time tAC becomes 8 μs.

If the band width is extended, for example, to 32 M bytes/s, the bus width in the chip is changed from 144×2 bits to 144×4 bits and the ECC system is doubled. In this case, parallel data transferring of 64 bytes per TILE can be achieved.

In this connection, when a 20 nm-pitch cell array of the cross point type is used, the chip size of the memory block reaches about 140 mm$^2$ in the configuration of four TILEs shown in FIG. 26.

If the chip size of the memory block is allowed to extend, the number of selection lines per MAT can be almost halved as a practical range to configure the memory block with 16 TILEs. If the number of TILEs is increased any more, the characteristic of the memory cell according to the present embodiment cannot be exploited sufficiently from the viewpoint of the share held by memory cells MC and so forth.

In the case of the above-described MATRIX, ECC can be applied to improve the memory cell characteristic of an individual chip. In addition, an initial fault memory cell MC and so forth can be inactivated by setting the potentials on the selection lines, and then redundancy-replaced by a spare memory cell MC and so forth in a normal spare memory cell area provided in each MATRIX.

The memory block according to the present embodiment has been described above. The following description is given to an example of the configuration of a P(peta)-bit scale memory system including this memory block.

Figure 27:
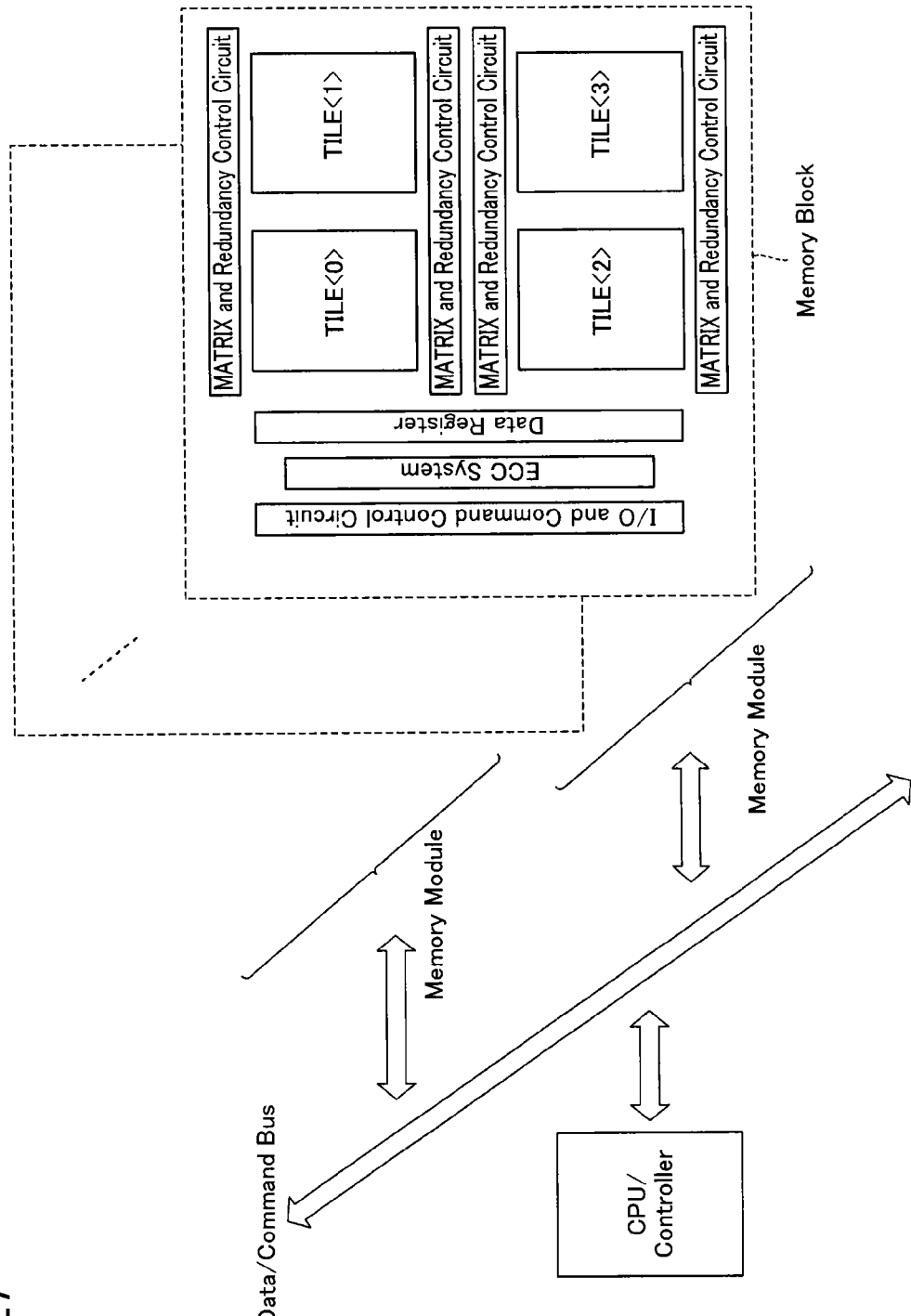
FIG. 27 is a diagram illustrative of a configuration of the same memory system.

FIG. 27 is a diagram illustrative of a configuration example of the memory system according to the present embodiment.

This memory system includes plural memory modules each composed of plural memory blocks. Each memory block includes four TILEs<1:4> arranged in the upper, lower, left and right portions in the figure. The TILE is an area section of memory cells in the chip capable of functioning as the minimum unit of access control, independent of other areas. The memory block includes the configuration shown in FIG. 1 and additionally includes a MATRIX and redundancy control circuit operative to control access operation to MATRIX and associated redundancy of MATRIX, a data register operative to temporarily hold data of MATRIX, an ECC system operative to detect and correct errors in data of MATRIX, and an I/O and command control circuit operative to control the input/output of data of MATRIX and commands required for access to MATRIX.

The memory system communicates various signals and data with a data/command bus directly from a CPU or via a control circuit. The memory module including plural memory blocks is a unit of linking to the data/command bus. Individual memory blocks control ECC and redundancy in accordance with the characteristic of the memory cell. In addition, the memory module can hold data nonvolatilely even after isolated from the system and stored. Thus, the memory system is possible to change the memory module and make access to a new memory module.

As above, the present embodiment makes it possible to reduce the power consumption because of the use of FLA. In addition, each memory block is configured with MATs of the cross point type and accordingly the process steps can be simplified. Further, the redundancy replacement by the spare memory cell area makes it possible to provide a memory system having a nice characteristic of data retention.

[Second Embodiment]

A second embodiment describes an example of modified access operation to peripheral circuits and memory cells MC in a MAT. Hereinafter, the different points from the first embodiment are mainly described.

First, a description is given to a layout of an SL drv circuit block according to the second embodiment.

The layout pitch of selection lines is the minimum design dimension. Accordingly, the use of MATs of the cross point type exerts extremely strict restrictions on the layout of transistors for driving selection lines. Therefore, such a layout of the SL drv circuit block as the following example is effective.

Figure 28:
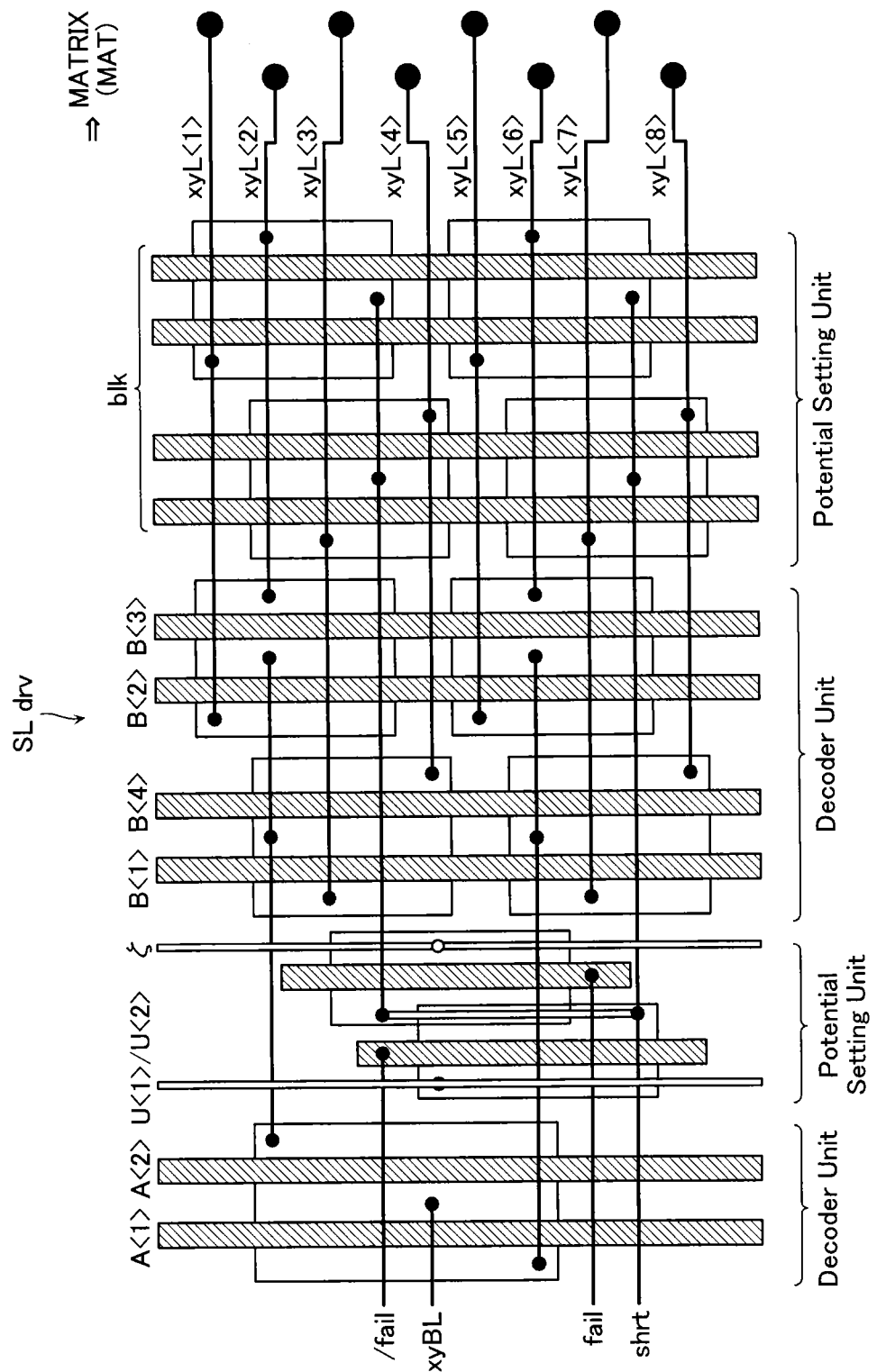
FIG. 28 is a diagram showing a layout of an SL dry circuit block in a memory block in a memory system according to the second embodiment.

FIG. 28 is a diagram showing a layout of the SL drv circuit block in the memory block according to the present embodiment. The expressions in FIG. 28 are conformed to FIG. 16.

The SL drv circuit block is possible to include 10 lines extending in the same direction as 16 selection lines on a MAT. In addition, gates of transistors are formed at the right angles to selection lines to ensure a required number of transistors. If the number of required transistors increases, the arrangement area of the SL drv circuit block extends. When gates of transistors are formed at the right angles to selection lines and extended in parallel with the side of the MAT, it is denied in layout that required transistors cannot be ensured.

The most important point in simplifying the configuration of the selection line block inner driver is a reduction in the maximum value of the number of signal lines formed in the direction of selection lines extending within the SL drv circuit block, which is equal to 10 in the example shown in FIG. 28. The following description is given to access operation to peripheral circuits and memory cells MC in the MAT for achieving that number of signal lines.

Next, the circuitry of the SL drv circuit block is described.

Figure 29:
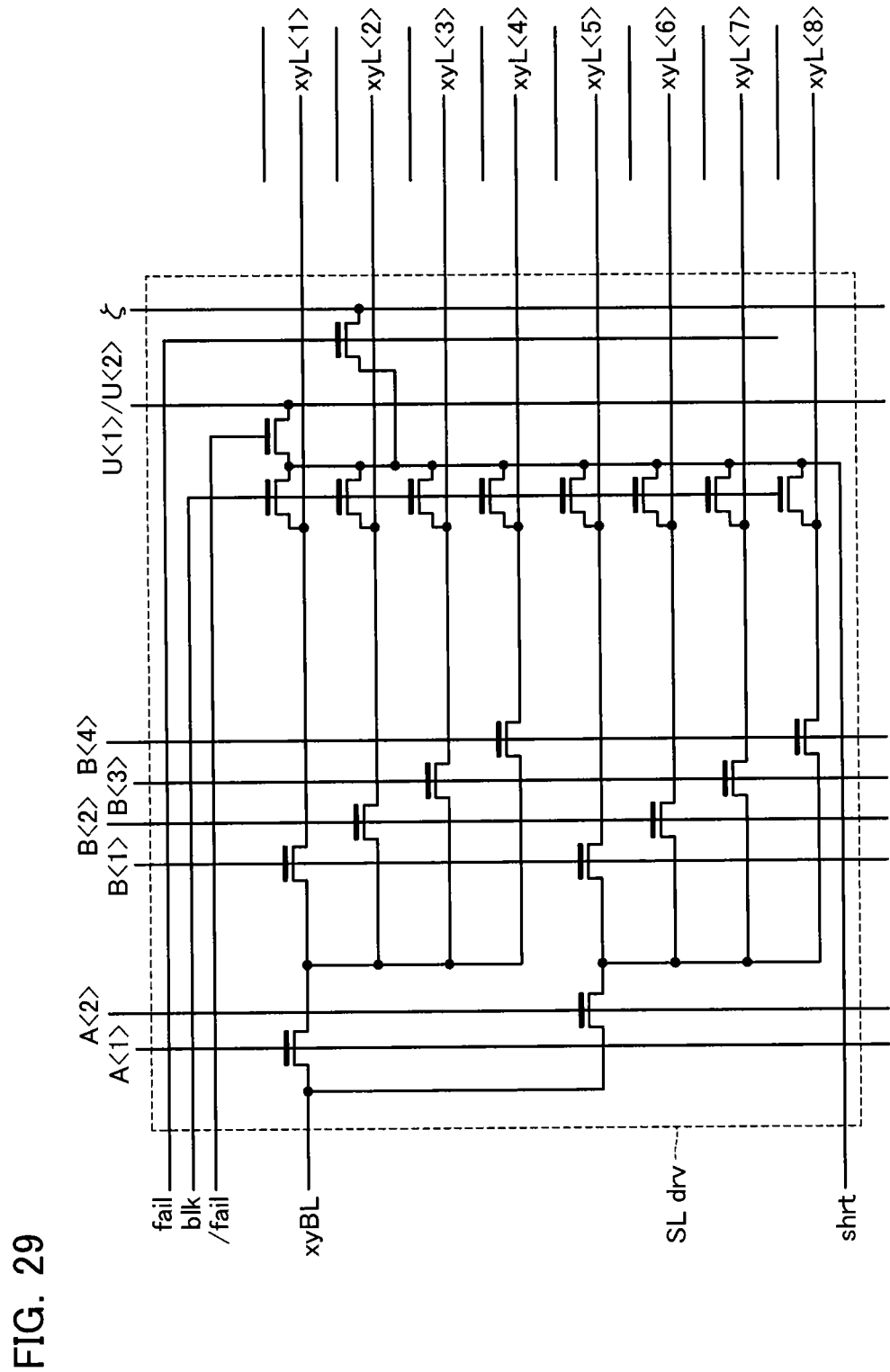
FIG. 29 is a circuit diagram of the SL drv circuit block in the same memory block.

FIG. 29 is a circuit diagram of the SL drv circuit block contained in the selection line block inner driver in the memory block according to the present embodiment.

A simplified configuration of the selection line block inner driver requires as large a reduction in potential setting in the SL drv circuit block as possible. The memory cell MC of the cross point type requires, as short fault measures, the fault line potential $\zeta$ supplied to paired selection lines, and further requires a set potential for achieving the floating state. The set potential for achieving the floating state differs from the access line potential U<1> in the case of access and from the non-access line potential U<2> in the case of non-access. A thought is required to achieve just one type of potential setting in the SL drv circuit block. Two types of potentials, the access line potential U<1> and the non-access line potential U<2>, are required for the reason that, even if the coupling between adjacent selection lines fluctuates the potential on a non-access selection line adjacent to the access-targeted selection line, a non-access memory cell MC can be prevented from changing the state to cause disturbance.

By the way, plural selection lines are alternately driven from the opposite sides of the MAT. Therefore, a non-access selection line adjacent to the access selection line can be provided with a potential by a driver block located on the side opposite to the access side. In the present embodiment, this situation is utilized for setting potentials on selection lines.

Initially, only a driver block located on one side of the MAT makes access, and a driver block located on the opposite side makes no access. In the case of FLA, potential setting at the time of non-access only requires the non-access line potential U<2>. The potential set from the selection line block located on the opposite side is utilized for shielding an adjacent selection line. At this time, setting potentials on selection lines by the driver block located on the access side can be executed through the following two methods.

The first method is a method of fixing the potential set by FLA at every one side of the MAT. Namely, at the standby step, the potential on the selection line driven by the driver block located on the access side is set to the access line potential U<1>, and the potential on the selection line driven by the driver block located on the opposite side is set to the non-access line potential U<2>. Once the control enters the active step, in the driver block located on the access side, only the selection line block inner driver operative to drive the access-targeted selection line is turned on while other selection line block inner drivers are turned off to bring non-access selection lines into the floating state of the access potential U<1>. In addition, the driver block located on the opposite side maintains the potential on the selection line at the non-access line potential U<2> for awhile to temporarily exert the shield of the fixed potential, and then brings the potential on the selection line into the floating state to suppress disturbance caused by non-access memory cells MC. In the case of the first method, at the active step, the non-access line potential U<2> becomes the fixed potential temporarily. Therefore, a short-through current instantaneously flows between the access selection line and the non-access line potential U<2>, though, there is a large suppressing effect exerted on the disturbance caused by memory cells MC.

The second method is a method of setting potentials on selection lines in two stages by the driver block located on the access side. Namely, at the standby step, all selection lines driven by the driver block located on the access side are provided with the non-access line potential U<2>, and all selection lines driven by the driver block located on the opposite side are provided with the non-access line potential U<2>. Further, on the access side of the MAT, in the second half of the standby step, only the selection line block inner driver for driving the access selection line with the selection signal, blk, is kept on, and other selection line block inner drivers are turned off to provide non-access selection lines with the access line potential U<1>. At this time, as all selection lines driven by the driver block located on the opposite side are provided with the non-access line potential U<2>, they serve as a shield against adjacent selection lines. As a result, in setting the access line potential U<1> on the access selection line, no disturbance occurs. Thereafter, once the control enters the active step, selection line block inner drivers for driving non-access selection lines provided with the non-access line potential U<2> are turned off, including those on the access side and the opposite side of the MAT, to bring non-access selection lines into the floating state and provide the access selection line with the access line potential U<1>. In the case of this method, a disturbance may occur in the floating potential at the active step, though, the influence thereof is not so large as to cause failed transitions in non-access memory cells MC. With this regard, the second method is referred to as a method of utilizing the characteristic of FLA utmost.

If the memory cell MC makes no transition of the state unless a voltage near 10 V is applied, the reliability of transfer transistors in the SL drv circuit block causes a problem. Therefore, the following description is given to an SL drv circuit block using transfer transistors capable of maintaining the reliability and enduring high voltages.

Figure 30:
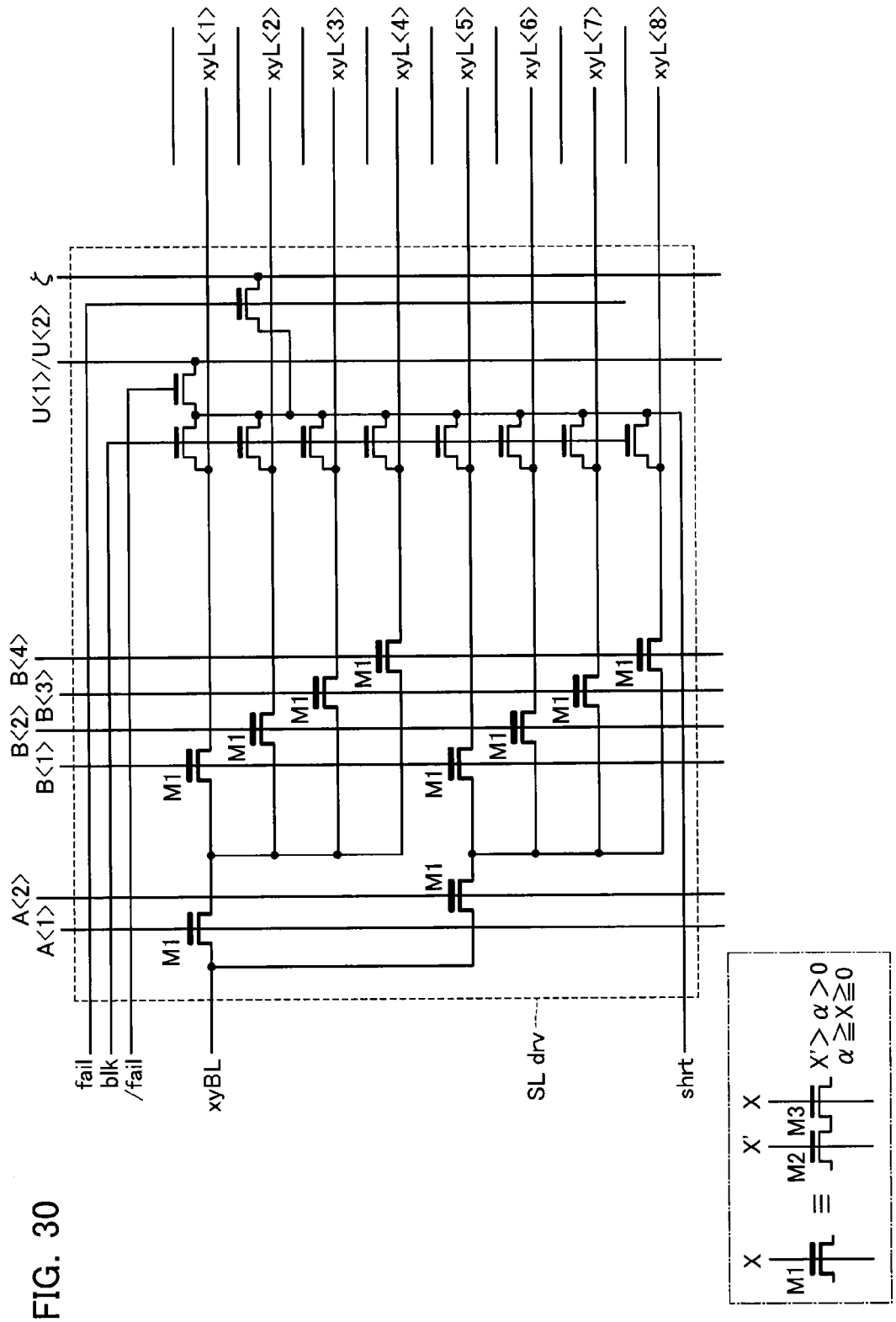
FIG. 30 is a circuit diagram of the SL drv circuit block in the same memory block.

FIG. 30 is a circuit diagram of an SL drv circuit block contained in the selection line block inner driver in the memory block according to the present embodiment.

A transfer transistor M1 shown by a thick line in the figure has a drain provided with a high voltage and a gate supplied with a transistor off voltage as shown in a figure surrounded by a chain line. In this case, for the purpose of preventing the application of the maximum voltage, two transfer transistors M2 and M3 are connected in series to boost the gate potential X', on the transfer transistor M2 located closer to the high voltage, up to a breakdown-voltage tolerable extent, for example, around a floating level, +Vth, and lower the gate potential X, on the transfer transistor M3 located closer to the source, down to a much lower ground potential Vss to cut off the current path. Thus, the threshold voltage Vth of the transistor is utilized to reduce the voltage burdens on the serially connected transfer transistors M2 and M3.

In this case, the area required for the layout increases, and setting of the gate potentials X and X' becomes complicated. Even if a high voltage is required for the state transition of the memory cell MC, though, it is possible to realize a highly reliable operation of the SL dry circuit block.

The following description is given to a procedure of potential setting in the case of access made only from one side of the MAT. An example is herein described in changing the memory cell MC to the set state.

FIGS. 31-34 are diagrams showing bias states of the cell array in FLA in the memory block according to the present embodiment. In FIGS. 31-34, the x-marked memory cell MCd is an accessed cell or is possibly a short fault memory cell. In addition, the potential set on each selection line is indicated in ( ). If the potential set on each selection line differs from others in accordance with the presence/absence of a short fault, it is represented by "(Set potential in the absence of a short fault)/(Set potential in the presence of a short fault)".

Figure 31:
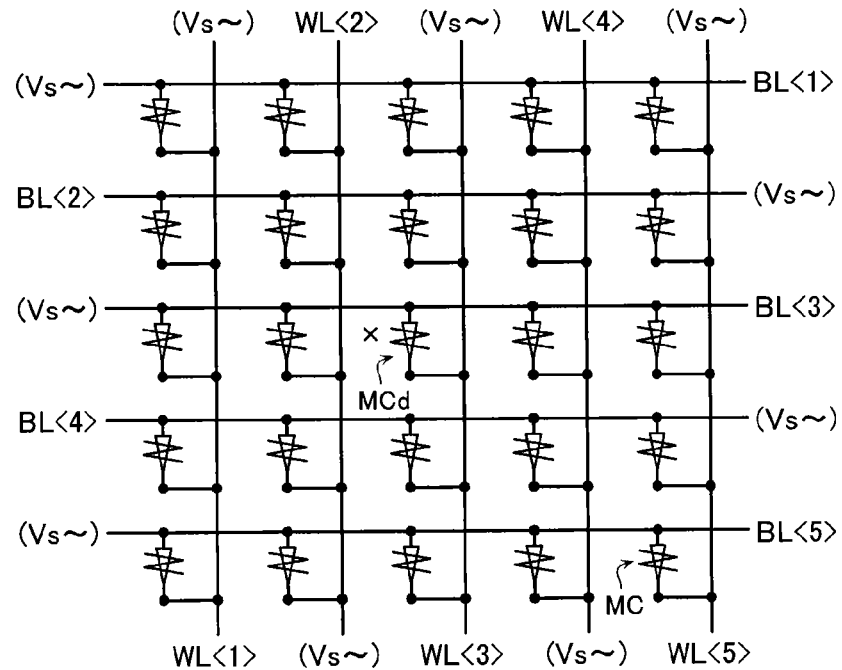
FIG. 31 is a diagram illustrative of a bias state of a cell array at the hold step in FLA in the same memory block.

Initially, at the hold step shown in FIG. 31, a potential Vs near the ground potential Vss is applied to bring all selection lines into the floating state. In this case, almost zero bias is applied to the memory cell MC so that the state of the memory cell MC is held in accordance with the retention characteristic of the memory cell MC itself.

Figure 32:
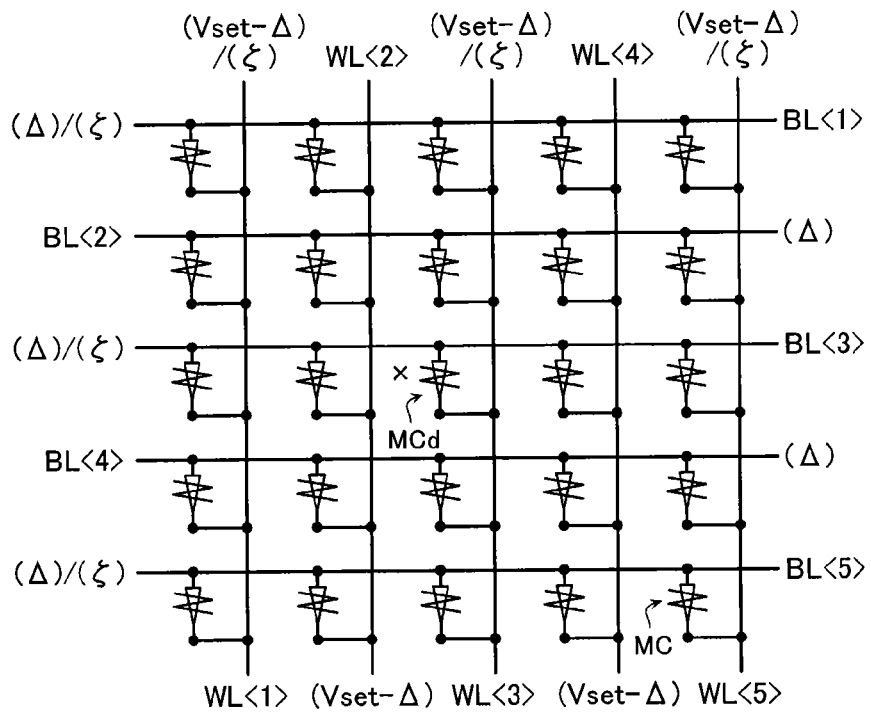
FIG. 32 is a diagram illustrative of a bias state of the cell array at the initial step in FLA in the same memory block.
Figure 33:
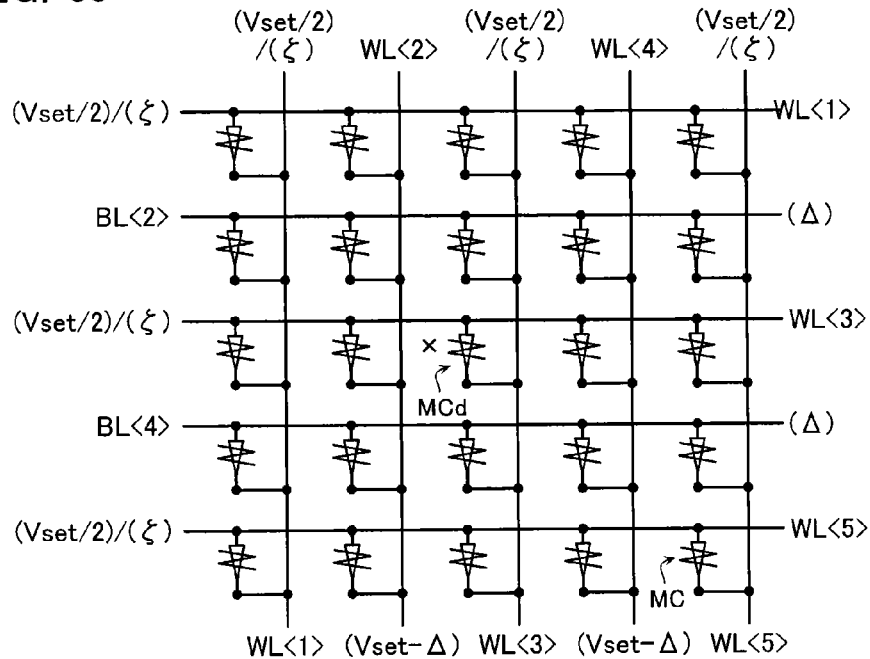
FIG. 33 is a diagram illustrative of a bias state of the cell array at the standby step in FLA in the same memory block.

Subsequently, for the purpose of beginning access to the MAT, all selection lines are provided with potentials at the initial step in unison. In a word, as shown in FIG. 32, the bit line BL is provided with a potential Δ near the dead-zone voltage of the memory cell MC and the word line WL with a potential Vset-Δ. Thus, all memory cells MC are reverse-biased with Vset-2Δ.

At the initial step, two jobs are executed to the MAT. The first job changes all memory cells MC in the set state to the weak set state to bring them into the high resistance state. Thus, the MAT includes no memory cells MC in the low resistance state. The second job detects and isolates a possible short fault memory cell MCd. When the short fault memory cell MCd is reverse-biased at the initial step, it passes a flow of considerable current from the word line WL to the bit line BL. The voltage drop caused by the current flowing in the selection line connected to the short fault memory cell MCd is used to detect a short fault. The selection line related to the detected short fault is provided with the fault line potential ζ (almost Vset-Δ). In this case, the short fault memory cell MCd cannot be biased such that no current flows therein. In FLA of the present embodiment, processing of the short fault memory cell MCd is completed up to the initial step, and the control goes to the subsequent standby step.

Subsequently, at the standby step, the first or second method described with FIG. 29 is used. In either method, the bias state of the MAT finally reaches that shown in FIG. 33.

The first method is a method of fixing the set potential in accordance with the side of the MAT on which the drivers for driving selection lines are arranged. The selection lines driven from the driver located on the access side of the MAT are provided with the potential Vset/2. As for the selection lines driven from the drivers located on the opposite side of the MAT, on the other hand, the bit lines BL are provided with the potential Δ and the word lines WL with the potential Vset-Δ. In the presence of a short fault, the selection lines driven from the same side as the selection line connected to the short fault memory cell MCd is provided with the fault line potential ζ.

The above-described second method is a method of using the driver block located on the opposite side of the MAT to provide the bit lines BL and word lines WL with the certain potentials Δ and Vset-Δ, respectively, while using the driver block located on the access side of the MAT to set potentials on selection lines, which are divided into two stages, that is, the later-described front and rear stages. In the front stage, regardless of the driver block located on the access side and the driver block located on the opposite side, the bit lines BL are provided with the potential Δ and the word lines WL with the potential Vset-Δ. In the rear stage, the driver block located on the access side is used to provide the selection lines with a new potential, that is, a potential Vset/2, and the driver block located on the opposite side is provided with the fixed potential. At this time, the potential on the non-access selection line brought into the floating state, because a selection line adjacent to that selection line is provided with the fixed potential from the driver block located on the opposite side, does not disturb under the shield effect exerted by the adjacent selection line.

Figure 34:
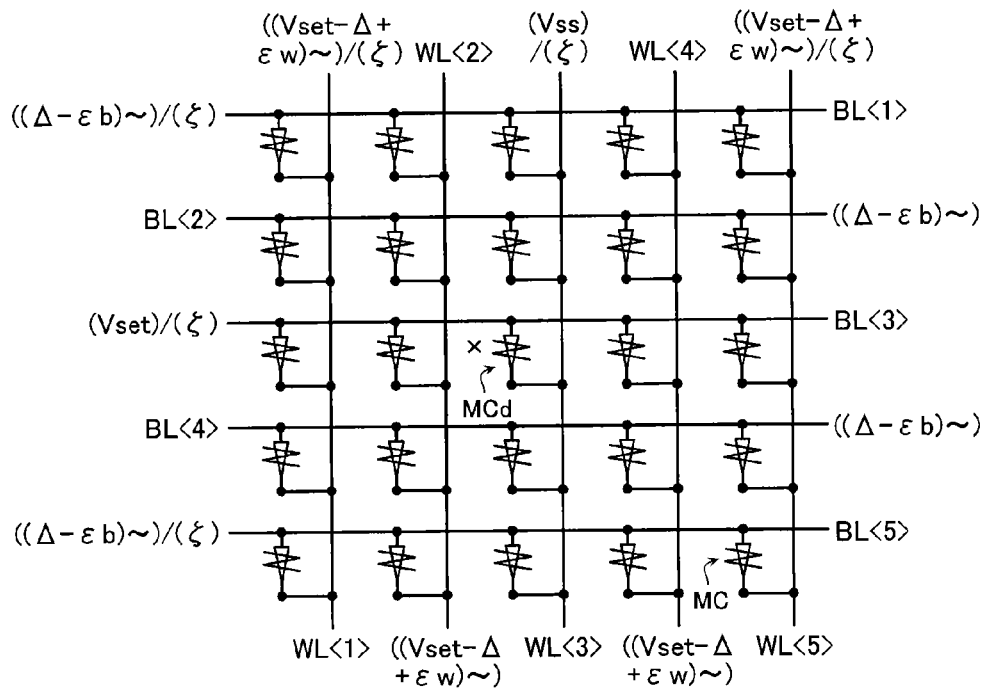
FIG. 34 is a diagram illustrative of a bias state of the cell array at the active step in FLA in the same memory block.
Figure 35:
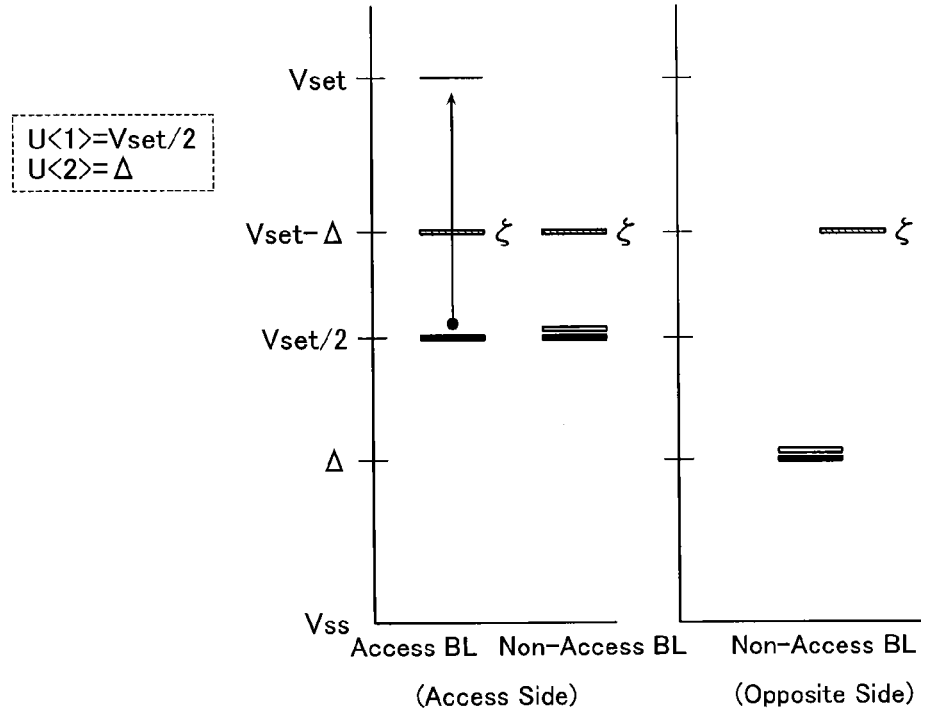
FIG. 35 is a diagram illustrative of bit line potential variations at the transition to the active step in FLA in the same memory block.
Figure 36:
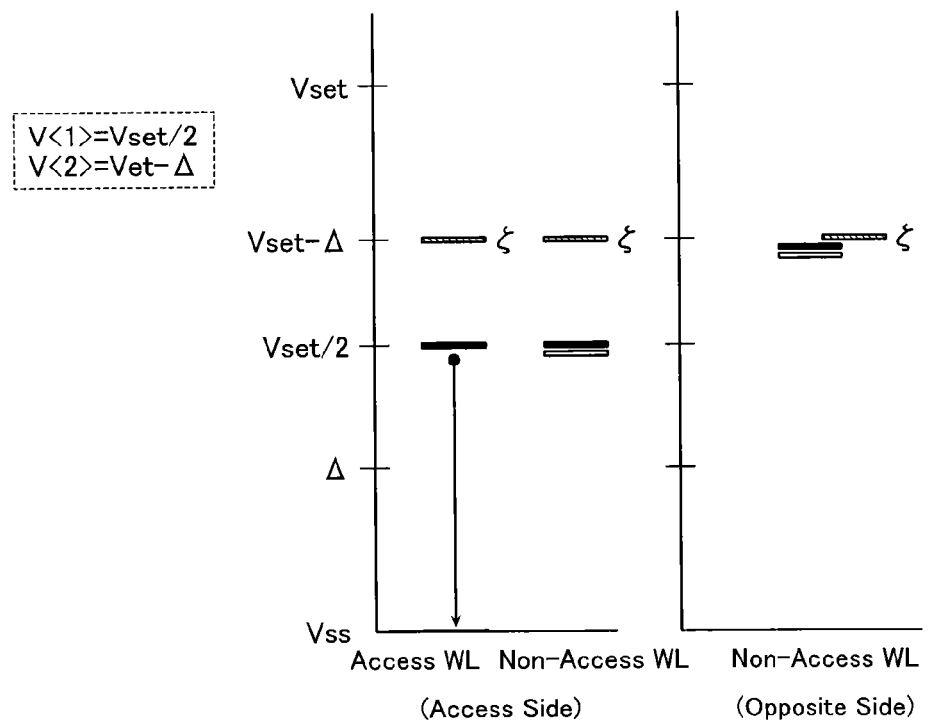
FIG. 36 is a diagram illustrative of word line potential variations at the transition to the active step in FLA in the same memory block.
Figure 37:
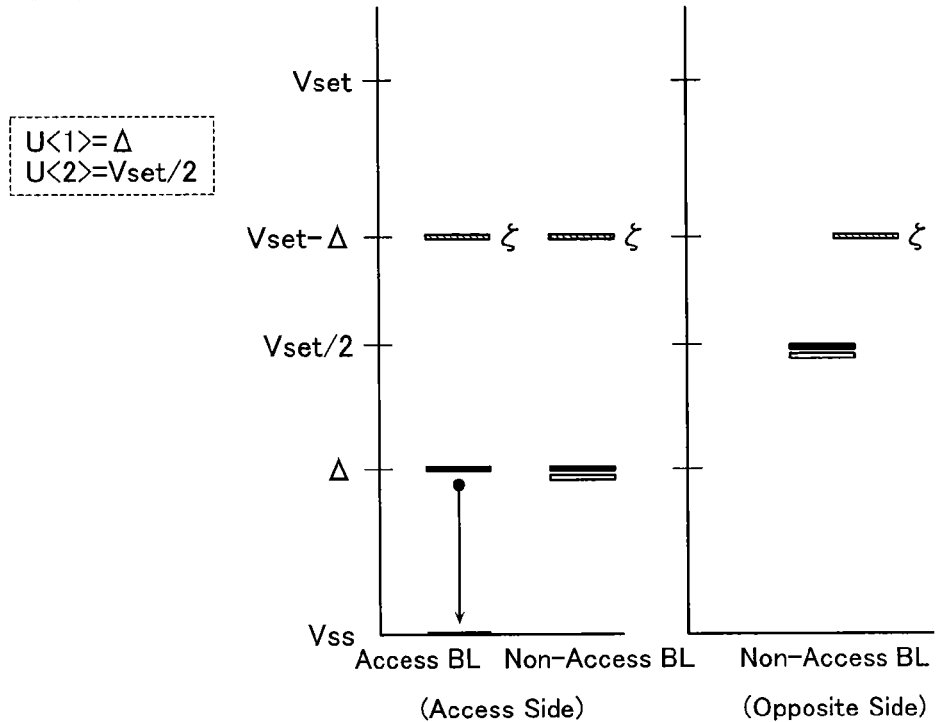
FIG. 37 is a diagram illustrative of bit line potential variations at the transition to the active step in FLA in the same memory block.
Figure 38:
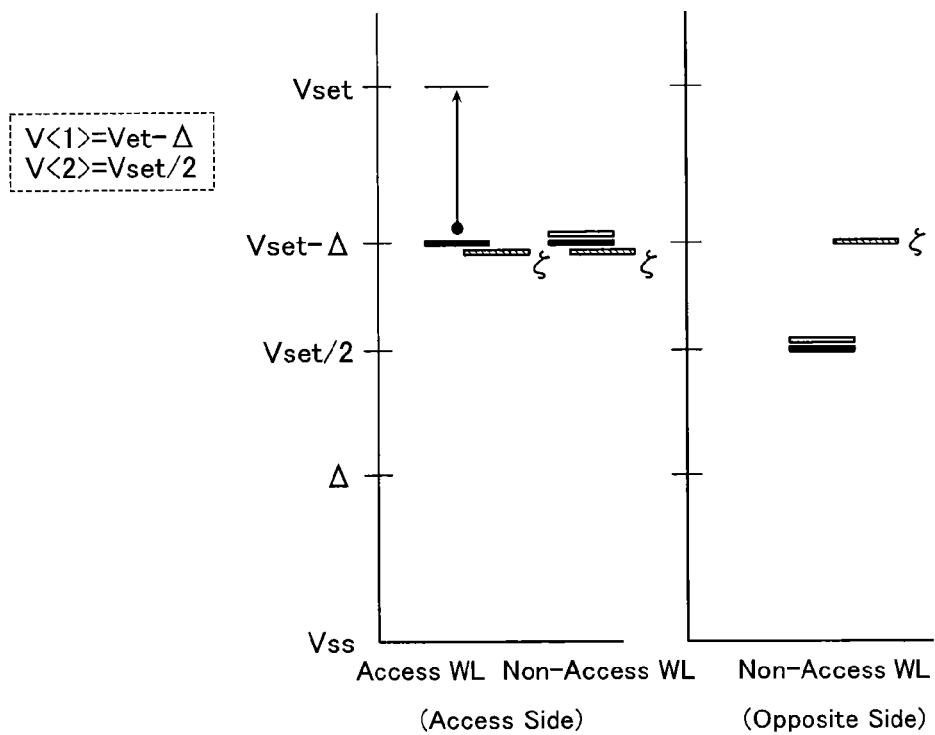
FIG. 38 is a diagram illustrative of word line potential variations at the transition to the active step in FLA in the same memory block.
Figure 39:
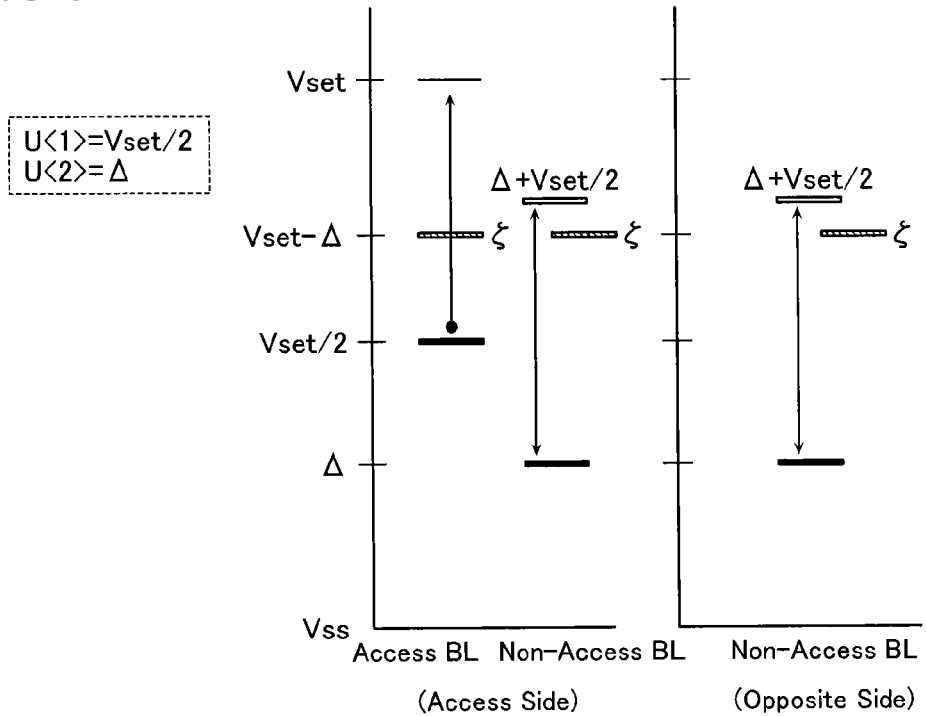
FIG. 39 is a diagram illustrative of bit line potential variations at the transition to the active step in FLA in the same memory block.
Figure 40:
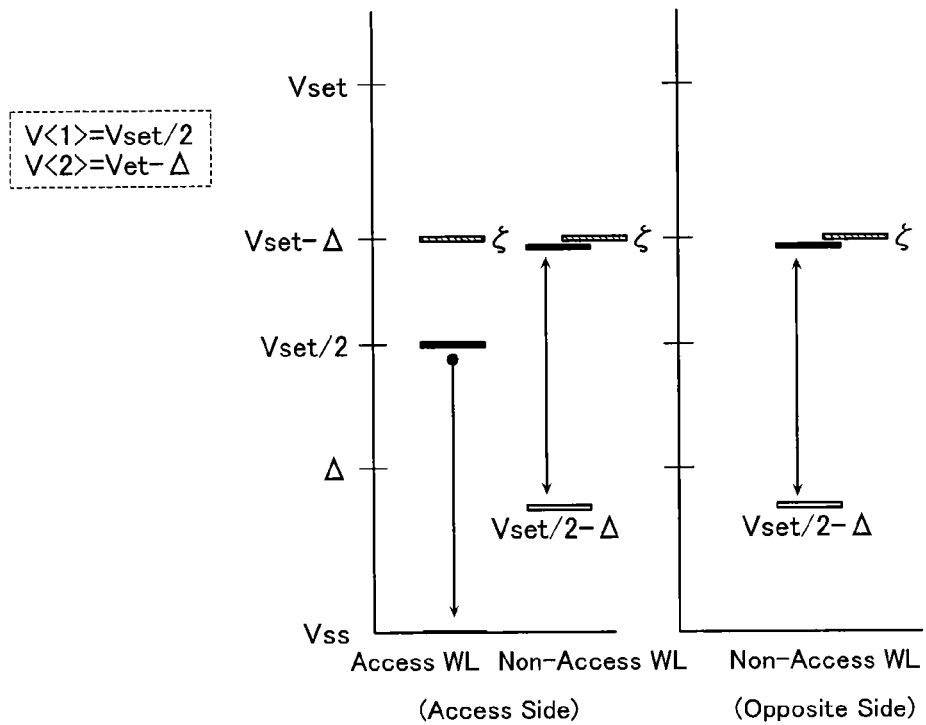
FIG. 40 is a diagram illustrative of word line potential variations at the transition to the active step in FLA in the same memory block.

Finally, at the active step, a bias state of the cell array shown in FIG. 34 is formed after passing through either of the below-described two processes.

In the first process, the access bit line BL is provided with the set potential Vset and the access word line WL with the ground potential Vss while other selection lines are brought into the floating state. At this time, the selection line block inner driver located on the opposite side of the MAT is used to hold the selection lines on the fixed potential for a slight time, and then exert the shield effect on capacitive coupling to eliminate fluctuations in potentials on the selection lines brought into the floating state by the driver block located on the access side.

In the second process, the access bit line BL is provided with the set potential Vset and the access word line WL with the ground potential Vss while other selection lines are brought into the floating state. At this time, the potential fluctuation on the access selection line disturbs a selection line adjacent to the access selection line. The adjacent selection line, though, is provided with a potential insusceptible to the influence of disturbance and accordingly no problem occurs.

At the active step after passing through the above first or second process, the potential on the bit line BL in the floating state finally settles in a potential $(\Delta-\epsilon b)\sim$ slightly lower than the potential $\Delta$ as shown in FIG. 34. In addition, the potential on the word line WL in the floating state settles in a potential $(Vset-\Delta+\epsilon w)\sim$ slightly higher than the potential $Vset-\Delta$.

The use of FLA can eliminate the short-through current between the fixed stationary potentials and accordingly provide a larger MAT. The above first process at the active step is a process in which the charge corresponding to the reduction in disturbance is viewed as the consumption current. The above second process can be considered as a process of permitting disturbance within a harmless range to further reduce the consumption current.

The following description is given to selection line potential variations at the transition to the active step in FLA at every several cases.

FIGS. 35-40 are diagrams showing selection line potential variations at the transition to the active step in FLA in the memory block according to the present embodiment. In each figure, a thick solid line indicates a potential on each selection line at the completion of the standby step. A hatched thick line indicates a reference potential, which is the fixed potential in the presence of a short fault memory cell MCd. A thin solid line indicates an access line potential supplied to the access selection line at the active step. An outlined thick line indicates a selection line potential after brought into the floating state. In each figure, access line potentials U<1>, V<1> and non-access line potentials U<2>, V<2> at the active step are surrounded by a dotted line frame.

The first case is a case in which the above first process is used at the active step to change the memory cell MC to the set state. In this case, variations in potential on an access bit line BL and a non-access bit line driven by the driver block located on the access side of the MAT are shown in the left part of FIG. 35. Variations in potential on a non-access bit line BL driven by the driver block located on the opposite side are shown in the right part of FIG. 35. Variations in potential on an access word line WL and a non-access word line WL driven by the driver block located on the access side are shown in the left part of FIG. 36. Variations in potential on a non-access word line WL driven by the driver block located on the non-access side are shown in the right part of FIG. 36.

In this case, in the early stage of the active step, a fixed potential is momentarily set on selection lines driven by the driver block located on the opposite side of the MAT. Accordingly, these selection lines can serve as a shield against capacitive coupling. Therefore, it is possible to almost neglect fluctuations in potential on the selection lines in the floating state. Such the suppression of fluctuations in potential on the selection lines in the floating state, however, produces a side effect because the charge corresponding to the fluctuation is added as a short-through current to the consumption current. In addition, the capacity of an adjacent non-access selection line can be viewed from the access selection line. Therefore, the change of the access selection line becomes slower and makes the access speed slightly slower.

After the beginning of the active step, a potential difference of Vset/2 at the maximum momentarily occurs between the access selection line and the non-access selection line. When the non-access selection line is brought into the floating state, though, the potential difference disappears soon so that the non-access selection line finally settles in a potential determined by the dead-zone voltage $\Delta$ and so forth.

The second case is a case in which the above first process at the active step is used to change the memory cell MC to the reset state. In this case, variations in potential on an access bit line BL and a non-access bit line driven by the driver block located on the access side of the MAT are shown in the left part of FIG. 37. Variations in potential on a non-access bit line BL driven by the driver block located on the opposite side are shown in the right part of FIG. 37. Variations in potential on an access word line WL and a non-access word line WL driven by the driver block located on the access side are shown in the left part of FIG. 38. Variations in potential on a non-access word line WL driven by the driver block located on the opposite side are shown in the right part of FIG. 38.

The change of the access memory cell MC to the reset state requires the access memory cell MC to be provided with a reverse bias equal to the set potential Vset.

When the memory cell MC is subjected to reset operation, the procedure up to the initial step is similar to that in the case of set operation. The direction of variations in potential on the access selection line, though, is the reverse of that in the case of set operation. Therefore, when the memory cell MC is subjected to reset operation, the potential set on each selection line at the standby step varies. Namely, at the standby step, the bit line BL driven by the driver block located on the access side of the MAT is provided with the potential $\Delta$, and the bit line BL driven by the driver block located on the opposite side is provided with the potential Vset/2. In addition, the word line WL driven by the driver block located on the access side is provided with the potential Vset-$\Delta$, and the word line WL driven by the driver block located on the opposite side is provided with the potential Vset/2.

At the access step, on making access to a memory cell MC in practice, the access bit line BL is provided with the ground potential Vss and the access word line WL with the set potential Vset while other non-access selection lines are brought into the floating state. Immediately after the beginning of the active step, however, the selection lines driven by the driver block located on the opposite side are fixed and maintained on the potential Vset/2. Accordingly, under the shield effect by these selection lines, the fluctuation in potential on the selection line in the floating state hardly appears and thus the magnitude thereof can be neglected.

Such the suppression of fluctuations in potential on the selection lines in the floating state, however, produces a side effect because the charge corresponding to the fluctuation is added as a short-through current to the consumption current. In addition, the capacity of an adjacent non-access selection line can be viewed from the access selection line. Therefore, the change of the access selection line becomes slower and makes the access speed slightly slower.

After the beginning of the active step, a potential difference of Vset-$\Delta$ at the maximum momentarily occurs between the access selection line and the non-access selection line. When the non-access selection line is brought into the floating state, though, it soon stabilizes at a final bias state.

The third case is a case in which the above second process at the active step is used to change the memory cell MC to the set state. In this case, variations in potential on an access bit line BL and a non-access bit line driven by the driver block located on the access side of the MAT are shown in the left part of FIG. 39. Variations in potential on a non-access bit line BL driven by the driver block located on the opposite side are shown in the right part of FIG. 39. Variations in potential on an access word line WL and a non-access word line WL driven by the driver block located on the access side are shown in the left part of FIG. 39. Variations in potential on a non-access word line WL driven by the driver block located on the opposite side are shown in the right part of FIG. 39.

When the second process at the active step is used, as for the selection lines driven by the driver block located on the access side, the standby step is divided into a first and a second half for potential setting to bring them into the floating state. In the second half of the standby step, the access line is provided with the potential, Vset/2, in the early period of access and other non-access selection lines are brought into the floating state. As for the selection lines driven by the driver block located on the opposite side, the potential setting is retained. As the selection lines driven by the driver block located on the opposite side are provided with the fixed potential, these selection lines can serve as a shield against capacitive coupling. Therefore, the fluctuation in potential on the selection lines in the floating state hardly appears and thus the magnitude thereof can be neglected.

At the active step, all selection lines other than the access selection line are immediately brought into the floating state and are not provided with the fixed potential. Therefore, the power consumption by the short-through can be suppressed as low as possible. As a non-access selection line adjacent to the access selection line is in the floating state, however, a measure of disturbance occurs instantaneously. This disturbance causes a potential difference of Vset/2+$\Delta$ across a memory cell MC at the maximum. The potential difference soon disappears, however, and the non-access selection line finally settles in a potential determined by the dead-zone voltage and so forth.

Figure 41:
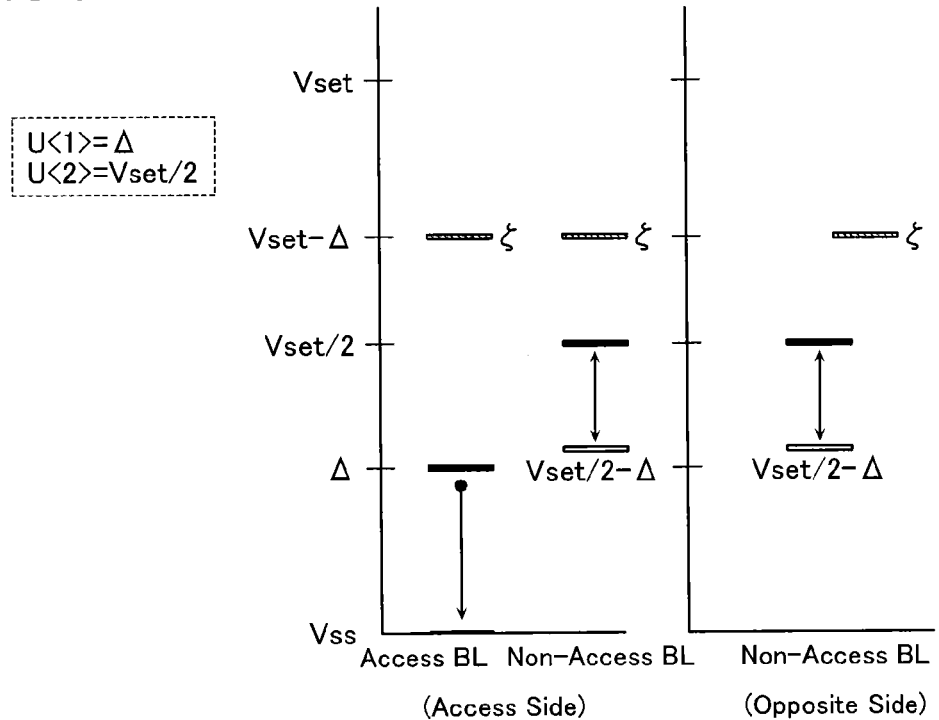
FIG. 41 is a diagram illustrative of bit line potential variations at the transition to the active step in FLA in the same memory block.
Figure 42:
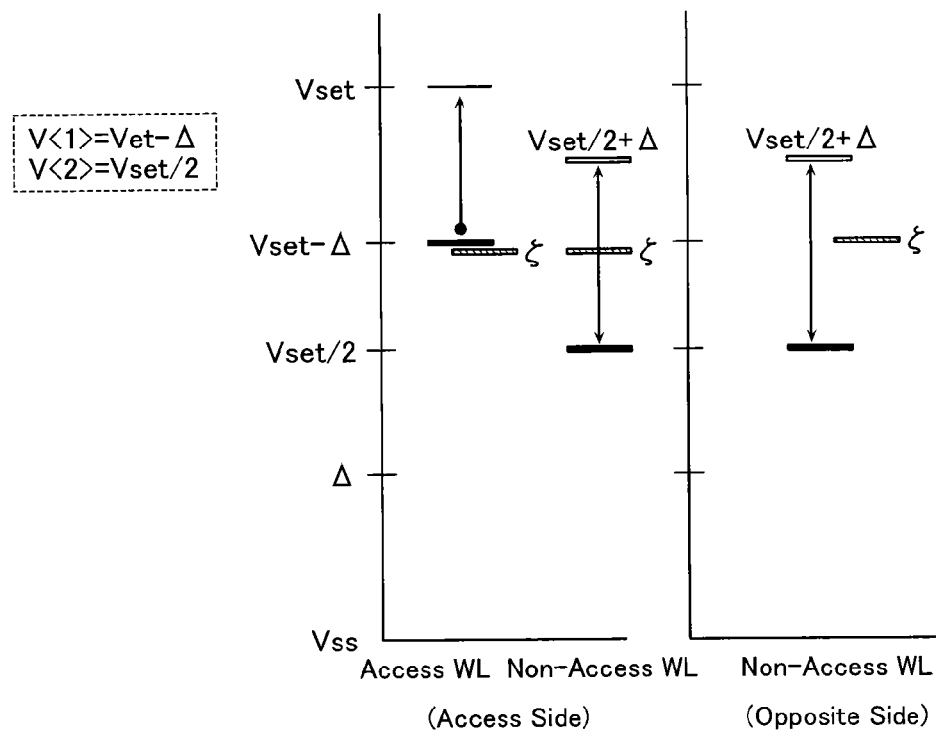
FIG. 42 is a diagram illustrative of word line potential variations at the transition to the active step in FLA in the same memory block.

The fourth case is a case in which the above second process at the active step is used to change the memory cell MC to the reset state. In this case, variations in potential on an access bit line BL and a non-access bit line driven by the driver block located on the access side of the MAT are shown in the left part of FIG. 41. Variations in potential on a non-access bit line BL driven by the driver block located on the opposite side are shown in the right part of FIG. 41. Variations in potential on an access word line WL and a non-access word line WL driven by the driver block located on the access side are shown in the left part of FIG. 42. Variations in potential on a non-access word line WL driven by the driver block located on the opposite side are shown in the right part of FIG. 42.

When the memory cell MC is subjected to reset operation, the procedure up to the initial step is similar to that in the case of set operation. The direction of variations in potential on the access selection line, though, is the reverse of that in the case of set operation. Therefore, when the memory cell MC is subjected to reset operation, the potential set on each selection line at the standby step varies.

When the second process at the active step is used, as for the selection lines driven by the driver block located on the access side, the standby step is divided into a first and a second half for potential setting to bring them into the floating state. In the second half of the standby step, only the access selection line is kept on the set potential and other non-access selection lines are set to the floating state.

Namely, as for the bit lines BL, in the first half of the standby step, the bit line BL driven by the driver block located on the access side is provided with the potential Vset/2, and non-access bit lines BL driven by the driver block located on the opposite side are also provided with the potential Vset/2. In the second half of the standby step, the access bit line driven by the driver block located on the access side is provided with the potential $\Delta$, and other non-access bit lines BL are brought into the floating state. The bit lines BL driven by the driver block located on the opposite side are kept on the potential Vset/2. Accordingly, in the second half of the standby step, under the shield effect exerted by the fixed potential set on the bit line BL driven by the driver block located on the opposite side, the fluctuation in potential on the bit line BL in the floating state hardly appears and thus the magnitude thereof can be neglected.

In addition, as for the word lines WL, in the first half of the standby step, the word line WL driven by the driver block located on the access side is provided with the potential Vset/2, and non-access word lines WL driven by the driver block located on the opposite side are also provided with the potential Vset/2. In the second half of the standby step, the access word line WL driven by the driver block located on the access side is provided with the potential Vset-$\Delta$, and other non-access word lines WL are brought into the floating state. The word lines WL driven by the driver block located on the opposite side are kept on the potential Vset/2. Accordingly, in the second half of the standby step, under the shield effect exerted by the fixed potential set on the word line WL driven by the driver block located on the opposite side, the fluctuation in potential on the word line WL in the floating state hardly appears and thus the magnitude thereof can be neglected.

At the access step, on making access to a memory cell MC in practice, the access bit line BL is provided with the ground potential Vss and the access word line WL with the set potential Vset while other non-access selection lines are brought into the floating state. At the active step, all selection lines other than the access selection line are immediately brought into the floating state and are not provided with the fixed potential. Therefore, the power consumption by the short-through can be suppressed as low as possible. As a non-access selection line adjacent to the access selection line is in the floating state, however, a measure of disturbance occurs instantaneously. This disturbance causes a potential difference of Vset/2+$\Delta$ across a memory cell MC at the maximum although it is a reverse bias. The potential difference soon disappears, however, and the non-access selection line finally settles in a potential determined by the dead-zone voltage $\Delta$ and so forth.

From now on, a memory block is described, which includes large scale MATs configured using the above-described FLA access method.

Figure 43:
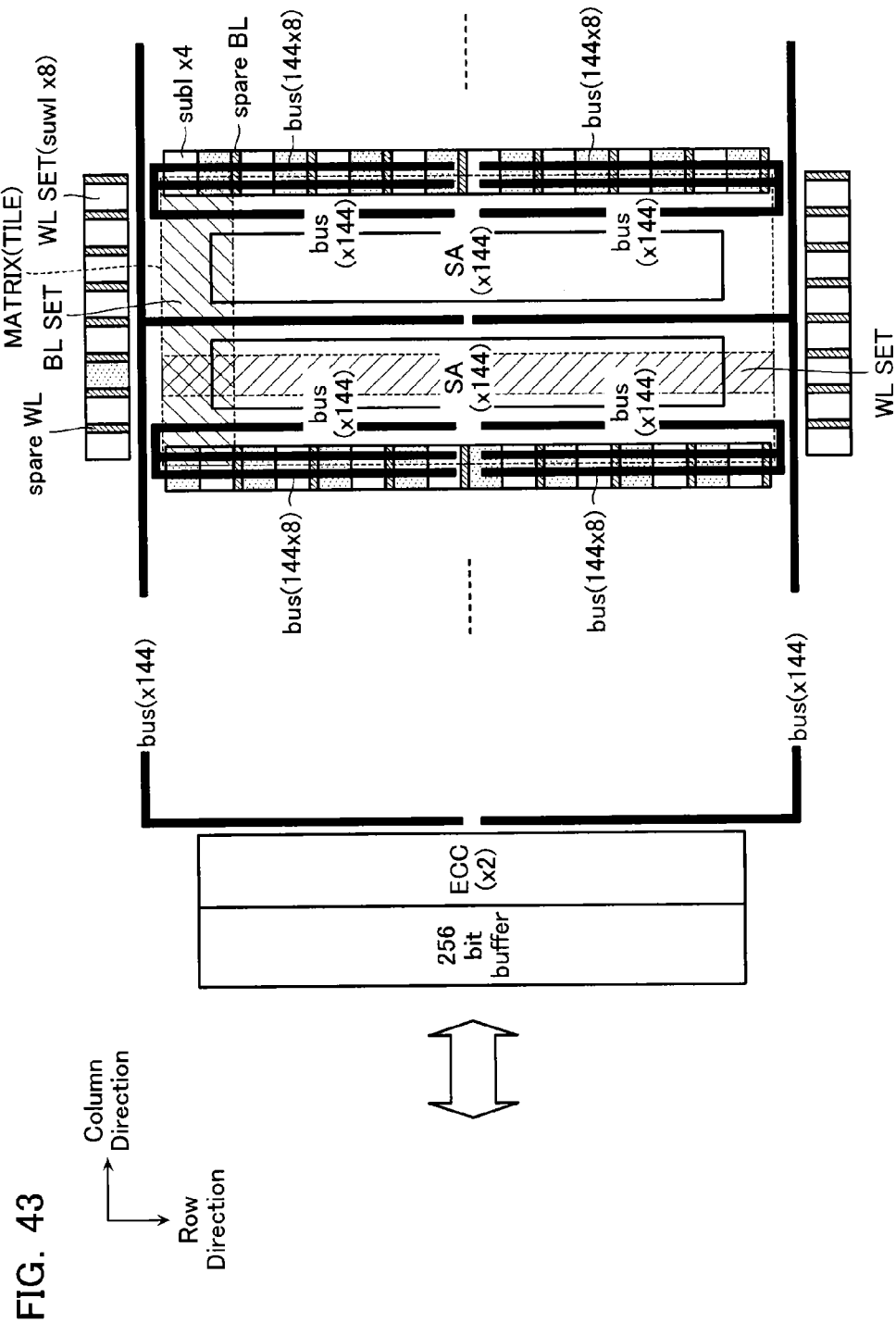
FIG. 43 is a diagram showing a configuration of a MATRIX and associated peripheral circuits in the same memory block.

FIG. 43 is a diagram showing a configuration of a MATRIX and associated peripheral circuits in the same memory block. The meanings of indications in the figure are similar to those in FIG. 14.

The MAT herein described is given a capacity over 32 G bits. There are 296K bit lines BL including 8K spare bit lines ready for redundancy. There are 136K word lines WL including 8K spare word lines ready for redundancy. A configuration of a spare memory cell area is described later.

The memory block according to the present embodiment is characterized in that a selection line is accessed only from one side of the MAT. In the example shown in FIG. 43, a bit line BL is accessed from the driver block located on the left side of the MAT, and a word line WL from the driver block located on the upper side of the MAT.

If the use of a 2-bit correctable BCH ECC (144 bits) is assumed, a bit line spare unit, subl, includes 36 SL groups and one SSL group, 37 (=36+1) in total. On the other hand, a word line spare unit, suwl, includes 16 SL groups and one SSL group, 17 (=16+1) in total.

One MAT includes eight bit line SETs aligned in the row direction and eight word line SETs aligned in the column direction. Namely, (36+1)×8×8 SL groups and SSL groups, and 296K bit lines BL (containing 8K lines in the spare memory cell area) are contained in the row direction. In addition, (16+1)×8×8 SL groups and SSL groups, and 136K word lines WL (containing 8K lines in the spare memory cell area) are contained in the column direction. In a word, a single MAT can store 32 G bits of data. In this case, a MATRIX of 8-layered MATs can store 0.25 T bits of data.

In the example shown in FIG. 43, eight bit line SETs of bit lines BL are divided into upper and lower fours and, from above and below one side of each MAT, 144 bits of data are transferred via the bus. Therefore, 288 (=144×2) bits of data in total are transferred from a single MAT. This data is processed at two ECC systems and turned into 256 bits=32 bytes of data.

With regard to the word lines WL, as shown in FIG. 43, only one SL group is selected from the driver block located on one side of the MAT in each word line SET, and only one word line WL in the selected SL group is accessed.

A 144-bit bus linked to each MAT is arranged as superimposed on the buses of other MATs outside the MATRIX. As described above, the MATRIX is structured to include eight MATs stacked and accordingly the buses are arranged eight-fold. These eight folded buses are collected into a 144-bit bus on a corner of the MATRIX and led into a sense amp SA located below the TILE. From the sense amp SA, 144-bit buses are led out through the upper and lower sides of the MAT to the outside of the TILE as a 144×2-bit bus.

If MATRIXs thus configured are arranged as plural TILEs to construct a memory block, it is possible to form a T-bit class chip. As the example shown in FIG. 43, it is possible to construct a memory block capable of communicating 256 bits of data at each TILE and executing error correction of 2 bits of (128+16) bits.

The following description is given to an example of a specific circuit for driving the access potential only from one side of the MAT.

Figure 44:
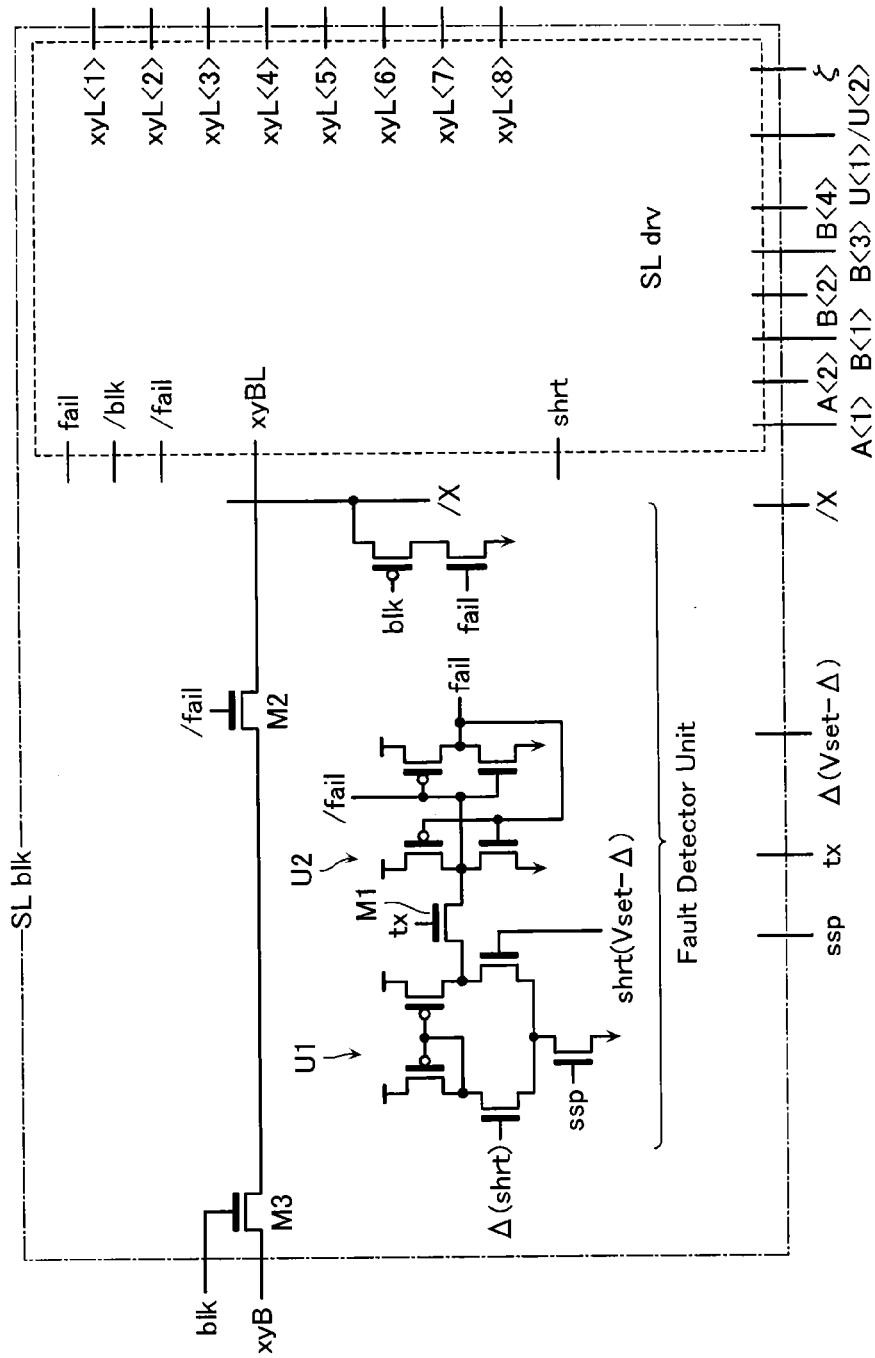
FIG. 44 is a circuit diagram of an SL blk circuit block in the same memory block.
Figure 45:
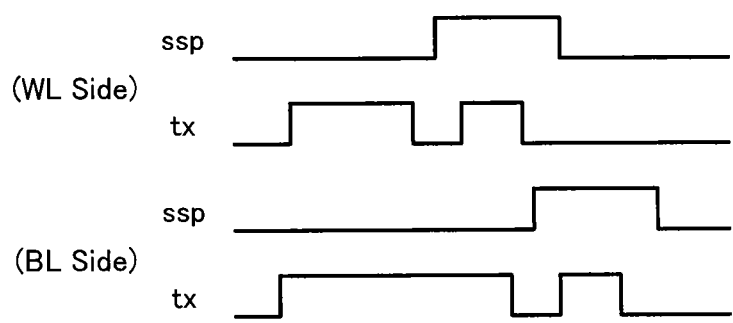
FIG. 45 is a timing chart associated with a fault detector unit in the SL blk circuit block in the same memory block.

FIG. 44 is a circuit diagram of an SL blk circuit block in the memory block according to the present embodiment. The values used in the SL blk circuit block of word lines WL are indicated in ( ). FIG. 45 is a timing chart associated with a fault detector unit in the SL blk circuit block in the memory block according to the present embodiment.

The SL blk circuit block comprises, in addition to the SL drv circuit block, a self-contained fault detector circuit composed of a differential amplifier circuit U1 of the current mirror type and a latch circuit U2. A set including the fault detector circuit forms a fault detector unit. The fault detector circuit is required at the initial step in FLA. At the initial step, an excess-current flowing selection line is detected.

The short fault bit line BL and word line WL are both provided with the fault line potential $\zeta$. Therefore, the order of setting potentials on these short fault bit line BL and word line WL becomes important. Namely, the selection line, of which set potential is closer to the fault line potential $\zeta$, is provided with the fault line potential $\zeta$ to simplify the configuration of the fault detector circuit.

The fault line potential $\zeta$ can be made equal to the set potential Vset-$\Delta$ on the word line WL at the initial step. Therefore, the fault detection is started from the word line WL and the fault line potential $\zeta$ is first set on the word line WL. The control signals, fail and/fail, from the fault detector circuit are used to directly control the SL drv circuit blocks individually. Therefore, the signal levels of the control signals, fail and/fail, are important. The state of the control signal, /fail='H', and the control signal, fail='L', is a state in which the SL drv circuit block operates normally. Therefore, it is required to turn the state to the initial state of the control signals, fail and/fail. The initial state of the control signals, fail and/fail, can be formed by interrupting the differential amplifier circuit U1 in the fault detector circuit to turn the output to 'H', and transferring this output to the latch circuit U2 via the transfer transistor M1 that is turned on by the control signal tx='H'. The state of the control signal/fail='H' becomes the initial state of the latch circuit U2. The interruption of the differential amplifier circuit U1 is executed by turning the control signal to ssp='L'.

When a short fault is detected, the word line WL is provided with the fault line potential $\zeta$ first, and then the bit line BL associated with the same short fault is provided with the fault line potential $\zeta$. A timing chart of control signals at this time is shown in FIG. 45. The potential compared in the differential amplifier circuit U1 differs between the SL blk circuit block of bit lines BL and the SL blk circuit block of word lines WL. Namely, in the SL blk circuit block of word lines WL, the potential set on the word line WL at the initial step is Vset-$\Delta$. Accordingly, when a short fault exists, a decision signal, shrt, of a considerably lower potential than the set potential is sent from the SL drv circuit block. Therefore, the input of the differential amplifier circuit U1 closer to the latch circuit U2 is supplied with the potential Vset-$\Delta$ to compare the potential Vset-$\Delta$ with the decision signal, shrt. In the SL blk circuit block of bit lines BL, the potential set on the bit line BL at the initial step is $\Delta$. Accordingly, when a short fault exists, a decision signal, shrt, of a considerably higher potential than the set potential is sent from the SL drv circuit block. Therefore, the input of the differential amplifier circuit U1 farther from the latch circuit U2 is supplied with the potential $\Delta$ to compare the potential $\Delta$ with the decision signal, shrt.

Further, when a short fault is detected in the SL blk circuit block, it generates an error signal/X indicative thereof. The signal line of an error signal/X is precharged to 'H'. It discharges based on the value of AND of the selection signal, blk, to the SL blk circuit block and the control signal, fail, to turn the error signal/X to an 'L' signal to notice the present of a fault.

Next, an SL group circuit block is described. The SL group circuit block is a circuit including eight SL blk circuit blocks.

Figure 46:
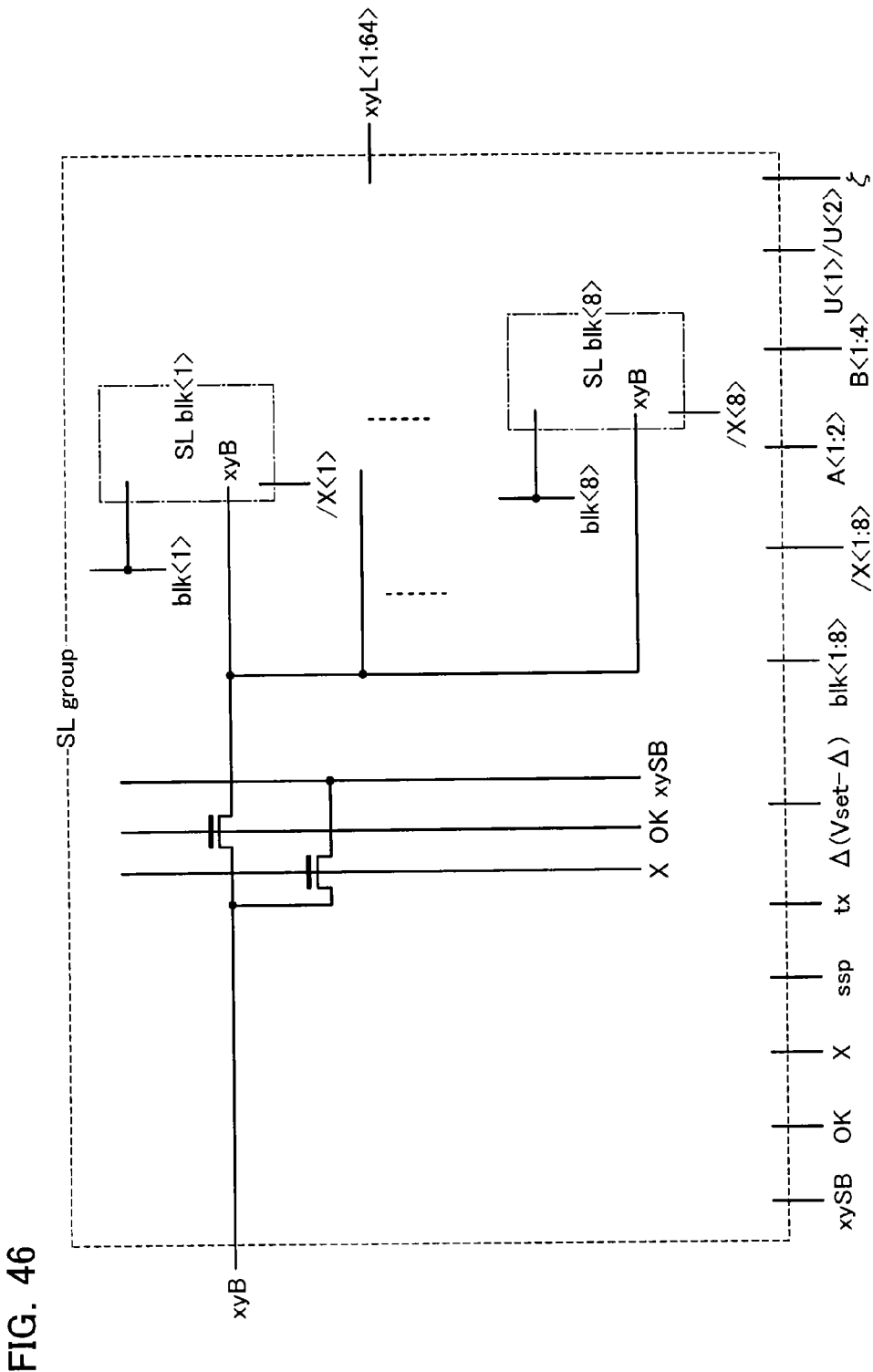
FIG. 46 is a diagram showing a configuration of an SL group circuit block in the same memory block.

FIG. 46 is a circuit diagram of the SL group circuit block in the memory block according to the present embodiment.

The SL group circuit block selects one selection line that is linked from this SL group circuit block to the data bus. In a word, the SL group circuit block is a circuit operative to select one selection line of 64 selection lines.

The signal for selecting an SL blk circuit block <i> (i=1-8) is a selection signal, blk<i>. In addition, the signal for noticing the presence/absence of a short fault is an error signal/X<i>, which is sent from each SL blk circuit block <i> to plural SL group circuit blocks in common. Data lines xyB from the SL blk circuit blocks are connected in common and led out of the SL group circuit block as a single data line xyB. The data line xyB from each SL blk circuit block can be changed to a data line xySB led out of the later-described SSL group circuit block. This change is executed in accordance with the error signal X and the normal signal OK. When no short fault is detected at the selected SL blk circuit block, the normal signal turns to OK='H' so that the data line xyB led out of the SL group circuit block is linked to any one of the data lines xyB led out of the SL blk circuit blocks <i>. When a short fault is detected, on the other hand, the error signal turns to X='H' so that it is linked to the data line xySB led out of the SSL blk circuit block. The error signal X and the normal signal OK are generated as described later. The SL group circuit block is configured similarly not only for the bit lines BL but also for the word lines WL.

Next, an SSL blk circuit block is described.

Figure 47:
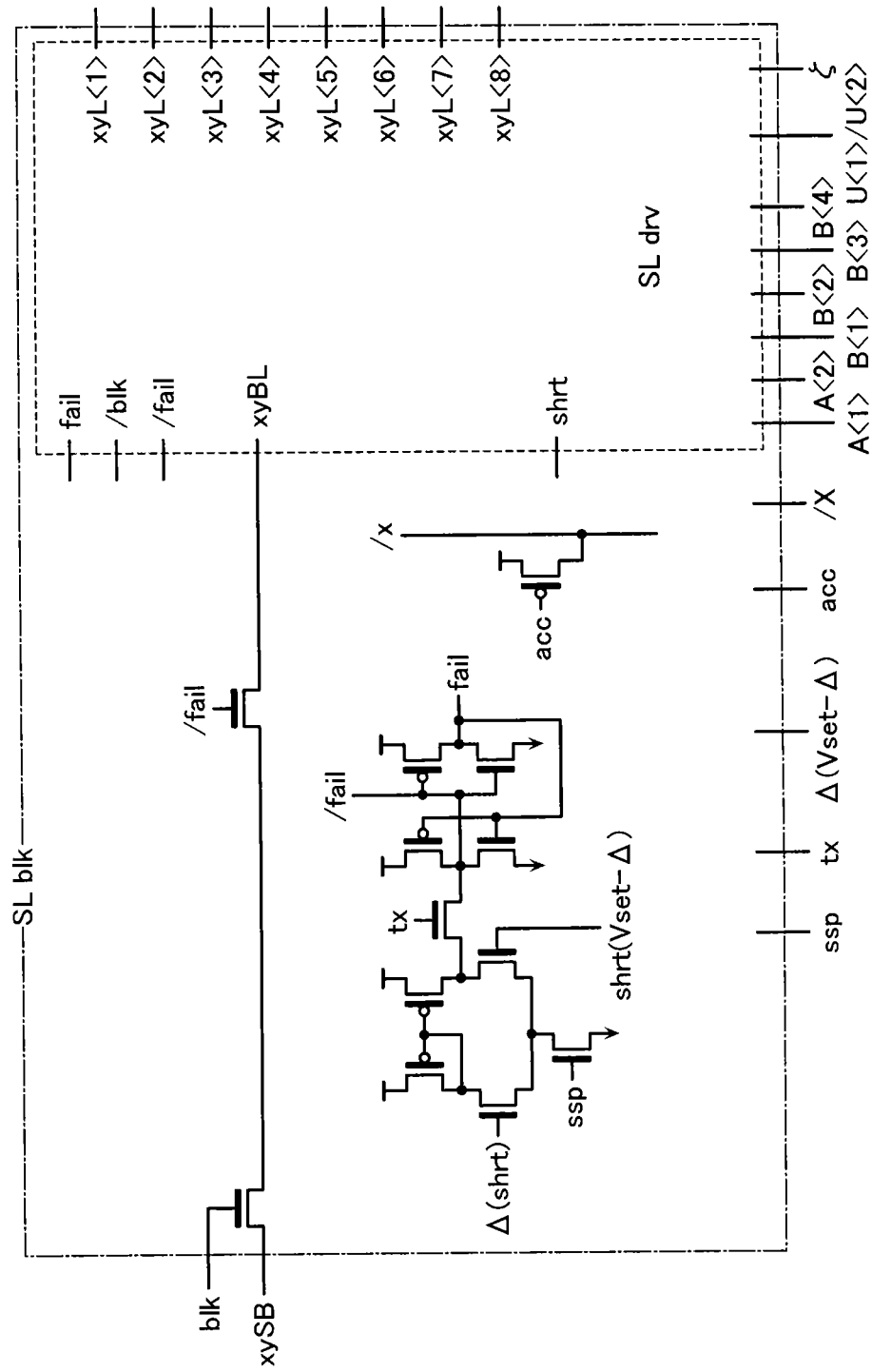
FIG. 47 is a circuit diagram of an SSL blk circuit block in the same memory block.

FIG. 47 is a circuit diagram of the SSL blk circuit block in the memory block according to the present embodiment.

The SSL blk circuit block has the same configuration as that of the SL blk circuit block except the portion of the error signal/X. Namely, the error signal/X is a signal used in eight SL blk circuit blocks contained in the SL group circuit block. The signal line of the error signal/X is precharged to 'H' until the control signal, acc, reaches 'H'. When the control enters the active step in FLA and into the cycle for beginning data transfer, the control signal, acc, turns to 'H' to bring the signal line of the error signal/X into the floating state. Thus, the error signal/X is made possible to always indicate the presence/absence of a short fault in the selection line corresponding to the SL blk circuit block. The SSL blk circuit block also detects a short fault in the spare selection line itself. As a result, if a spare selection line has a short fault, the spare selection line is provided with the fault line potential ζ. This is executed to suppress the influence of the short fault in the MAT exerted on access operation. The presence of a short fault in a spare selection line eliminates the function of redundancy and accordingly makes a part of the address area unusable.

Next, an SSL group circuit block is described.

Figure 48:
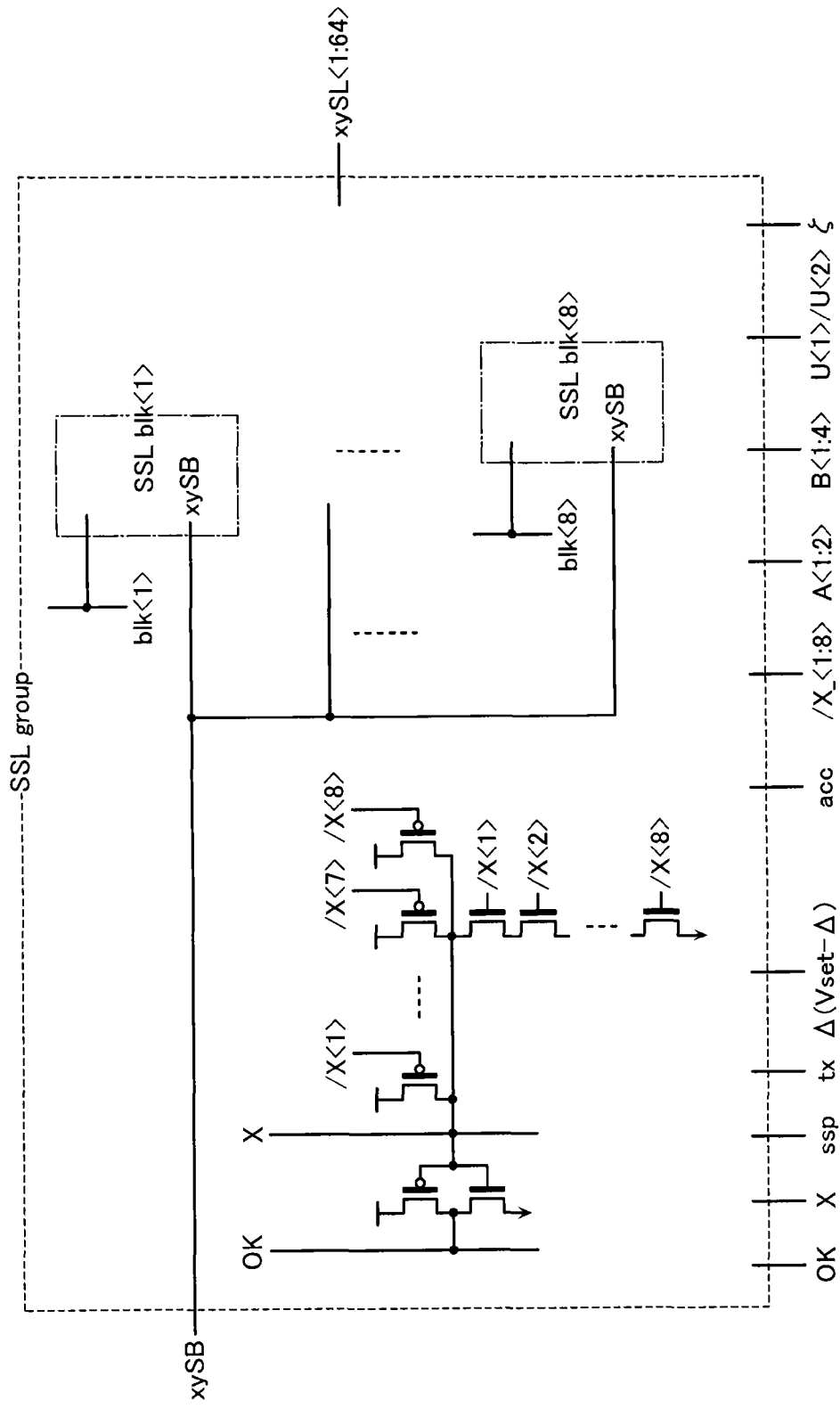
FIG. 48 is a diagram showing a configuration of an SSL group circuit block in the same memory block.

FIG. 48 is a circuit diagram of the SSL group circuit block in the memory block according to the present embodiment.

Similar to the SL group circuit block, the SSL group circuit block includes eight SSL blk circuit blocks <1:8>. The SSL blk circuit block <i> (i=1-8) is selected by the selection signal, blk<i>, similar to that for the SL blk circuit block <i>. Further, the data lines xySB led out of the SSL blk circuit blocks <i> are commonly connected and led out of the SSL group as a data line xySB. Namely, the SSL group circuit block can execute redundancy for plural sets of SL blk circuit blocks <1:8> one by one independently.

The SSL group circuit block generates the error signal X or the normal signal OK in accordance with the presence or absence of a short fault in a selection line corresponding to one SSL blk<i> selected from eight SSL blks<1:8>. In the SSL group circuit block, the error signal X and the normal signal OK are complementary signals. The error signal X is resulted from NAND of the error signals/X<1:8> and is reversed to generate the normal signal OK. In the SSL group circuit block, eight selection signals blk<1:8> correspond one by one to the SL blk circuit blocks <i>. Therefore, if a short fault exists in a selection line corresponding to the same selection signal blk<i> within a range of the SL group circuit blocks handled by one SSL group circuit block in charge, the address area except one location in the range becomes unusable.

Next, spare units are described. Circuit diagrams of a bit line spare unit, subl, and a word line spare unit, suwl, in the memory block according to the present embodiment are similar to FIGS. 22 and 23, which are therefore preferably referred to.

The number of SL group circuit blocks provided with one SSL group circuit block depends on the configuration of the code of data used in the memory block. As an example, it is assumed herein that a 144-bit code is created from 128 bits of information data, and a BCH code capable of randomly error-correcting 2 bits of 144 bits is used. For processing the 144-bit BCH code simultaneously, the numbers of bit lines BL and word lines WL are each configured based on this so as to become bit lines BL around two times more than word lines WL.

A brief description is given to a decision process of bit lines BL in the MAT. As for the number of word lines WL, because only one line is selected at the MAT, the number of lines decoded on one side of the MAT becomes a power of two. Further, in consideration of a redundancy available set, the number of SL group circuit blocks is, for example, equal to 16. Namely, the number of word line spare units, suwl, is configured to include one SSL group circuit block at every 16 SL group circuit blocks as shown in FIG. 23.

The corresponding bit line spare units, subl, require the same number of spares not only for the word lines WL but also for the bit lines BL in the MAT of the cross point type in the presence of a short fault. Therefore, if a configuration double the word line spare units per SSL group circuit block is required, it is sufficient to provide 32 (=16×2) SL group circuit blocks unless the code of ECC is considered. They are multiplied by a ratio corresponding to the excessively required code. Accordingly, when 128 bits are coded by 144 bits, they are multiplied by 9/8 (=144/128). Thus, 36 (=32× 9/8) SL group circuit blocks are required as can be understood. Namely, as shown in FIG. 22, in the case of bit line spare units, subl, a configuration including 36 (=18×2) SL group circuit blocks per SSL group circuit block makes it possible to configure them with bit line spare units, subl, by the same number as that of the word line spare units, suwl. Thus, it is possible to handle a short fault in the MAT of the cross point type and derive the number of bit lines BL in the MAT from the number of word lines WL multiplied by around two. Then, the number of simultaneously accessible bit lines BL is considered in addition to such the basic configuration to determine the size of the MAT.

FIG. 22 shows bit line spare units, subl, based on the premise that 18 pieces of data are assigned to bit line spare units, subl, and 18-bit local buses are provided. For leading 18 data lines xyB out of 18×2 SL group circuit blocks, they are divided into odd SL group circuit blocks and even SL group circuit blocks, and adjoining two SL group circuit blocks are selectively connected to one local bus. This selection is executed in accordance with selection signals, su_oSEL and su_eSEL.

The corresponding word line spare units, suwl, use SL group circuit blocks having the same configuration as that of the bit line spare units, subl. Therefore, either eight odd SL group circuit blocks or eight even SL group circuit blocks are selected from 16 SL group circuit blocks. In addition, eight selection signals BLG<1:8> are applied to select one SL group circuit block. Further, the word line spare unit, suwl, selects one word line WL in accordance with address signals/A<0:3>, /B<0:3> and/C<0:3> and so forth for use in selection of one word line spare unit from one side of the MAT, and supplies the power V to the word line WL.

The following description is given to a connecting configuration of the bit line spare unit, subl, to the MAT.

Figure 49:
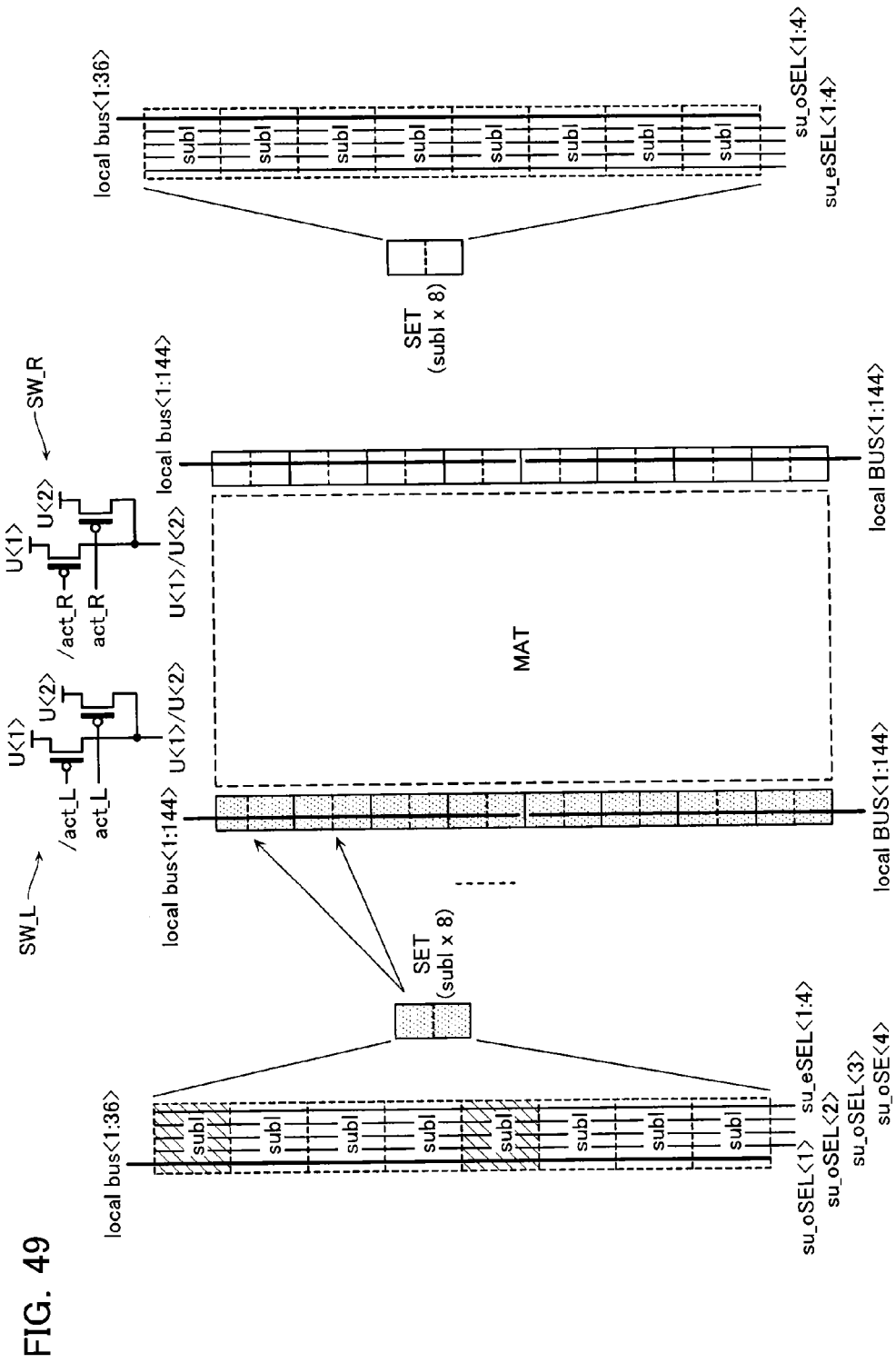
FIG. 49 is a diagram showing a connecting configuration of the bit line spare unit to the MAT in the same memory block.

FIG. 49 is a diagram showing a connecting configuration of the bit line spare unit, subl, to the MAT in the memory block according to the present embodiment.

As described above, 18 local buses are led out of the bit line spare units, subl. In a word, 144 bits of data correspond to eight bit line spare units, subl.

Therefore, for selecting eight bit line spare units, subl, as uniform as possible, decoding is executed preferably as shown in FIG. 49, for example. In a word, from a set of eight bit line spare units, subl, that is, a bit line SET, two bit line spare units, subl, hatched in the figure are selected to configure 36 local buses. The bit line SET is divided into two sets of four bit line spare units, subl, vertically aligned in pair, and selected on a pair basis. Further, each bit line spare unit, subl, is selected in accordance with the fact that it is odd-aligned or even-aligned. Therefore, the signals for selecting among bit line spare units, subl, include four selection signals su_oSEL<1:4> and four selection signals su_eSEL<1:4>. The bit line spare units, subl, hatched in the figure are selected in accordance with the control signal su_oSEL<1> to configure 36 local buses per SET. As the bit lines BL in the MAT include eight SETs per side, four SETs include 144 (=36×4) local buses. In a word, 144 local buses are led out to the external from the upper and lower portions on the right side and the upper and lower portions on the left side of the MAT. In the case of FIG. 49, access is made by the driver block located on the left side of the MAT on which dot-patterned SETs align.

Switching between the access line potential U<1> and the non-access line potential U<2> in the driver blocks located on the left and right sides of the MAT is executed at switch circuits SW_L and SW_R shown in the figure. The switch circuit SW_L includes two transistors controlled by a complementary pair of control signals, act_L and/act_L. Via these transistors, the access line potential U<1> and the non-access line potential U<2> are selectively supplied to bit line SETS aligned on the left side of the MAT. Similarly, the switch circuit SW_R includes two transistors controlled by a complementary pair of control signals, act_R and/act_R. Via these transistors, the access line potential U<1> and the non-access line potential U<2> are selectively supplied to bit line SETs aligned on the right side of the MAT.

The following description is given to a connecting configuration of the word line spare units, suwl, to the MAT.

Figure 50:
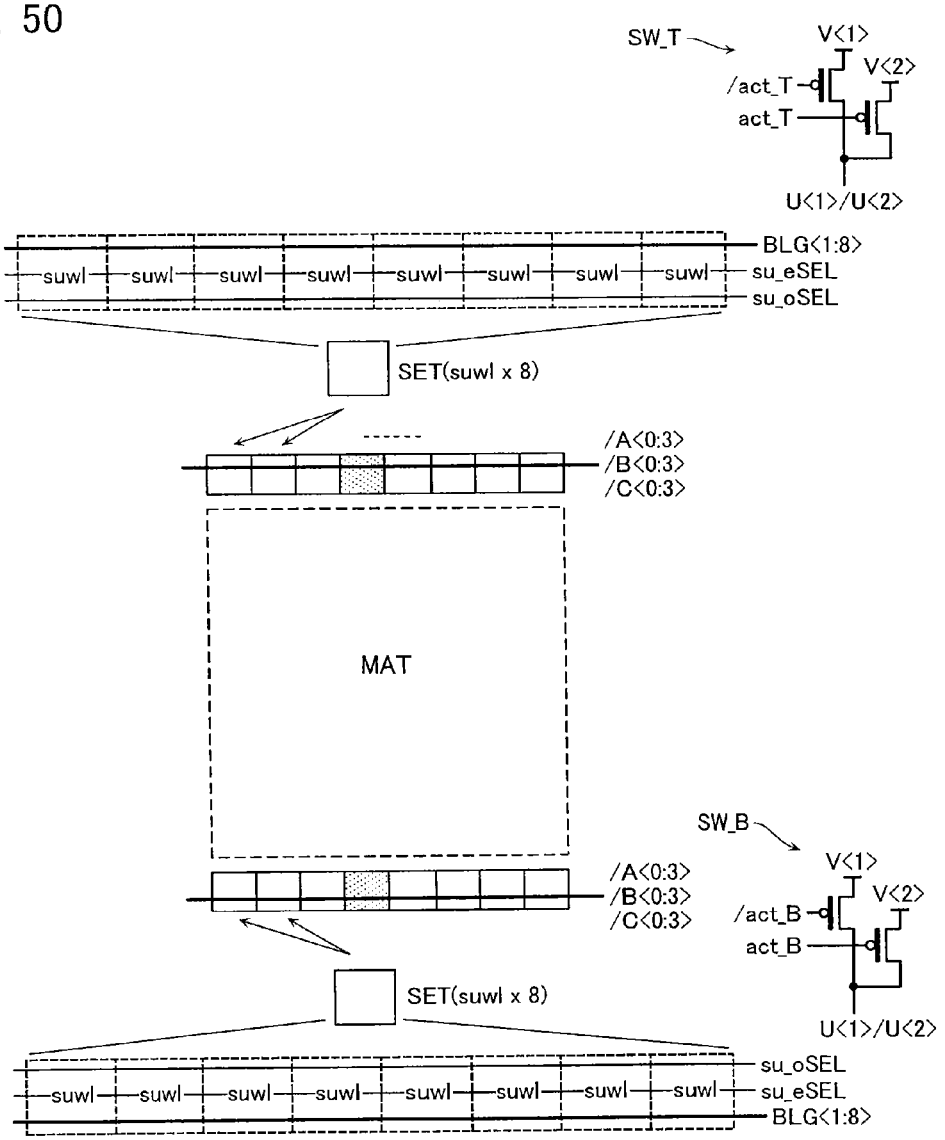
FIG. 50 is a diagram showing a connecting configuration of the word line spare unit to the MAT in the same memory block.

FIG. 50 is a diagram showing a connecting configuration of the word line spare units, suwl, to the MAT in the memory block according to the present embodiment.

A set of eight word line spare units, suwl, that is, a word line SET, is required to have the same configuration as that of the bit line SET for handling the occurrence of a short fault in the MAT of the cross point type. Namely, the upper and lower sides of the MAT each include eight word line SETs. The configuration of word line spare units, suwl, however, differs from that of bit line spare units, subl. From each word line spare unit, suwl, one word line WL is selected and further one word line SET is selected. In addition, one word line spare unit, suwl, is selected from the selected word line SET. In a word, as a selection of one eighth in two stages is required, decoders and address signals for $2^6$ decoding are required. The address signals are/A<0:3>, /B<0:3> and/C<0:3>.

Switching between the access line potential V<1> and the non-access line potential V<2> in the driver blocks located on the upper and lower sides of the MAT is executed at switch circuits SW_T and SW_B shown in the figure. The switch circuit SW_T includes two transistors controlled by a complementary pair of control signals, act_T and/act_T. Via these transistors, the access line potential V<1> and the non-access line potential V<2> are selectively supplied to word line SETs aligned on the upper side of the MAT. Similarly, the switch circuit SW_B includes two transistors controlled by a complementary pair of control signals, act_B and/act_B. Via these transistors, the access line potential V<1> and the non-access line potential V<2> are selectively supplied to word line SETs aligned on the lower side of the MAT.

The MAT-associated peripheral circuits according to the present embodiment are described above. Also in the present embodiment, it is possible to configure a memory block having a data transfer bandwidth of 16 M bytes/s, a storage capacity of 1 T bits and an access time, tAC, of 8 μs similar to the first embodiment as shown in FIG. 26.

Further, this memory block can be used to configure a P(peta)-bit scale memory system similar to that in the first embodiment as shown in FIG. 27.

As described above, in accordance with the present embodiment, it is possible to exert the same effect as that of the first embodiment. In addition, when the gates of transistors contained in the SL drv circuit block are extended in the direction orthogonal to the direction of selection lines extending, the circuitry of the driver block can be simplified. Thus, it is possible to facilitate the implementation of the driver blocks.

[Others]

While the embodiments of the present invention have been described, these embodiments are presented by way of example and are not intended to limit the scope of the invention. These novel embodiments can be implemented in a variety of other forms, and various omissions, substitutions and changes can be made without departing from the spirit of the invention. These embodiments and variations thereof would fall within the scope and spirit of the invention and also fall within the invention recited in claims and equivalents thereof.

What is claimed is:

1. A memory system, comprising:
a cell array of plural unit cell arrays having three orthogonal directions defined as a first direction, a second direction and a third direction, each unit cell array including plural first lines extending in said first direction, plural second lines extending in said second direction, and plural memory cells provided at the intersections of said plural first lines and plural second lines and operative to store data in accordance with different resistance states; and
an access circuit operative to make access to a memory cell via said first line and said second line,
wherein said memory cell changes said resistance state from a first resistance state to a second resistance state on application of a certain voltage of a first polarity, and changes said resistance state from said second resistance state to said first resistance state on application of a certain voltage of a second polarity opposite in polarity to said first polarity,
said access circuit provides said first line and said second line connected to an access-targeted memory cell with access potentials required to make access to said access-targeted memory cell, and brings at least one of said first line and said second line connected to an access-untargeted memory cell into a floating state to make access to said access-targeted memory cell,
said unit cell array includes plural first spare lines extending in said first direction to provide redundancy for said plural first lines, and
an alignment of said plural first lines includes a certain number of said first spare lines arranged in a certain pattern,
one side in said first direction is defined as a first side and the other as a second side, said access circuit includes:
first-side first line units arranged on said first side of said unit cell array and aligned in said second direction to drive odd-aligned first line's of said plural first lines; and
second-side first line units arranged on said second side of said unit cell array and aligned in said second direction to drive even-aligned second lines of said plural first lines, said access circuit is operative to make access to said memory cells in a pair of one of said first-side first line units and one of said second-side first line units opposing each other in said first direction, and one of said first-side first line unit and said second-side first line unit of said pair provides said first line connected to said access-targeted memory cell with said access potentials, and the other brings said first line connected to said access-untargeted memory cell into a floating state.

2. The memory system according to claim 1,
wherein
said first-side first line unit of said access circuit includes a certain number of first-side first line drivers and one spare first-side first line driver aligned in said second direction, said spare first-side first line driver providing redundancy to one of said first-side first line drivers, and said second-side first line unit of said access circuit includes a certain number of second-side first line drivers and one spare second-side first line driver aligned in said second direction, said spare second-side first line driver providing redundancy to one of said second-side first line drivers.

3. The memory system according to claim 1,
wherein said unit cell array includes plural second spare lines to provide redundancy for said plural second lines, and a redundancy replaceable number of said first lines is the same as a redundancy replaceable number of said second lines.

4. The memory system according to claim 1,
wherein said memory cell substantially brought into an open state by a fault is defined as an open fault memory cell, and settings of the potentials on and the floating state of said plural first lines and said plural second lines by said access circuit make no change depending on a presence/absence of said open fault memory cell.

5. The memory system according to claim 1,
wherein said memory cell substantially brought into a short state by a fault is defined as a short fault memory cell, and said access circuit detects the current in said first line or said second line connected to said short fault memory cell and redundancy-replaces the detected first line by said first spare line.

6. The memory system according to claim 1,
wherein said memory cell substantially brought into a short state by a fault is defined as a short fault memory cell, and said access circuit sets a fault selection line potential on said first line or said second line connected to said short fault memory cell.

7. The memory system according to claim 1,
wherein said access circuit makes accesses to plural memory cells from either said first-side first line unit or said second-side first line unit of said pair.

8. The memory system according to claim 2,
wherein said access circuit makes accesses to plural memory cells from either plural first-side first line drivers or plural second-side first line drivers.

9. The memory system according to claim 1,
wherein a number of said first lines is twice or above a number of said second lines.

10. The memory system according to claim 1, further comprising:
a plurality of memory modules each including said cell array and said access circuit;
a control unit operative to control said memory modules; and
a data/command bus for use in command and data communications between said control unit and said memory module.

11. A memory system, comprising:
a cell array of plural unit cell arrays having three orthogonal directions defined as a first direction, a second direction and a third direction, each unit cell array including plural first lines extending in said first direction, plural second lines extending in said second direction, and plural memory cells provided at the intersections of said plural first lines and plural second lines and operative to store data in accordance with different resistance states; and an access circuit operative to make access to a memory cell via said first line and said second line, wherein said memory cell changes said resistance state from a first resistance state to a second resistance state on application of a certain voltage of a first polarity, and changes said resistance state from said second resistance state to said first resistance state on application of a certain voltage of a second polarity opposite in polarity to said first polarity, said access circuit provides said first line and said second line connected to an access-targeted memory cell with access potentials required to make access to said access-targeted memory cell, and brings at least one of said first line and said second line connected to an access-untargeted memory cell into a floating state to make access to said access-targeted memory cell, said unit cell array includes plural first spare lines extending in said first direction to provide redundancy for said plural first lines, an alignment of said plural first lines includes a certain number of said first spare lines arranged in a certain pattern, one side in said first direction is defined as a first side and the other as a second side, said access circuit includes:
first-side first line units arranged on said first side of said unit cell array and aligned in said second direction to drive odd-aligned first lines of said plural first lines; and second-side first line units arranged on said second side of said unit cell array and aligned in said second direction to drive odd-aligned first lines of said plural first lines; and second-side first line units arranged on said second side of said unit cell array and aligned in said second direction to drive even-aligned second lines of said plural first lines, said access circuit is operative to make access to said memory cells in a pair of one of said first-side first line units and one of said second-side first line units opposing to each other in said first direction, one of said first-side first line unit and said second-side first line unit of said pair provides said first line connected to said access-targeted memory cell with said access potentials, and another brings said first line connected to said access-untargeted memory cell into a floating state, and said first-side first line unit and said second-side first line unit each include plural transistors, and gate lines connected to said plural transistors extend in said second direction.

12. The memory system according to claim 11, wherein
said first-side first line unit of said access circuit includes a certain number of first-side first line drivers and one spare first-side first line driver aligned in said second direction, said spare first-side first line driver providing redundancy to one of said first-side first line drivers, and
said second-side first line unit of said access circuit includes a certain number of second-side first line drivers and one spare second-side first line driver aligned in said second direction, said spare second-side first line driver providing redundancy to one of said second-side first line drivers. drivers.

13. The memory system according to claim 11,
wherein said unit cell array includes plural second spare lines to provide redundancy for said plural second lines, and
a redundancy replaceable number of said first lines is the same as a redundancy replaceable number of said second lines.

14. The memory system according to claim 11,
wherein said memory cell substantially brought into an open state by a fault is defined as an open fault memory cell, and
settings of the potentials on and the floating state of said plural first lines and said plural second lines by said access circuit make no change depending on a presence/absence of said open fault memory cell.

15. The memory system according to claim 11,
wherein said memory cell substantially brought into a short state by a fault is defined as a short fault memory cell, and
said access circuit detects the current in said first line or said second line connected to said short fault memory cell and redundancy-replaces the detected first line by said first spare line.

16. The memory system according to claim 11,
wherein said memory cell substantially brought into a short state by a fault is defined as a short fault memory cell, and
said access circuit sets a fault selection line potential on said first line or said second line connected to said short fault memory cell.

17. The memory system according to claim 11,
wherein said access circuit makes accesses to plural memory cells from either said first-side first line unit or said second-side first line unit of said pair.

18. The memory system according to claim 12,
wherein said access circuit makes accesses to plural memory cells from either plural first-side first line drivers or plural second-side first line drivers.

19. The memory system according to claim 11,
wherein a number of said first lines is twice or above a number of said second lines.

20. The memory system according to claim 11, further comprising:
a plurality of memory modules each including said cell array and said access circuit;
a control unit operative to control said memory modules; and
a data/command bus for use in command and data communications between said control unit and said memory module.

* * * * *